(12) United States Patent
Yoshioka et al.

(10) Patent No.: US 10,301,539 B2
(45) Date of Patent: May 28, 2019

(54) POLYMER COMPOUND AND LIGHT-EMITTING DEVICE USING THE SAME

(71) Applicant: Sumitomo Chemical Company, Limited, Chuo-ku, Tokyo (JP)

(72) Inventors: Mayu Yoshioka, Tsukuba (JP); Daisuke Fukushima, Ibaraki (JP); Mio Shiratori, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 15/506,463

(22) PCT Filed: Aug. 19, 2015

(86) PCT No.: PCT/JP2015/073190
§ 371 (c)(1),
(2) Date: Feb. 24, 2017

(87) PCT Pub. No.: WO2016/031639
PCT Pub. Date: Mar. 3, 2016

(65) Prior Publication Data
US 2017/0253795 A1    Sep. 7, 2017

(30) Foreign Application Priority Data

Aug. 28, 2014   (JP) ................................ 2014-173564

(51) Int. Cl.
*C08G 61/12*       (2006.01)
*C08G 73/02*       (2006.01)
(Continued)

(52) U.S. Cl.
CPC .............. *C09K 11/06* (2013.01); *C08G 61/12* (2013.01); *C08G 73/0266* (2013.01); *H01L 51/0035* (2013.01); *H01L 51/0043* (2013.01); *H01L 51/50* (2013.01); *H01L 51/5016* (2013.01); *H05B 33/20* (2013.01); *C08G 2261/12* (2013.01); *C08G 2261/135* (2013.01); *C08G 2261/314* (2013.01); *C08G 2261/95* (2013.01); *C09K 2211/18* (2013.01)

(58) Field of Classification Search
CPC ........ C08G 2261/3162; C08G 2261/76; C08G 2261/95; C08L 79/02; H01L 51/0039
USPC ........................................................ 528/422
See application file for complete search history.

(56) References Cited

U.S. PATENT DOCUMENTS

| 2011/0017983 | A1 | 1/2011 | Mizuki et al. |
| 2013/0146852 | A1 | 6/2013 | Steudel et al. |
| 2013/0270486 | A1 | 10/2013 | Yoshida |
| 2013/0270544 | A1 | 10/2013 | Anryu et al. |
| 2014/0367617 | A1 | 12/2014 | Yoshida et al. |
| 2014/0374546 | A1 | 12/2014 | Borch-Jensen et al. |
| 2015/0115204 | A1 | 4/2015 | Sekine et al. |
| 2015/0192081 | A1 | 7/2015 | Ranspach et al. |
| 2016/0013418 | A1 | 1/2016 | Usui et al. |

FOREIGN PATENT DOCUMENTS

| JP | 2009043896 | * | 2/2009 | ............. H01L 51/50 |
| JP | 2009043896 | A | 2/2009 | |

(Continued)

OTHER PUBLICATIONS

Extended European Search Report dated Mar. 21, 2018 in EP Application No. 15836486.9.
Third Party Observations dated Aug. 22, 2018 in EP Application No. 15836486.9.
Office Action dated Sep. 4, 2018 in EP Application No. 15836486.9.
Third Party Observations filed on Aug. 24, 2018 in JP Application No. 2016-545454.
Office Action dated Jan. 21, 2019 in CN Application No. 201580045796.5.
Third Party Observations submitted to the EPO on Mar. 12, 2019 in EP Application No. 15836486.9.

*Primary Examiner* — Shane Fang
(74) *Attorney, Agent, or Firm* — Panitch Schwarze Belisario & Nadel LLP

(57) ABSTRACT

Provided is a polymer compound useful for production of a light emitting device excellent in external quantum yield. The polymer compound includes a constitutional unit represented by the formula (1):

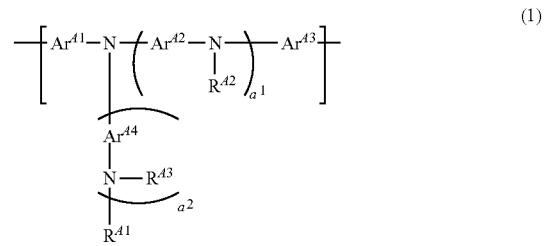

wherein $a^1$ and $a^2$ represent 0 or 1, $Ar^{41}$ and $Ar^{43}$ represent an arylene group or the like, and in each of $Ar^{41}$ and $Ar^{43}$ at least one atom adjacent to an atom forming a bond to the constitutional unit adjacent to the each of $Ar^{41}$ and $Ar^{43}$ has an alkyl group or the like as a substituent, $Ar^{42}$ represents a phenylene group, $Ar^{44}$ represents an arylene group or the like, $R^{41}$, $R^{42}$ and $R^{43}$ represent an aryl group or the like, and when $a^2$ is 0, $R^{41}$ represents an aryl group in which two or more rings are condensed (the number of carbon atoms constituting the rings of the aryl group is 10 or more) or the like.

14 Claims, No Drawings

(51) Int. Cl.
*C09K 11/06* (2006.01)
*H01L 51/00* (2006.01)
*H01L 51/50* (2006.01)
*H05B 33/20* (2006.01)

(56) References Cited

FOREIGN PATENT DOCUMENTS

| | | | |
|---|---|---|---|
| JP | 2009179682 | A | 8/2009 |
| JP | 2010034496 | A | 2/2010 |
| JP | 2010062442 | A | 3/2010 |
| JP | 2010155985 | A | 7/2010 |
| JP | 2010287767 | A | 12/2010 |
| JP | 20141349 | A | 1/2014 |
| JP | 2014111765 | A | 6/2014 |
| WO | 2009110360 | A1 | 9/2009 |
| WO | 2013114976 | A1 | 8/2013 |
| WO | 2013146806 | A1 | 10/2013 |
| WO | 2014102543 | A2 | 7/2014 |
| WO | 2014157016 | A1 | 10/2014 |

* cited by examiner

POLYMER COMPOUND AND LIGHT-EMITTING DEVICE USING THE SAME

CROSS-REFERENCE TO RELATED APPLICATION

This application is a Section 371 of International Application No. PCT/JP2015/073190, filed Aug. 19, 2015, which was published in the Japanese language on Mar. 3, 2016 under International Publication No. WO 2016/031639 A1, and the disclosure of which is incorporated herein by reference.

TECHNICAL FIELD

The present invention relates to a polymer compound and a light emitting device using the same.

BACKGROUND ART

An organic electroluminescent device (hereinafter, referred to also as "light emitting device") can be suitably used for applications of a display and illumination because of high light emission efficiency and low driving voltage, and is recently attracting attention. This light emitting device has organic layers such as a light emitting layer, a hole transporting layer and the like. By using a polymer compound, the organic layer can be formed by an application method typified by an inkjet printing method, hence, a polymer compound used for production of a light emitting device is under investigation.

As a material used in a hole transporting layer of a light emitting device, Patent document 1 describes a polymer compound containing an arylamine constitutional unit in an amount of 90 mol % or more, with respect to the total content of constitutional units contained in the polymer compound. The arylamine constitutional unit is, in every instance, a constitutional unit in which a carbon atom adjacent to a carbon atom forming a bond to the adjacent constitutional unit has not substituent.

As a material used in a hole transporting layer of a light emitting device, Patent document 2 describes a polymer compound containing an arylamine constitutional unit in which a carbon atom adjacent to a carbon atom forming a bond to the adjacent constitutional unit has a substituent. The arylamine constitutional unit is, in every instance, a constitutional unit in which an sp3 nitrogen atom constituting the arylamine constitutional unit carries an aryl group composed of one ring.

PRIOR ART DOCUMENT

Patent Document

Patent document 1: International Publication WO2013/114976
Patent document 2: JP-A No. 2014-111765

SUMMARY OF THE INVENTION

Problem to be Solved by the Invention

A light emitting device produced by using the above-described polymer compound, however, has not necessarily sufficient external quantum yield.

Then, the present invention has an object of providing a polymer compound which is useful for production of a light emitting device excellent in external quantum yield. Further, the present invention has an object of providing a composition comprising the polymer compound and a light emitting device produced by using the polymer compound.

Means for Solving the Problems

The present invention provides the following [1] to [15].

[1] A polymer compound comprising a constitutional unit represented by the formula (1):

[Chemical Formula 1]

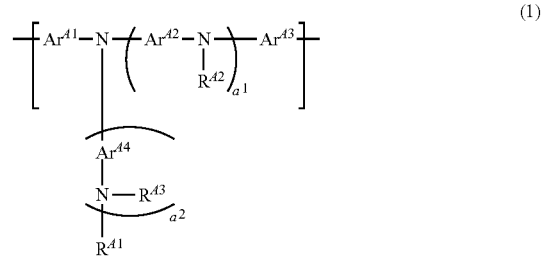

[wherein,
$a^1$ and $a^2$ each independently represent 0 or 1.
$Ar^{41}$ and $Ar^{43}$ each independently represent an arylene group or a divalent heterocyclic group, the foregoing groups each optionally having a substituent. In $Ar^{41}$ and $Ar^{43}$ at least one atom adjacent to an atom forming a bond to the constitutional unit adjacent to the each of $Ar^{41}$ and $Ar^{43}$ has an alkyl group, a cycloalkyl group, an alkoxy group, a cycloalkoxy group, an aryl group or a monovalent heterocyclic group as a substituent, the foregoing substituents each optionally further having a substituent.
$Ar^{42}$ represents a phenylene group and this phenylene group optionally has a substituent.
$Ar^{44}$ represents an arylene group, a divalent heterocyclic group or a divalent group in which at least one type of arylene group and at least one type of divalent heterocyclic group are bonded directly to each other, the foregoing groups each optionally having a substituent.
$R^{41}$, $R^{42}$ and $R^{43}$ each independently represent a hydrogen atom, an alkyl group, a cycloalkyl group, an aryl group or a monovalent heterocyclic group, the foregoing groups each optionally having a substituent.
When $a^2$ is 0, $R^{41}$ represents an aryl group in which two or more rings are condensed (the number of carbon atoms constituting the rings of the aryl group is 10 or more) or a monovalent heterocyclic group in which two or more rings are condensed (the total number of carbon atoms and hetero atoms constituting the rings of the monovalent heterocyclic group is 10 or more), the foregoing groups each optionally having a substituent.].

[2] The polymer compound according to [1], wherein $Ar^{41}$ and $Ar^{43}$ each represent a phenylene group.

[3] The polymer compound according to [1] or [2], wherein $a^2$ is 0.

[4] The polymer compound according to any one of [1] to [3], wherein in each of $Ar^{41}$ and $Ar^{43}$ the at least one atom adjacent to an atom forming a bond to the constitutional unit adjacent to the each of $Ar^{41}$ and $Ar^{43}$ has an alkyl group or a cycloalkyl group as a substituent.

[5] The polymer compound according to any one of [1] to [4], wherein $R^{41}$ is a group selected from Group AA of aryl groups or a group selected from Group BB of monovalent heterocyclic groups:
(Group AA of Aryl Groups)
[Chemical Formula 2]
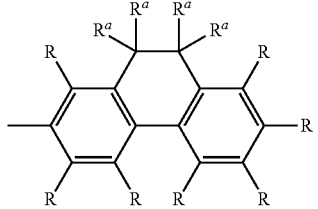
(AA-1)
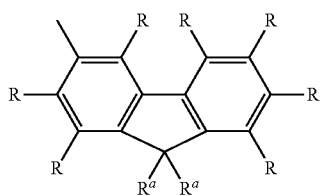
(AA-2)
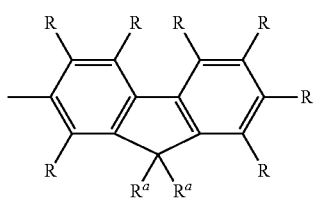
(AA-3)
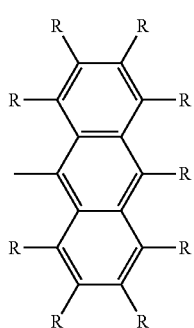
(AA-4)
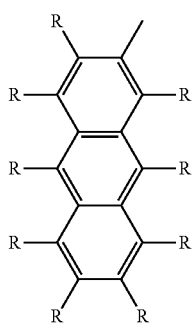
(AA-5)
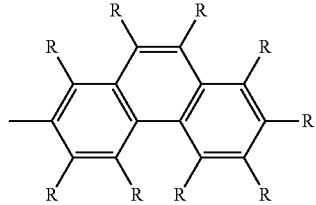
(AA-6)
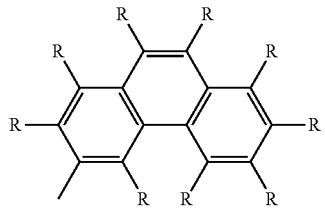
(AA-7)
(Group BB of Monovalent Heterocyclic Groups)
[Chemical Formula 3]
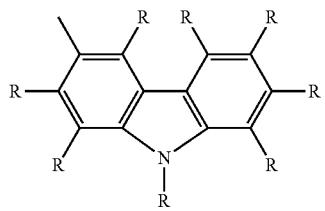
(BB-1)
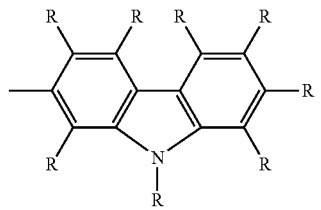
(BB-2)
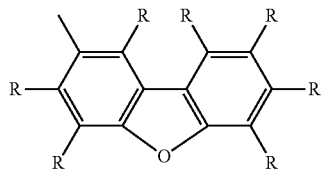
(BB-3)
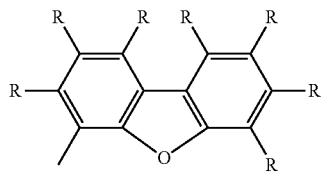
(BB-4)
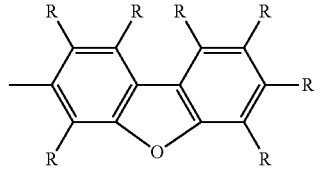
(BB-5)

-continued

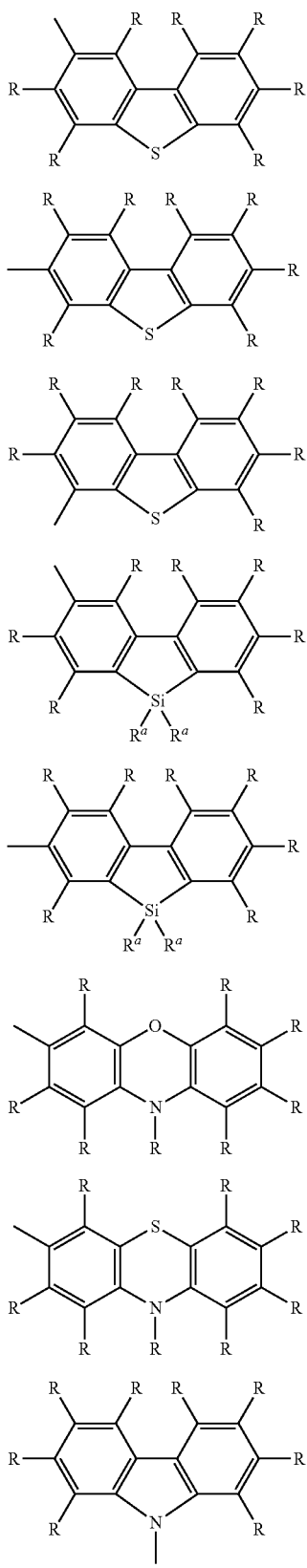

(BB-6)

(BB-7)

(BB-8)

(BB-9)

(BB-10)

(BB-11)

(BB-12)

(BB-13)

[wherein, R and $R^a$ each independently represent a hydrogen atom, an alkyl group, a cycloalkyl group, an aryl group or a monovalent heterocyclic group. The plurality of R and $R^a$ each may be the same or different at each occurrence, and groups $R^a$ may be combined together to form a ring together with the atoms to which they are attached.].

[6] The polymer compound according to any one of [1] to [5], wherein the constitutional unit represented by the formula (1) is a constitutional unit represented by the formula (4):

[Chemical Formula 4]

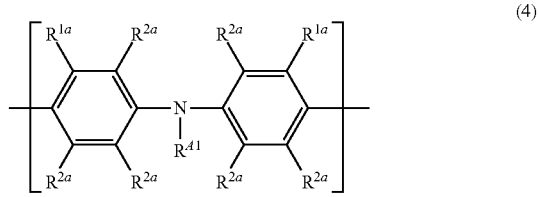

(4)

[wherein, $R^{41}$ is as defined above.

$R^{1a}$ represents an alkyl group, a cycloalkylgroup, an alkoxy group, a cycloalkoxy group, an aryl group or a monovalent heterocyclic group, the foregoing groups each optionally having a substituent. The plurality of $R^{1a}$ may be the same or different.

$R^{2a}$ represents a hydrogen atom, an alkyl group, a cycloalkyl group, an alkoxy group, a cycloalkoxy group, an aryl group, a monovalent heterocyclic group or a halogen atom, the foregoing groups each optionally having a substituent. The plurality of $R^{2a}$ may be the same or different.].

[7] The polymer compound according to any one of [1] to [6], further comprising at least one constitutional unit selected from the group consisting of a constitutional unit represented by the formula (1X) and a constitutional unit represented by the formula (1Z):

[Chemical Formula 5]

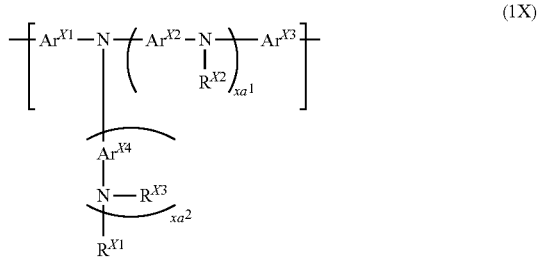

(1X)

[wherein, $xa^1$ and $xa^2$ each independently represent an integer of 0 or more.

$Ar^{X1}$ and $Ar^{X3}$ each independently represent an arylene group or a divalent heterocyclic group, the foregoing groups each optionally having a substituent. In each of $Ar^{X1}$ and $Ar^{X3}$ the atoms adjacent to the atom forming a bond to the constitutional unit adjacent to the each of $Ar^{41}$ and $Ar^{43}$ dose not have an alkyl group, a cycloalkyl group, an alkoxy group, a cycloalkoxy group, an aryl group or a monovalent heterocyclic group as a substituent.

$Ar^{X2}$ and $Ar^{X4}$ each independently represent an arylene group, a divalent heterocyclic group or a divalent group in which at least one type of arylene group and at least one type of divalent heterocyclic group are bonded directly to each other, the foregoing groups each optionally having a substituent.

$R^{X1}$, $R^{X2}$ and $R^{X3}$ each independently represent a hydrogen atom, an alkyl group, a cycloalkyl group, an aryl group or a monovalent heterocyclic group, the foregoing groups each optionally having a substituent.]

[Chemical Formula 6]

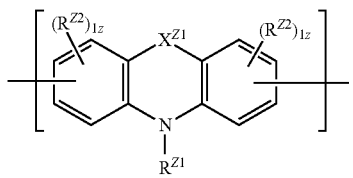

(1Z)

[wherein, $R^{Z1}$ represents a hydrogen atom, an alkyl group, a cycloalkyl group, an aryl group or a monovalent heterocyclic group, the foregoing groups each optionally has a substituent.

1z represents an integer of 0 to 3. The plurality of 1z may be the same or different.

$R^{Z2}$ represents an alkyl group, a cycloalkyl group, an aryl group or a monovalent heterocyclic group, the foregoing groups each optionally having a substituent. When a plurality of $R^{Z2}$ are present, they may be the same or different.

$X^{Z1}$ represents a single bond, an oxygen atom, a sulfur atom, a group represented by —$CR^{Z11}R^{Z12}$— or a group represented by —$SiR^{Z13}R^{Z14}$—. $R^{Z11}$, $R^{Z12}$, $R^{Z13}$ and $R^{Z14}$ each independently represent a hydrogen atom, an alkyl group, a cycloalkyl group, an aryl group or a monovalent heterocyclic group, the foregoing groups each optionally having a substituent.].

[8] The polymer compound according to [7], wherein at least one selected from the group consisting of $R^{41}$, $R^{42}$ and $R^{43}$ is a group obtained by removing from a fluorene ring optionally having a substituent one hydrogen atom linked directly to a carbon atom constituting the ring.

[9] The polymer compound according to [7] or [8], comprising a constitutional sequence in which the constitutional unit represented by the formula (1) and at least one constitutional unit selected from the group consisting of the constitutional unit represented by the formula (1X) and the constitutional unit represented by the formula (1Z) are adjacent to each other.

[10] The polymer compound according to any one of [7] to [9], wherein the total content of the constitutional unit represented by the formula (1), the constitutional unit represented by the formula (1X) and the constitutional unit represented by the formula (1Z) is 50 to 100 mol %, with respect to the total content of constitutional units contained in the polymer compound.

[11] The polymer compound according to any one of [1] to [10], further comprising a crosslinkable constitutional unit having at least one crosslinkable group selected from Group A of crosslinkable groups:

(Group A of Crosslinkable Groups)

[Chemical Formula 7]

 (XL-1)

 (XL-2)

 (XL-3)

 (XL-4)

 (XL-5)

 (XL-6)

 (XL-7)

 (XL-8)

 (XL-9)

 (XL-10)

 (XL-11)

 (XL-12)

 (XL-13)

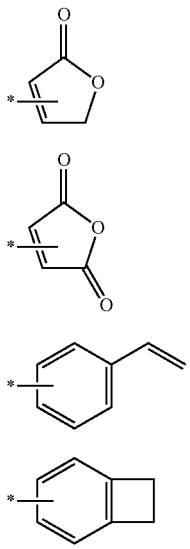

(XL-14)

(XL-15)

(XL-16)

(XL-17)

[wherein, $R^{XL}$ represents a methylene group, an oxygen atom or a sulfur atom, and $n^{XL}$ represents an integer of 0 to 5. When a plurality of $R^{XL}$ are present, they may be the same or different, and when a plurality of $n^{XL}$ are present, they may be the same or different. * represents a binding position. The foregoing crosslinkable groups each optionally have a substituent.].

[12] The polymer compound according to [11], wherein the crosslinkable constitutional unit is a constitutional unit represented by the formula (5) or a constitutional unit represented by the formula (5') (these constitutional unit are different from the constitutional unit represented by the formula (1), the constitutional unit represented by the formula (1X) and the constitutional unit represented by the formula (1Z)):

[Chemical Formula 8]

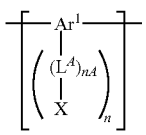

(5)

[wherein, nA represents an integer of 0 to 5, and n represents 1 or 2. When a plurality of nA are present, they may be the same or different.

$Ar^1$ represents an aromatic hydrocarbon group or a heterocyclic group, the foregoing groups each optionally having a substituent.

$L^A$ represents an alkylene group, a cycloalkylene group, an arylene group, a divalent heterocyclic group, a group represented by —NR'—, an oxygen atom or a sulfur atom, the foregoing groups each optionally having a substituent. R' represents a hydrogen atom, an alkyl group, a cycloalkyl group, an aryl group or a monovalent heterocyclic group, the foregoing groups each optionally having a substituent. When a plurality of $L^A$ are present, they may be the same or different.

X represents a crosslinkable group selected from Group A of crosslinkable groups. When a plurality of X are present, they may be the same or different.]

[Chemical Formula 9]

(5')

[wherein, mA represents an integer of 0 to 5, m represents an integer of 1 to 4, and c represents an integer of 0 or 1. When a plurality of mA are present, they may be the same or different.

$Ar^2$ represents an aromatic hydrocarbon group, a heterocyclic group or a group in which at least one type of aromatic hydrocarbon ring and at least one type of heterocyclic ring are bonded directly to each other, the foregoing groups each optionally having a substituent.

$Ar^3$ and $Ar^4$ each independently represent an arylene group or a divalent heterocyclic group, the foregoing groups each optionally having a substituent.

each of groups $Ar^2$, $Ar^3$ and $Ar^4$ is bonded directly or via an oxygen atom or a sulfur atom to a group that is different from that group and that is attached to the nitrogen atom to which that group is attached, thereby forming a ring.

$K^A$ represents an alkylene group, a cycloalkylene group, an arylene group, a divalent heterocyclic group, a group represented by —NR'—, an oxygen atom or a sulfur atom, the foregoing groups each optionally having a substituent. R' represents a hydrogen atom, an alkyl group, a cycloalkyl group, an aryl group or a monovalent heterocyclic group, the foregoing groups each optionally having a substituent. When a plurality of KA are present, they may be the same or different.

X' represents a crosslinkable group selected from Group A of crosslinkable groups, a hydrogen atom, an alkyl group, a cycloalkyl group, an aryl group or a monovalent heterocyclic group, the foregoing groups each optionally having a substituent. The plurality of X' may be the same or different. At least one X' is the crosslinkable group selected from Group A of crosslinkable groups.].

[13] The polymer compound according to [11] or [12], wherein the crosslinkable group is the crosslinkable group represented by the formula (XL-1) or (XL-17).

[14] A composition comprising the polymer compound according to any one of [1] to [13] and at least one material selected from the group consisting of a hole transporting material, a hole injection material, an electron transporting material, an electron injection material, a light emitting material, an antioxidant and a solvent.

[15] A light emitting device produced by using the polymer compound according to any one of [1] to [13].

Effect of the Invention

The present invention can provide a polymer compound which is useful for production of a light emitting device excellent in external quantum yield. Also, the present invention can provide a composition containing the polymer compound and a light emitting device obtained by using the polymer compound.

MODES FOR CARRYING OUT THE INVENTION

Suitable embodiments of the present invention will be illustrated in detail below.

<Explanation of Common Term>

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a light hydrogen atom or a heavy hydrogen atom.

A solid line representing a bond to a central metal in a formula representing a metal complex denotes a coordinate bond or a covalent bond.

"Polymer compound" denotes a polymer having molecular weight distribution and having a polystyrene-equivalent number average molecular weight of $1\times10^3$ to $1\times10^8$.

"Low molecular weight compound" denotes a compound having no molecular weight distribution and having a molecular weight of $1\times10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, an isobutyl group, a tert-butyl group, a pentyl group, an isoamyl group, a 2-ethylbutyl group, a hexyl group, a heptyl group, a octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in the foregoing groups with a cycloalkyl group, an alkoxy group, a cycloalkoxy group, an aryl group, a fluorine atom or the like, and the alkyl group having a substituent includes a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-n-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in the foregoing groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, a octyloxy group, a 2-ethylhexyloxy group, a nonyloxy group, a decyloxy group, a 3,7-dimethyloctyloxy group and a lauryloxy group, and groups obtained by substituting a hydrogen atom in the foregoing groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 7 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in the foregoing groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidinyl group, a quinolinyl group, an isoquinolinyl group, a pyrimidinyl group, a triazinyl group, and groups obtained by substituting a hydrogen atom in the foregoing groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear or branched. The number of carbon atoms of the linear alkenyl group, not including the number of carbon atoms of a substituent, is usually 2 to 30, preferably 3 to 20. The number of carbon atoms of the branched alkenyl group, not including the number of carbon atoms of a substituent, is usually 3 to 30, preferably 4 to 20.

The number of carbon atoms of "Cycloalkenyl group", not including the number of carbon atoms of a substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, the foregoing groups each having a substituent.

"Alkynyl group" may be any of linear or branched. The number of carbon atoms of the alkynyl group, not including the number of carbon atoms of a substituent, is usually 2 to 20, preferably 3 to 20. The number of carbon atoms of the branched alkynyl group, not including the number of carbon atoms of a substituent, is usually 4 to 30, preferably 4 to 20.

The number of carbon atoms of "Cycloalkynyl group", not including the number of carbon atoms of a substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, the foregoing groups each having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, the foregoing groups each having a substituent, preferably, groups represented by the formulae (A-1) to (A-20). The arylene group includes groups obtained by linking a plurality of the foregoing groups.

[Chemical Formula 10]

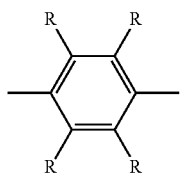

(A-1)

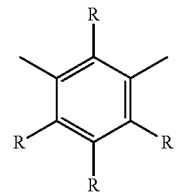

(A-2)

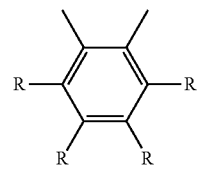

(A-3)

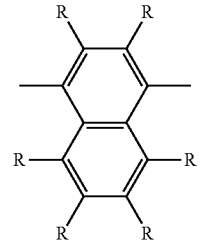

(A-4)

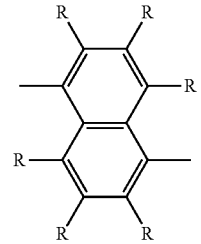

(A-5)

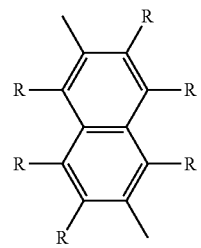

(A-6)

[Chemical Formula 11]

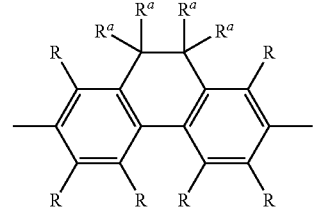

(A-7)

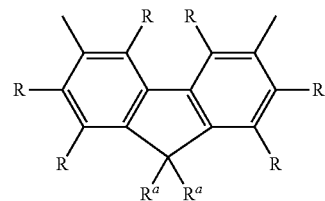

(A-8)

-continued
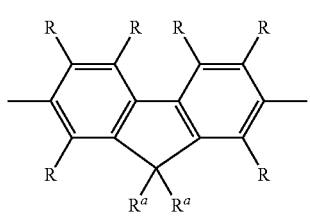 (A-9)
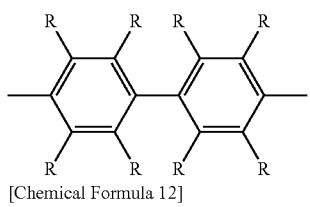 (A-10)
[Chemical Formula 12]
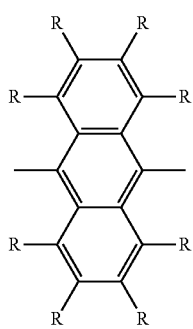 (A-11)
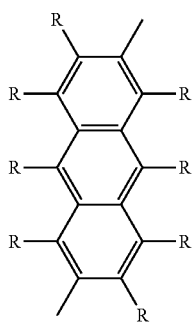 (A-12)
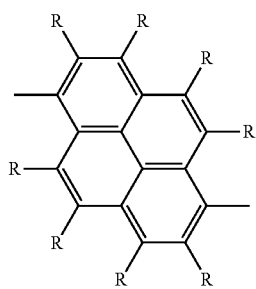 (A-13)
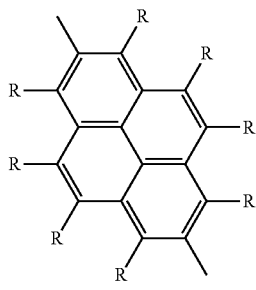 (A-14)
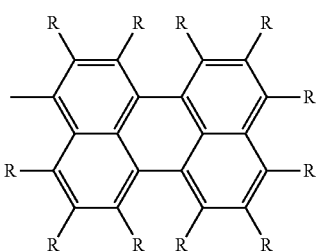 (A-15)
[Chemical Formula 13]
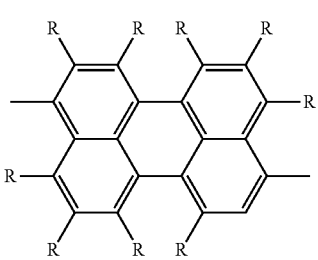 (A-16)
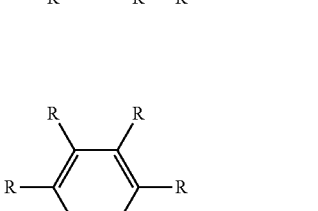 (A-17)
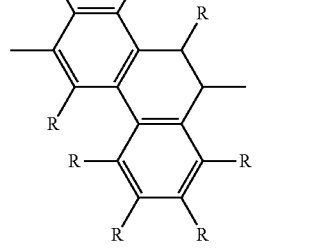 (A-18)
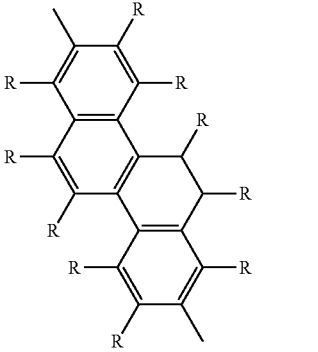
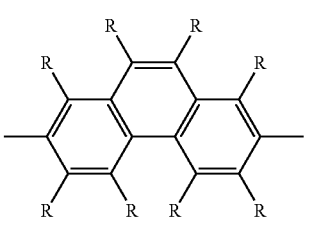 (A-19)

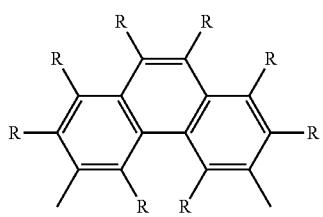
(A-20)

[wherein, R and $R^a$ each independently represent a hydrogen atom, an alkyl group, a cycloalkyl group, an aryl group or a monovalent heterocyclic group. The plurality of R and $R^a$ each may be the same or different, and adjacent $R^a$s may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (B-1) to (B-34). The divalent heterocyclic group includes groups obtained by linking a plurality of the foregoing groups.

[Chemical Formula 14]

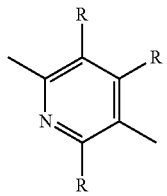
(B-1)

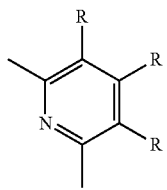
(B-2)

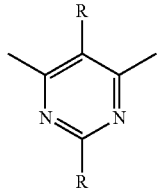
(B-3)

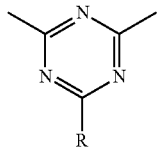
(B-4)

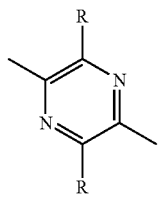
(B-5)

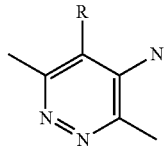
(B-6)

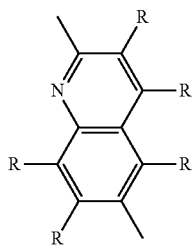
(B-7)

[Chemical Formula 15]

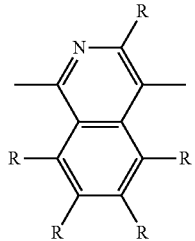
(B-8)

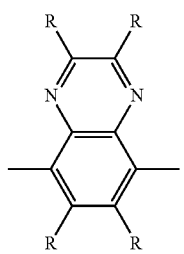
(B-9)

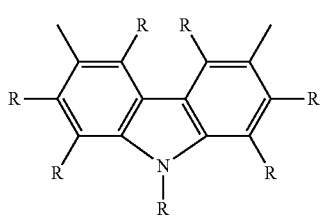
(B10)

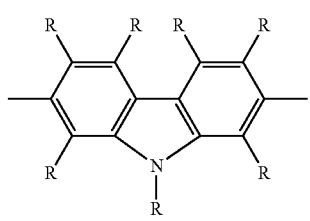
(B-11)

[Chemical Formula 16]
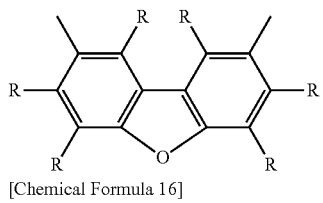
(B-12)
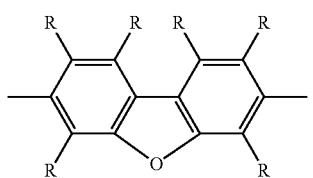
(B-13)
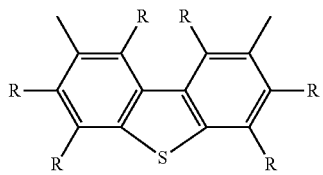
(B-14)
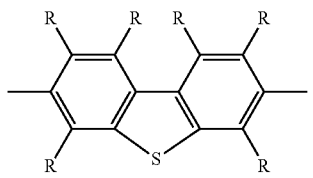
(B-15)
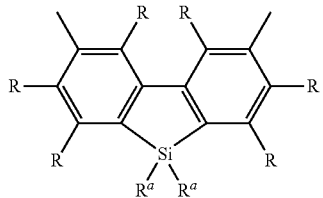
(B-16)
[Chemical Formula 17]
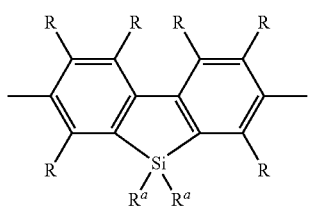
(B-17)
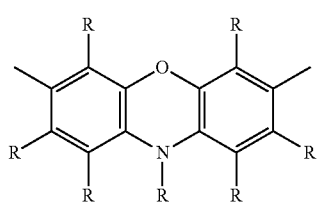
(B-18)
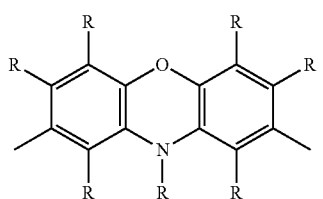
(B-19)
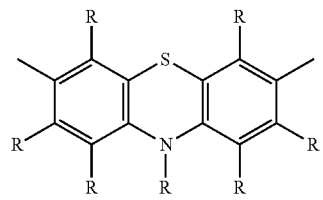
(B-20)
[Chemical Formula 18]
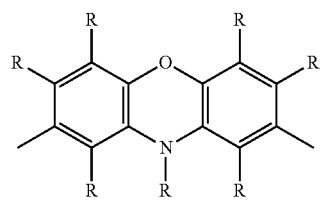
(B-21)
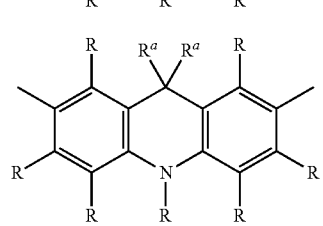
(B-22)
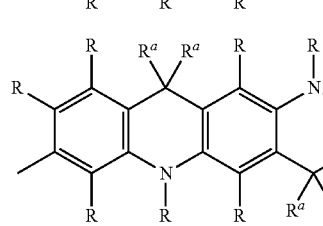
(B-23)
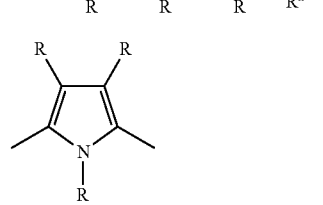
(B-24)
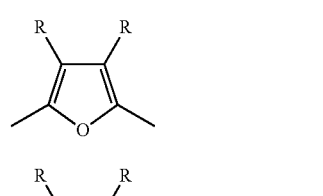
(B-25)
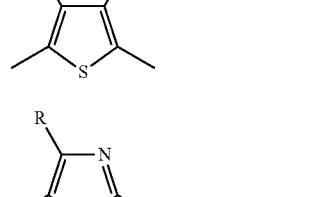
(B-26)
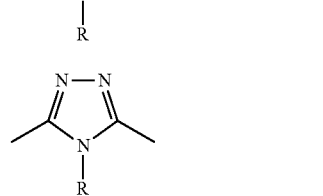
(B-27)
(B-28)

-continued

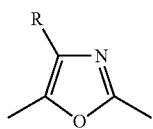
(B-29)

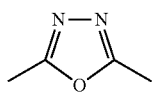
(B-30)

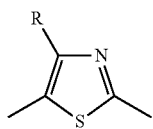
(B-31)

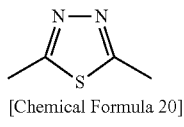
(B-32)

[Chemical Formula 20]

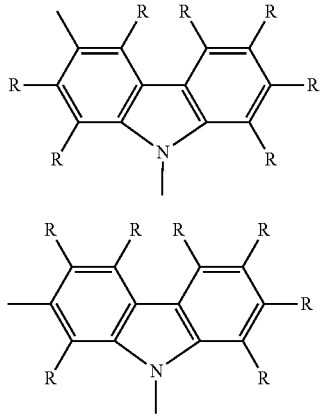
(B-33)

(B-34)

[wherein, R and R$^a$ are as defined above.]

"Crosslinkable group" is a group capable of forming a new bond by being subjected to a heating treatment, an ultraviolet irradiation treatment, a radical reaction and the like, and crosslinkable groups are preferably groups represented by the formulae (XL-1) to (XL-17) of Group A of crosslinkable groups.

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

<Polymer Compound>

The polymer compound of the present invention is a polymer compound comprising a constitutional unit represented by the formula (1).

[Constitutional Unit Represented by the Formula (1)]

a$^1$ is preferably 0, because a light emitting device using the polymer compound of the present invention is excellent in luminance life.

a$^2$ is preferably 0, because a light emitting device using the polymer compound of the present invention is excellent in luminance life.

The arylene group represented by Ar$^{41}$ and Ar$^{43}$ is preferably a group represented by the formula (111-1) to the formula (111-10), more preferably a group represented by the formula (111-1) to the formula (111-3) or the formula (111-9), further preferably a group represented by the formula (111-1) to the formula (111-3). In the arylene group represented by Ar$^{41}$ and Ar$^{43}$, at least one of atoms adjacent to an atom forming a bond to the constitutional unit adjacent to the each of Ar$^{41}$ and Ar$^{43}$ has an alkyl group, a cycloalkyl group, an alkoxy group, a cycloalkoxy group, an aryl group or a monovalent heterocyclic group as a substituent, the foregoing substituents each optionally further having a substituent.

[Chemical Formula 21]

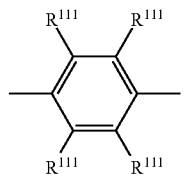
(111-1)

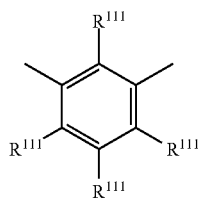
(111-2)

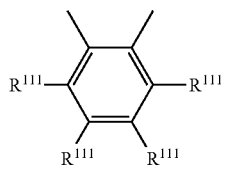
(111-3)

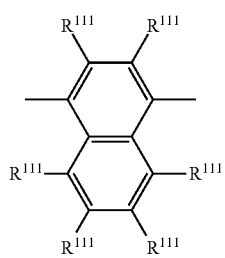
(111-4)

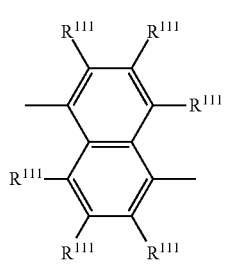
(111-5)

-continued

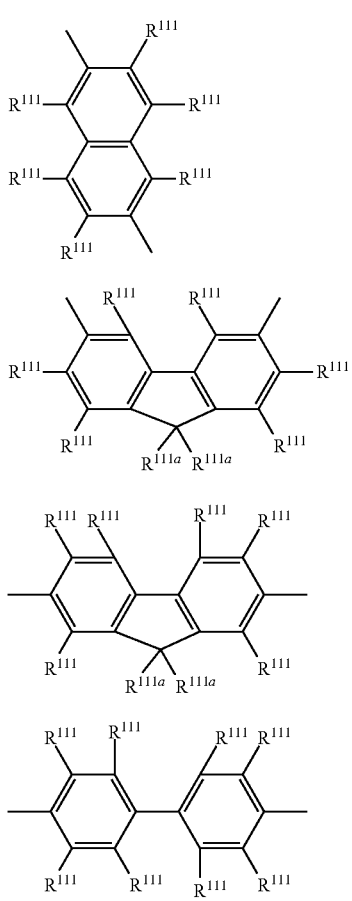

(111-6)

(111-8)

(111-9)

(111-10)

[wherein, $R^{111}$ and $R^{111a}$ each independently represent a hydrogen atom, an alkyl group, a cycloalkyl group, an alkoxy group, a cycloalkoxy group, an aryl group or a monovalent heterocyclic group. The plurality of $R^{111}$ and $R^{111a}$ each may be the same or different, and the plurality of $R^{111a}$ may be combined together to form a ring together with atoms to which they are attached.].

The divalent heterocyclic group represented by $Ar^{41}$ and $Ar^{43}$ is preferably a group represented by the formula (111-11) to the formula (111-23). In the divalent heterocyclic group represented by $Ar^{41}$ and $Ar^{43}$, at least one of atoms adjacent to an atom forming a bond to the constitutional unit adjacent to the each of $Ar^{41}$ and $Ar^{43}$ has an alkyl group, a cycloalkyl group, an alkoxy group, a cycloalkoxy group, an aryl group or a monovalent heterocyclic group as a substituent, the foregoing substituents each optionally further having a substituent.

[Chemical Formula 22]

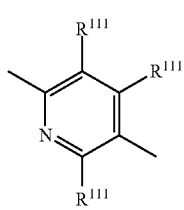

(111-11)

-continued

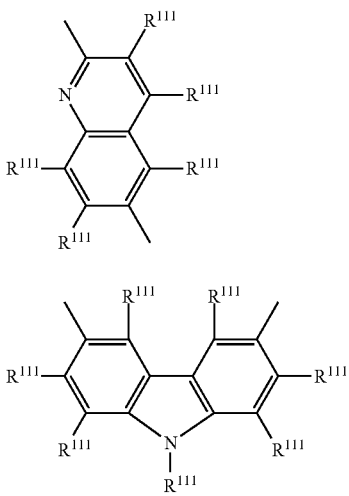

(111-12)

(111-13)

(111-14)

[Chemical Formula 23]

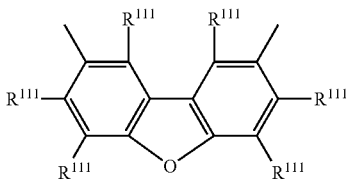

(111-15)

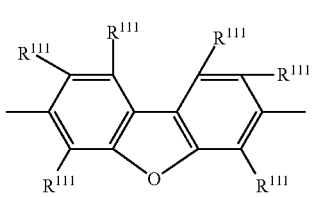

(111-16)

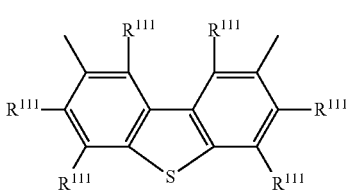

(111-17)

[Chemical Formula 24]

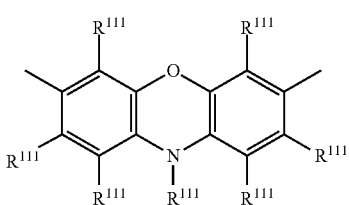

(111-18)

-continued

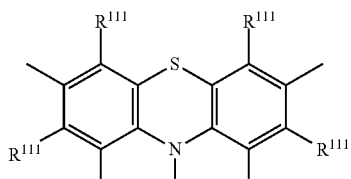
(111-19)

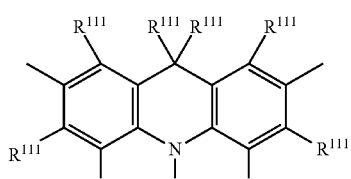
(111-20)

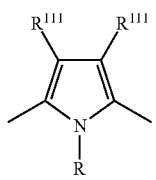
(111-21)

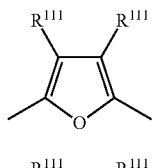
(111-22)

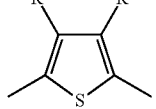
(111-23)

[Chemical Formula 25]

[wherein, $R^{111}$ is as defined above.].

$Ar^{41}$ and $Ar^{43}$ represent preferably an arylene group, more preferably a phenylene group, because the light emitting device of the present invention is more excellent in external quantum yield. In the arylene group represented by $Ar^{41}$ and $Ar^{43}$, at least one of atoms adjacent to an atom forming a bond to the constitutional unit adjacent to the each of $Ar^{41}$ and $Ar^{43}$ has an alkyl group, a cycloalkyl group, an alkoxy group, a cycloalkoxy group, an aryl group or a monovalent heterocyclic group as a substituent, the foregoing substituents each optionally further having a substituent.

In $Ar^{41}$ and $Ar^{43}$, at least one of atoms adjacent to an atom forming a bond to the constitutional unit adjacent to the each of $Ar^{41}$ and $Ar^{43}$ preferably has an alkyl group or a cycloalkyl group as a substituent, more preferably has an alkyl group as a substituent, because a light emitting device using the polymer compound of the present invention is more excellent in external quantum yield.

$Ar^{42}$ represents a phenylene group, and this phenylene group optionally has a substituent.

The arylene group represented by $Ar^{44}$ is more preferably a group represented by the formula (A-1), the formula (A-6), the formula (A-7), the formula (A-9) to the formula (A-11) or the formula (A-19), the foregoing groups each optionally having a substituent.

The divalent heterocyclic group represented by $Ar^{44}$ is more preferably a group represented by the formula (B-1), the formula (B-2) or the formula (B-7) to the formula (B-26), the foregoing groups each optionally having a substituent.

More preferable ranges of the arylene group and the divalent heterocyclic group in the divalent group in which at least one type of arylene group and at least one type of divalent heterocyclic group are bonded directly represented by $Ar^{44}$ are the same as more preferable ranges of the arylene group and the divalent heterocyclic group represented by $Ar^{42}$ and $Ar^{44}$, respectively.

The divalent group in which at least one type of arylene group and at least one type of divalent heterocyclic group are bonded directly represented by $Ar^{44}$ includes, for example, groups represented by the following formulae, the foregoing groups each optionally having a substituent.

[Chemical Formula 26]

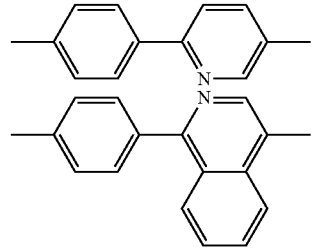

[wherein, $R^{XX}$ represents a hydrogen atom, an alkyl group, a cycloalkyl group, an aryl group or a monovalent heterocyclic group, the foregoing groups each optionally having a substituent.].

$R^{XX}$ is preferably an alkyl group, a cycloalkyl group or an aryl group, the foregoing groups each optionally having a substituent.

$Ar^{44}$ is preferably an arylene group, and this arylene group optionally has a substituent.

$R^{41}$, $R^{42}$ and $R^{43}$ represent preferably an alkyl group, a cycloalkyl group, an aryl group or a monovalent heterocyclic group, more preferably an aryl group or a monovalent heterocyclic group, the foregoing groups each optionally having a substituent. When $a^2$ is 0, $R^{41}$ is an aryl group in which two or more rings are condensed (The number of carbon atoms constituting the rings of the aryl group is 10 or more. That is, the number of carbon atoms constituting the rings of the aryl group in which two or more rings are condensed is 10 or more) or a monovalent heterocyclic group in which two or more rings are condensed (The total number of carbon atoms and hetero atoms constituting the rings of the monovalent heterocyclic group is 10 or more. That is, the total number of carbon atoms and hetero atoms constituting the rings of the monovalent heterocyclic group in which two or more rings are condensed is 10 or more), the foregoing groups each optionally having a substituent.

$R^{A1}$ is preferably a group selected from Group AA of aryl groups or a group selected from Group BB of monovalent heterocyclic groups, more preferably the formula (AA-1) to the formula (AA-3), the formula (BB-1) to the formula (BB-4), the formula (BB-6), the formula (BB-9) or the formula (BB-10), further preferably the formula (AA-1), the formula (AA-3), the formula (BB-1), the formula (BB-3), the formula (BB-4) or the formula (BB-10), because a light emitting device using the polymer compound of the present invention is excellent in external quantum yield.

At least one selected from the group consisting of $R^{A1}$ and $R^{A2}$ and $R^{A3}$ is preferably a group obtained by removing from a fluorene ring optionally having a substituent one hydrogen atom linked directly to a carbon atom constituting the ring, because a light emitting device using the polymer compound of the present invention is more excellent in external quantum yield.

The substituent which a group represented by $Ar^{41}$ and $Ar^{43}$ optionally has (that is, the substituent which an atom other than the atom adjacent to an atom forming a bond to the constitutional unit adjacent to the each of $Ar^{41}$ and $Ar^{43}$ optionally has) is preferably an alkyl group, a cycloalkyl group or an aryl group, the foregoing groups each optionally further having a substituent.

The substituent which a group represented by $Ar^{42}$, $Ar^{44}$, $R^{A1}$, $R^{A2}$ and $R^{A3}$ optionally has is preferably an alkyl group, a cycloalkyl group or an aryl group, the foregoing groups each optionally further having a substituent.

The constitutional unit represented by the formula (1) is preferably a constitutional unit represented by the formula (2), because a light emitting device using the polymer compound of the present invention is more excellent in external quantum yield.

[Chemical Formula 27]

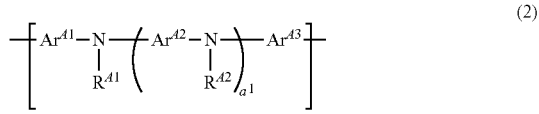

(2)

[wherein, $a^1$, $Ar^{41}$, $Ar^{42}$, $Ar^{43}$, $R^{A1}$ and $R^{A2}$ are as defined above.].

The constitutional unit represented by the formula (2) is preferably a constitutional unit represented by the formula (3), because a light emitting device using the polymer compound of the present invention is more excellent in external quantum yield.

[Chemical Formula 28]

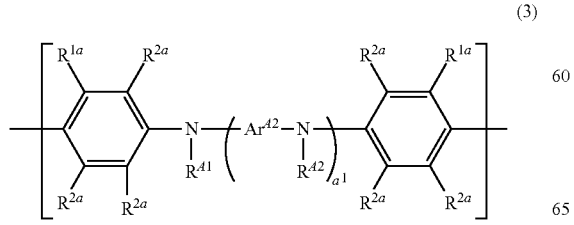

(3)

[wherein,
$a^1$, $Ar^{42}$, $R^{A1}$ and $R^{A2}$ are as defined above.

$R^{1a}$ represents an alkyl group, a cycloalkyl group, an alkoxy group, a cycloalkoxy group, an aryl group or a monovalent heterocyclic group, the foregoing groups each optionally having a substituent. The plurality of $R^{1a}$ may be the same or different.

$R^{2a}$ represents a hydrogen atom, an alkyl group, a cycloalkyl group, an alkoxy group, a cycloalkoxy group, an aryl group, a monovalent heterocyclic group or a halogen atom, the foregoing groups each optionally having a substituent. The plurality of $R^{2a}$ may be the same or different.].

The constitutional unit represented by the formula (3) is preferably a Constitutional unit represented by the formula (4), because a light emitting device using the polymer compound of the present invention is more excellent in external quantum yield.

The content of the constitutional unit represented by the formula (1) is preferably 0.1 to 90 mol %, more preferably 30 to 80 mol %, further preferably 40 to 60 mol %, with respect to the total content of constitutional units contained in the polymer compound, because the polymer compound of the present invention is excellent in hole transportability.

The constitutional unit represented by the formula (1) includes, for example, constitutional units represented by the formulae (1-1) to (1-16), preferably constitutional units represented by the formulae (1-1) to (1-6), the formula (1-10), the formula (1-11) or the formula (1-13).

[Chemical Formula 29]

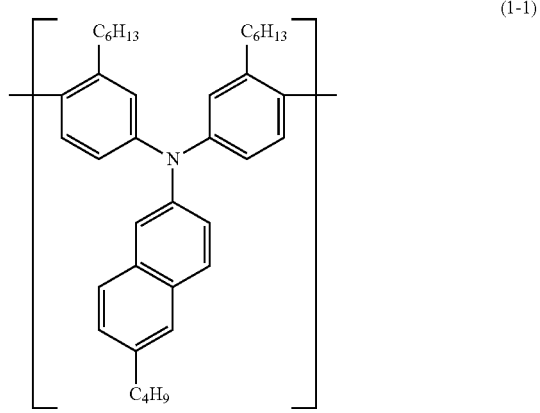

(1-1)

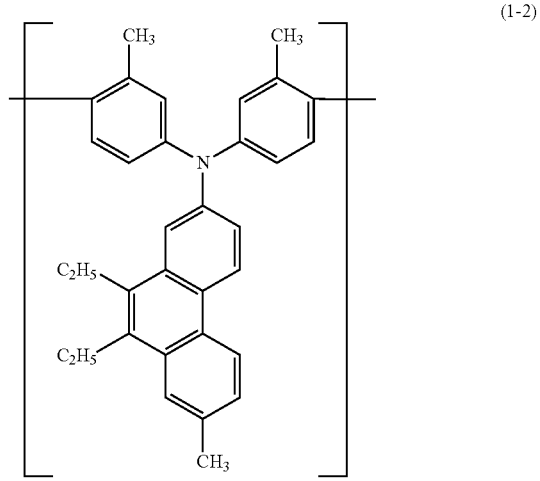

(1-2)

-continued
(1-3)
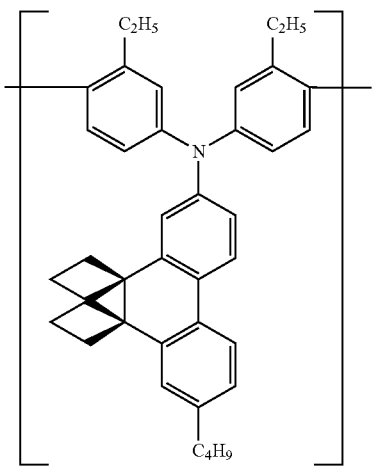
(1-6)
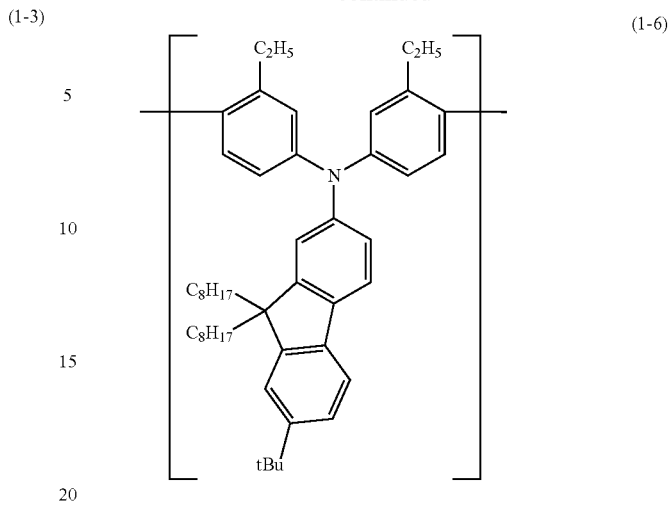
[Chemical Formula 30]
(1-4)
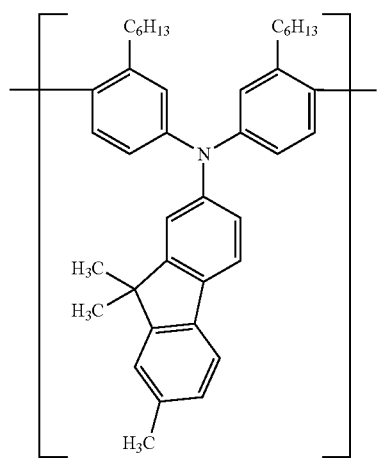
[Chemical Formula 31]
(1-7)
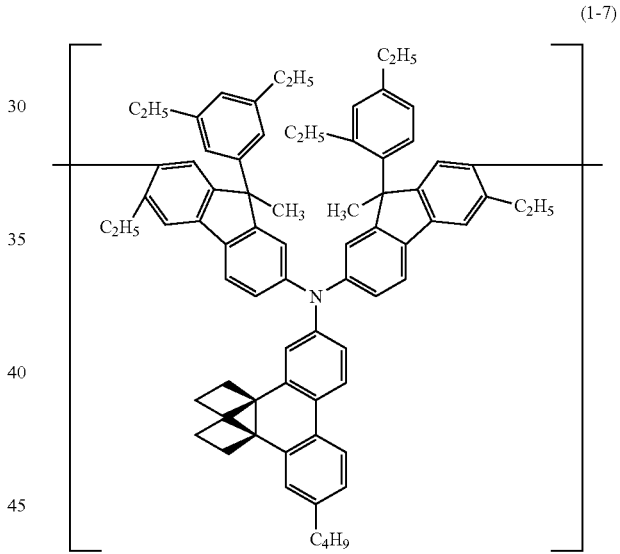
(1-5)
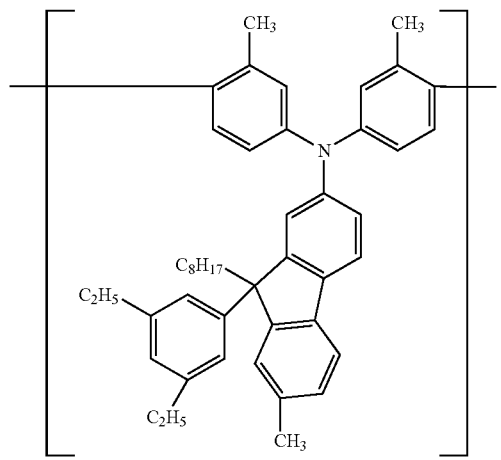
(1-8)
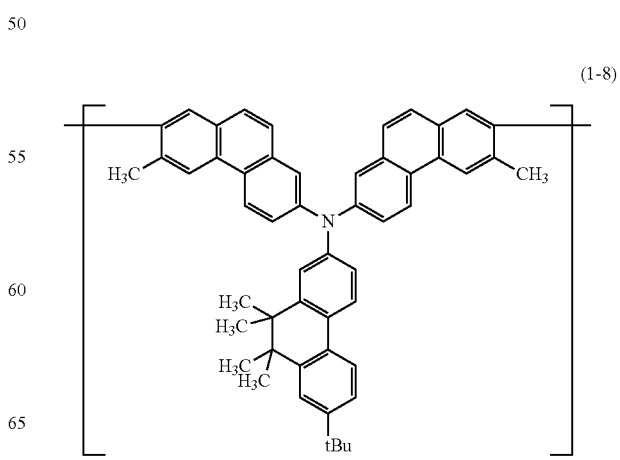

[Chemical Formula 32]
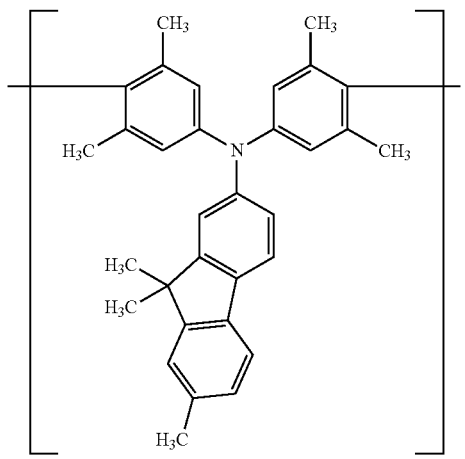
(1-9)
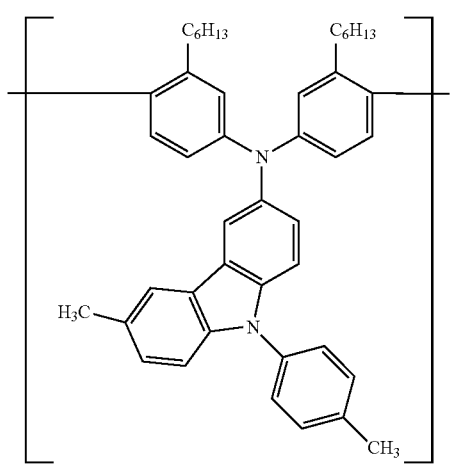
(1-10)
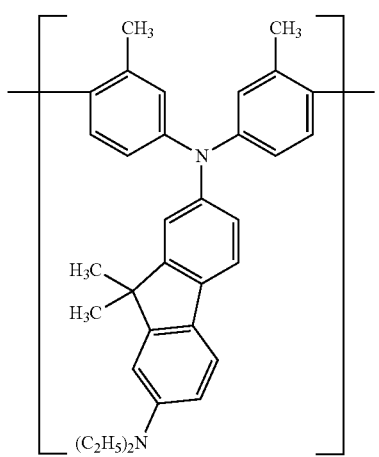
(1-11)
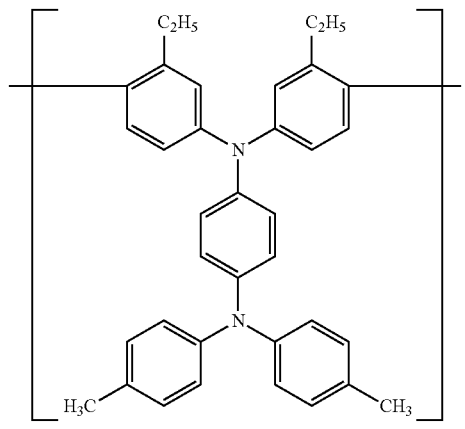
(1-12)
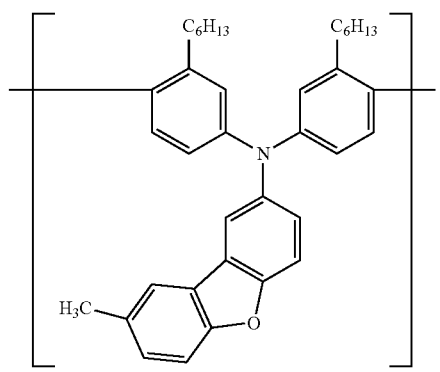
(1-13)
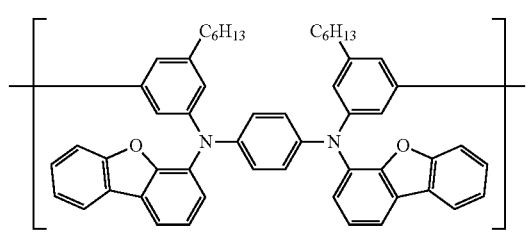
(1-14)
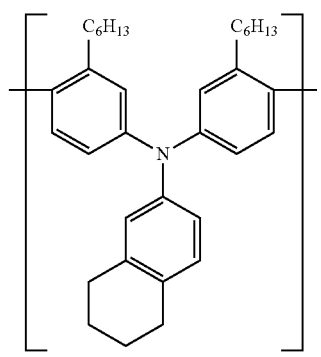
(1-15)

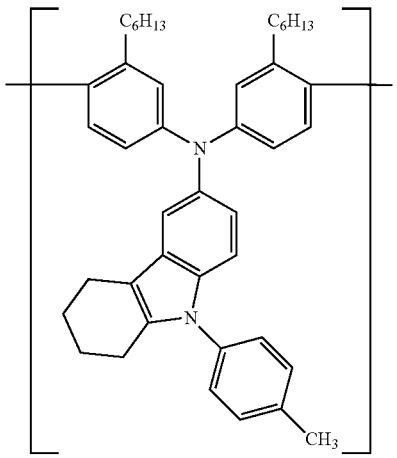

(1-16)

The constitutional unit represented by the formula (1) may be contained only singly or two or more units thereof may be contained in the polymer compound of the present invention.

The polymer compound of the present invention may further comprise at least one constitutional unit selected from the group consisting of a constitutional unit represented by the formula (1X) and a constitutional unit represented by the formula (1Z).

[Constitutional Unit Represented by the Formula (1X)]

$xa^1$ is preferably an integer of 2 or less, more preferably 0 or 1, further preferably 0, because a light emitting device using the polymer compound of the present invention is more excellent in external quantum yield.

$xa^2$ is preferably an integer of 2 or less, more preferably 0 or 1, further preferably 0, because a light emitting device using the polymer compound of the present invention is more excellent in external quantum yield.

The arylene group represented by $Ar^{X1}$, $Ar^{X2}$, $Ar^{X3}$ and $Ar^{X4}$ is more preferably a group represented by the formula (A-1), the formula (A-6), the formula (A-7), the formula (A-9) to the formula (A-11) or the formula (A-19), the foregoing groups each optionally having a substituent. In the arylene group represented by $Ar^{X1}$ and $Ar^{X3}$, the atoms adjacent to the atom forming a bond to the constitutional unit adjacent to the each of $Ar^{41}$ and $Ar^{43}$ does not have an alkyl group, a cycloalkyl group, an alkoxy group, a cycloalkoxy group, an aryl group or a monovalent heterocyclic group as a substituent.

The divalent heterocyclic group represented by $Ar^{X1}$, $Ar^{X2}$, $Ar^{X3}$ and $Ar^{X4}$ is more preferably a group represented by the formula (AA-1), the formula (AA-2) or the formula (AA-7) to the formula (AA-26), the foregoing groups each optionally having a substituent. In the divalent heterocyclic group represented by $Ar^{X1}$ and $Ar^{X3}$, the atoms adjacent to the atom forming a bond to the constitutional unit adjacent to the each of $Ar^{41}$ and $Ar^{43}$ does not have an alkyl group, a cycloalkyl group, an alkoxy group, a cycloalkoxy group, an aryl group or a monovalent heterocyclic group as a substituent.

More preferable ranges of the arylene group and the divalent heterocyclic group in the divalent group in which at least one type of arylene group and at least one type of divalent heterocyclic group are bonded directly represented by $Ar^{X2}$ and $Ar^{X4}$ are the same as more preferable ranges of the arylene group and the divalent heterocyclic group represented by $Ar^{X2}$ and $Ar^{X4}$, respectively.

The divalent group in which at least one type of arylene group and at least one type of divalent heterocyclic group are bonded directly represented by $Ar^{X2}$ and $Ar^{X4}$ includes the same examples as those of the divalent group in which at least one type of arylene group and at least one type of divalent heterocyclic group are bonded directly represented by $Ar^{42}$ and $Ar^{44}$ described above.

$Ar^{X1}$, $Ar^{X2}$, $Ar^{X3}$ and $Ar^{X4}$ represent preferably an arylene group, and this arylene group optionally has a substituent.

$R^{X1}$, $R^{X2}$ and $R^{X3}$ represent preferably an alkyl group, a cycloalkyl group, an aryl group or a monovalent heterocyclic group, more preferably an aryl group, and the foregoing groups each optionally having a substituent.

The substituent which a group represented by $Ar^{X1}$, $Ar^{X2}$, $Ar^{X3}$, $Ar^{X4}$, $R^{X1}$, $R^{X2}$ and $R^{X3}$ optionally has is preferably an alkyl group, a cycloalkyl group or an aryl group, the foregoing groups each optionally further having a substituent.

The constitutional unit represented by the formula (1X) is preferably a constitutional unit represented by the formula (1X-1) to (1X-11), more preferably a constitutional unit represented by the formula (1X-1) to (1X-7), further preferably a constitutional unit represented by the formula (1X-1) to (1X-6).

[Chemical Formula 33]

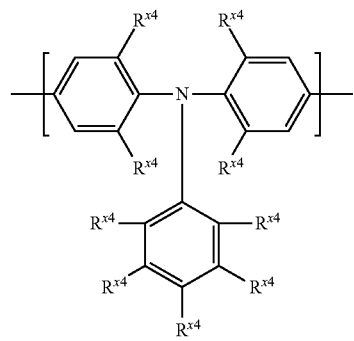

(1X-1)

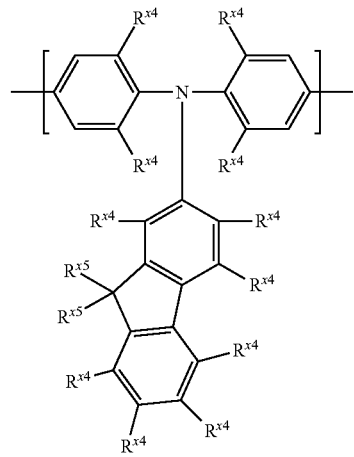

(1X-2)

-continued
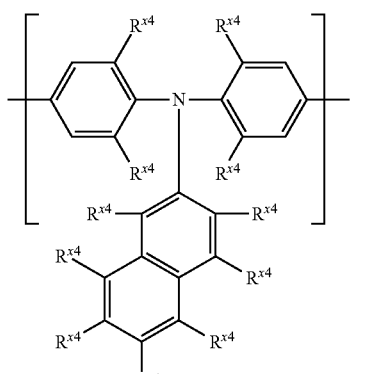
(1X-3)
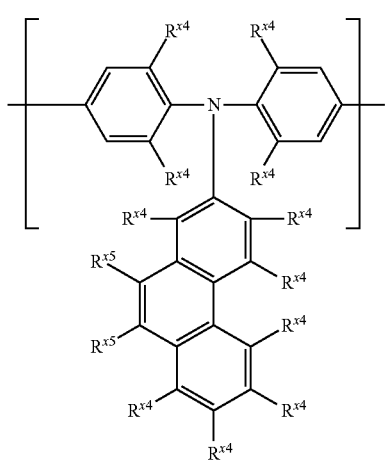
(1X-4)
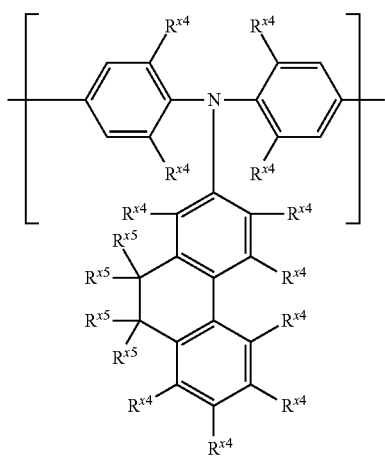
(1X-5)
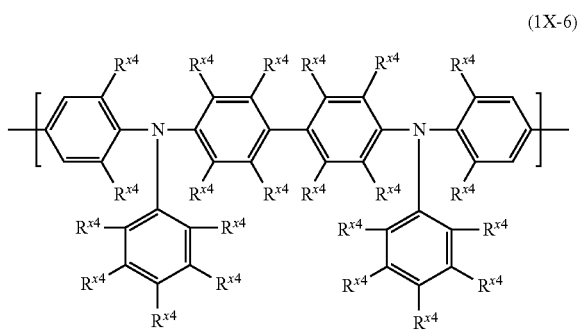
(1X-6)
[Chemical Formula 34]
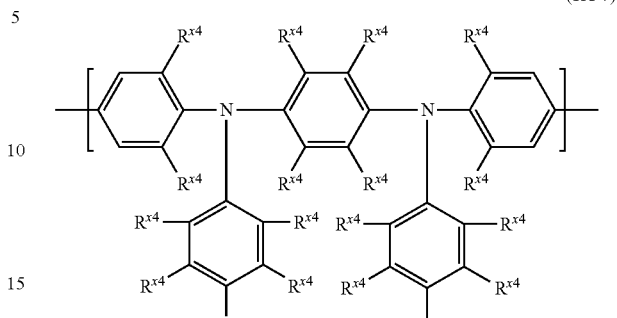
(1X-7)
[Chemical Formula 35]
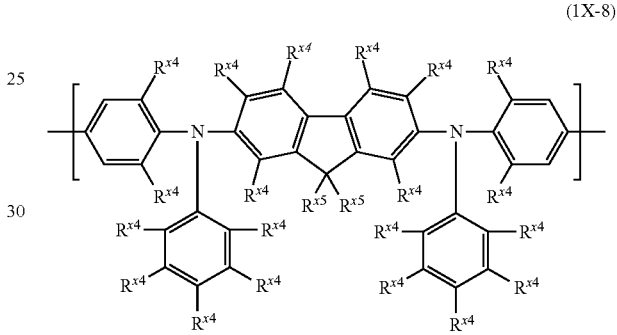
(1X-8)
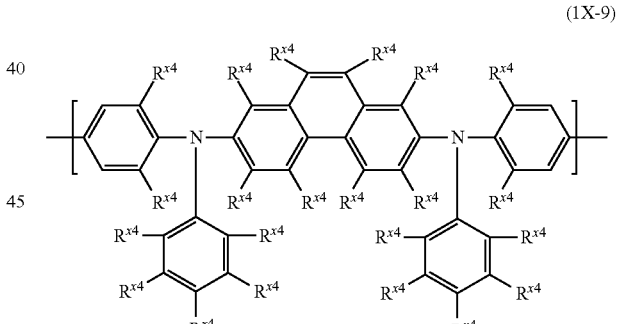
(1X-9)
[Chemical Formula 36]
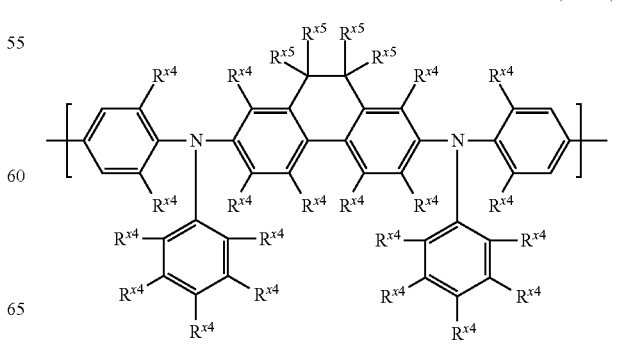
(1X-10)

(1X-11)

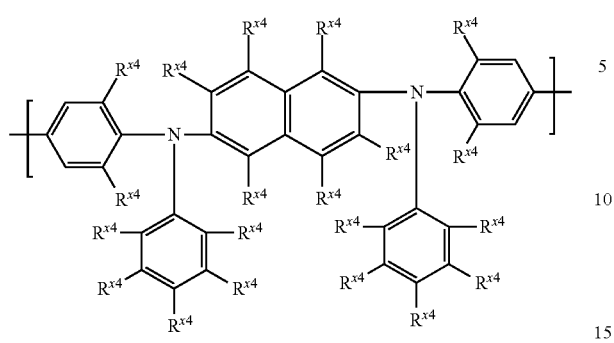

wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, the foregoing groups each optionally having a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The content of the constitutional unit represented by the formula (1X) is preferably 1 to 80 mol %, more preferably 1 to 60 mol %, further preferably 1 to 50 mol %, with respect to the total content of constitutional units contained in the polymer compound, because a light emitting device using the polymer compound of the present invention is more excellent in external quantum yield.

The constitutional unit represented by the formula (1X) includes, for example, constitutional units represented by the formulae (11X-1) to (11X-28), preferably constitutional units represented by the formulae (11X-1) to (11X-18).

[Chemical Formula 37]

(11X-1)

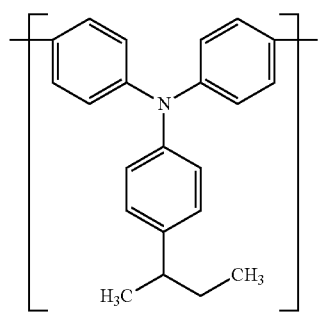

(11X-2)

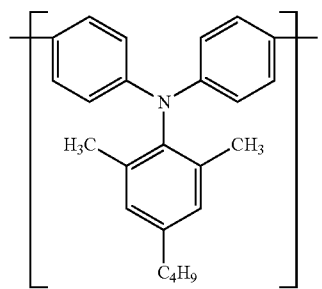

(11X-3)

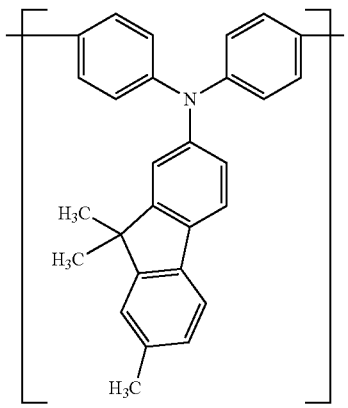

(11X-4)

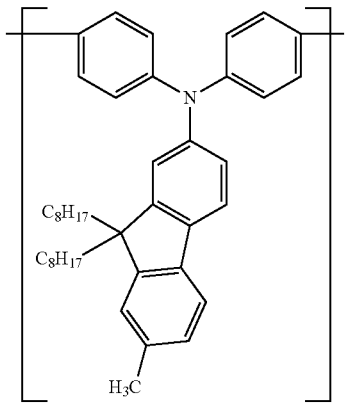

(11X-5)

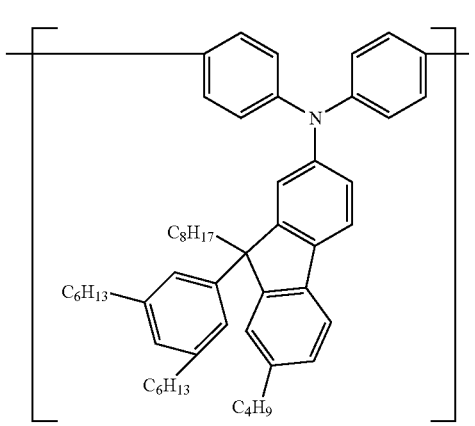

(11X-6)

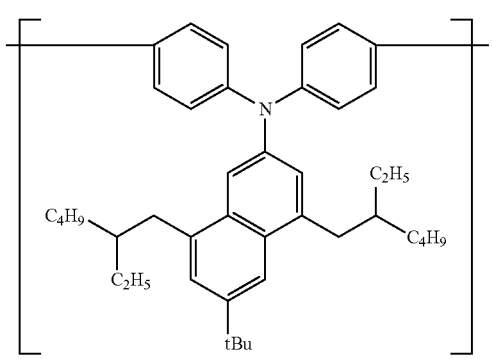

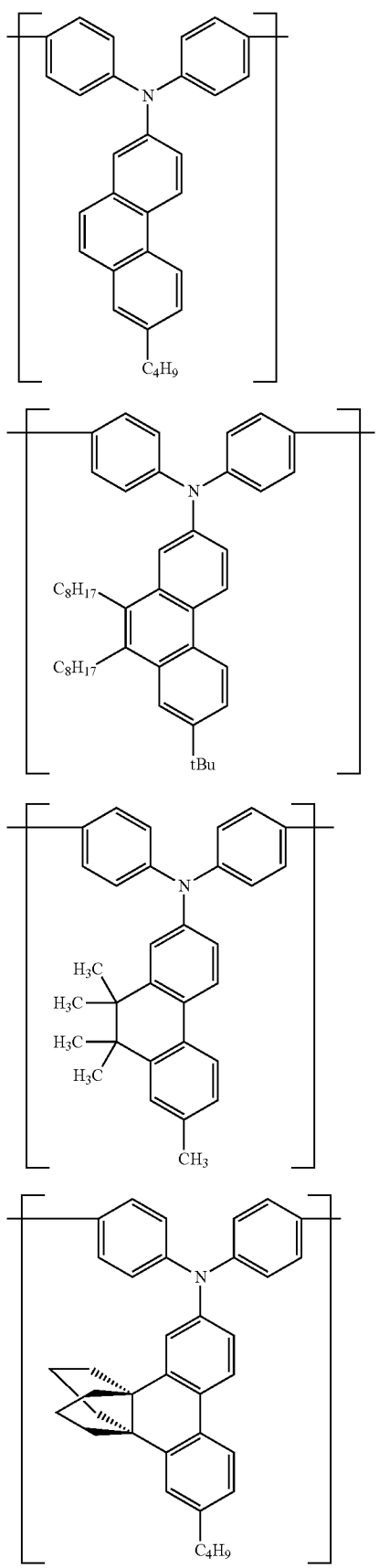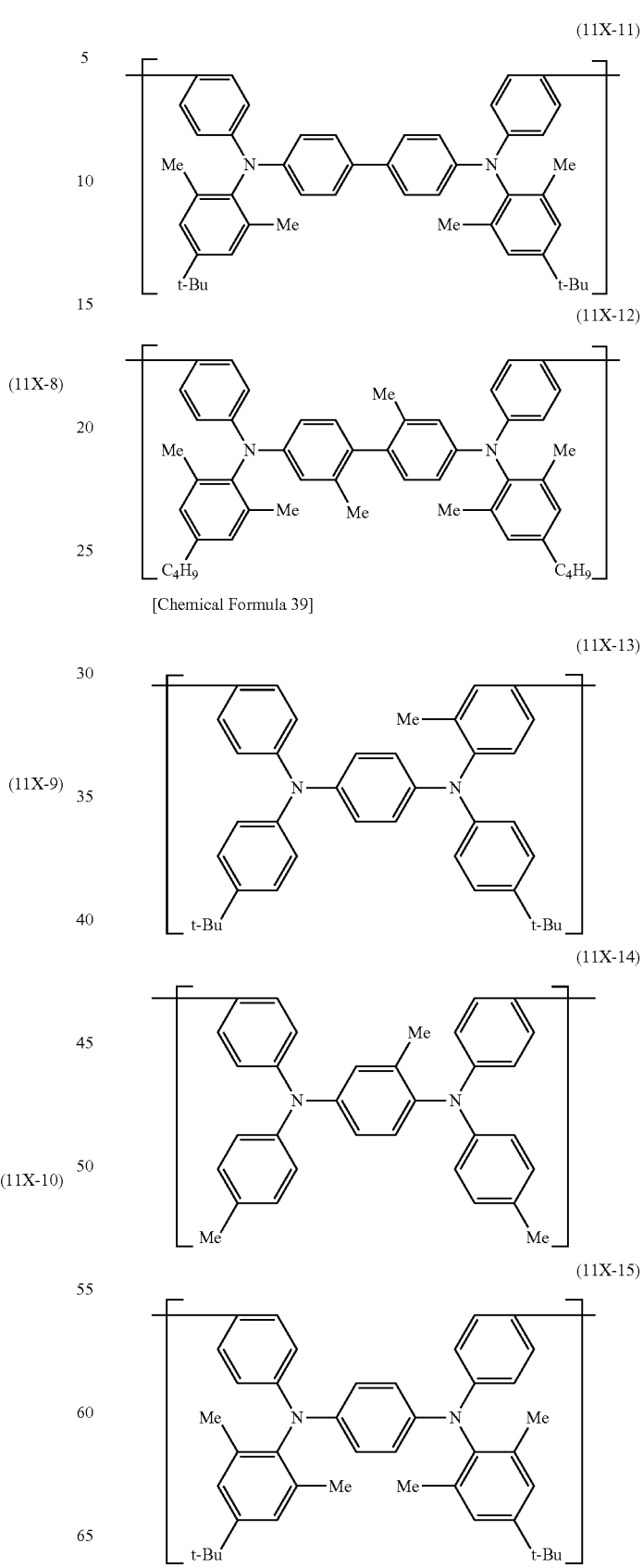

[Chemical Formula 40]

(11X-16)

(11X-17)

[Chemical Formula 41]

(11X-18)

(11X-19)

[Chemical Formula 42]

(11X-20)

(11X-21)

[Chemical Formula 43]

(11X-22)

(11X-23)

-continued (11X-24)
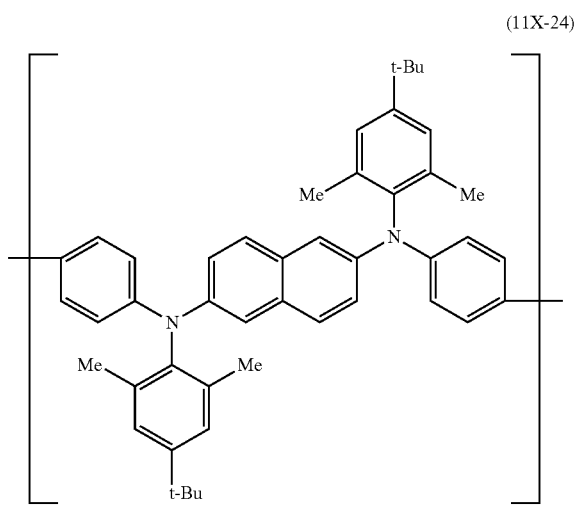

(11X-25)
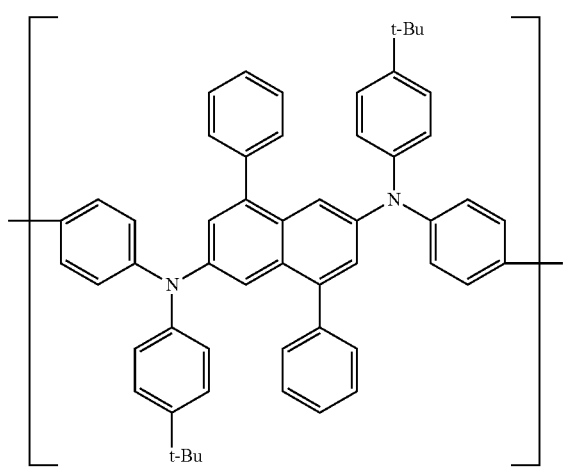

[Chemical Formula 45]

(11X-26)
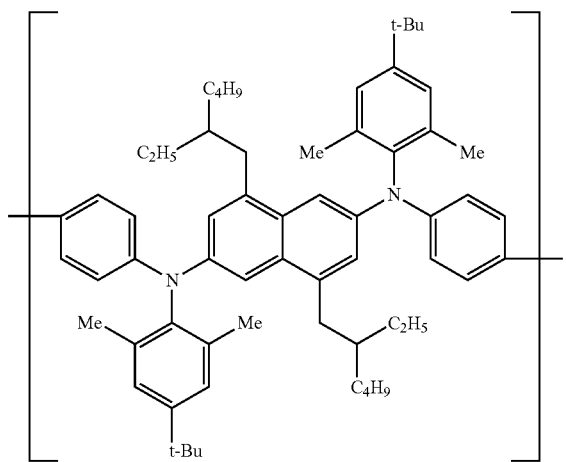

(11X-27)
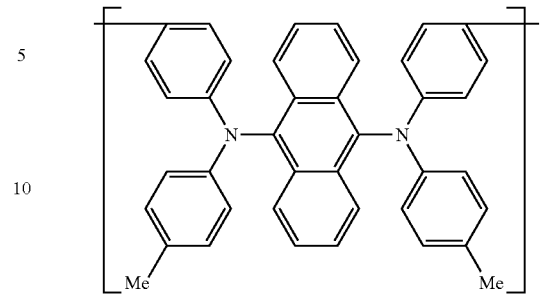

(11X-28)
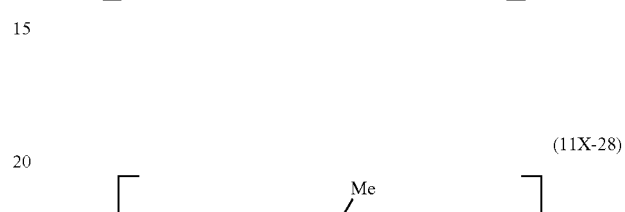

The constitutional unit represented by the formula (1X) may be contained only singly or two or more units thereof may be contained in the polymer compound of the present invention.

[Constitutional Unit Represented by the Formula (1Z)]

$R^{Z1}$ is preferably an alkyl group, a cycloalkyl group, an aryl group or a monovalent heterocyclic group, more preferably an aryl group, because a light emitting device using the polymer compound of the present invention is more excellent in external quantum yield, the foregoing groups each optionally having a substituent.

1z is preferably 0 or 1, more preferably 0, because a light emitting device using the polymer compound of the present invention is more excellent in external quantum yield.

$R^{Z2}$ is preferably an alkyl group, a cycloalkyl group or an aryl group, more preferably an alkyl group, because synthesis of the polymer compound of the present invention is easy, the foregoing groups each optionally having a substituent.

$X^{Z1}$ is preferably a single bond, an oxygen atom, a group represented by —$CR^{Z11}R^{Z12}$— or a group represented by —$SiR^{Z13}R^{Z14}$—, more preferably a single bond, an oxygen atom or a group represented by $CR^{Z11}R^{Z12}$—, because a light emitting device using the polymer compound of the present invention is more excellent in external quantum yield. $R^{Z11}$, $R^{Z12}$, $R^{Z13}$ and $R^{Z14}$ represent preferably an alkyl group, a cycloalkyl group or an aryl group, more preferably an alkyl group or an aryl group.

The constitutional unit represented by the formula (1Z) is preferably a constitutional unit represented by the formulae (1Z-1) to (1Z-5).

[Chemical Formula 46]

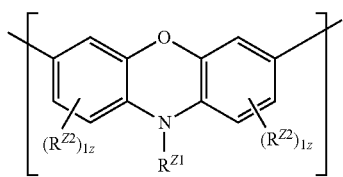
(1Z-1)

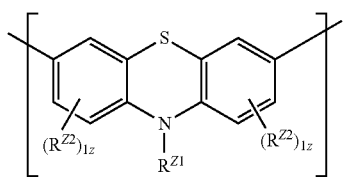
(1Z-2)

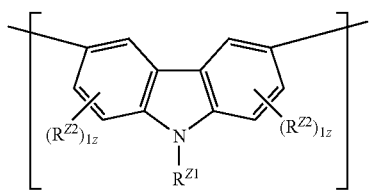
(1Z-3)

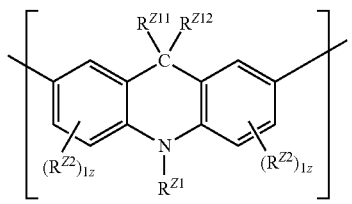
(1Z-4)

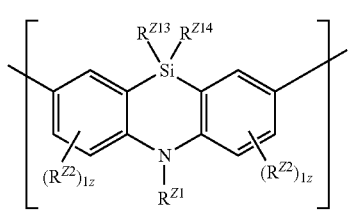
(1Z-5)

[wherein, $R^{Z1}$, 1z, $R^{Z2}$, $R^{Z11}$, $R^{Z12}$, $R^{Z13}$, and $R^{Z14}$ are as defined above.].

The content of the constitutional unit represented by the formula (1Z) is preferably 0.1 to 99.8 mol %, more preferably 0.1 to 60 mol %, further preferably 0.1 to 50 mol %, with respect to the total content of constitutional units contained in the polymer compound, because a light emitting device using the polymer compound of the present invention is more excellent in external quantum yield.

The constitutional unit represented by the formula (1Z) includes, for example, constitutional units represented by the formula (11Z-1) to (11Z-9), preferably, constitutional units represented by the formula (11Z-1) to (11Z-5).

[Chemical Formula 47]

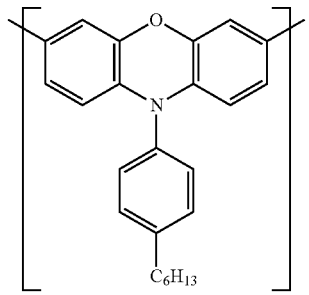
(11Z-1)

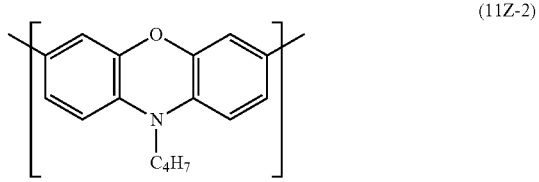
(11Z-2)

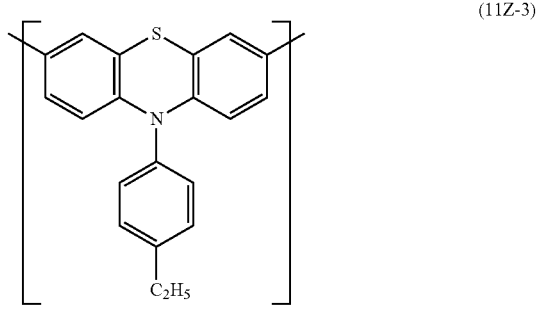
(11Z-3)

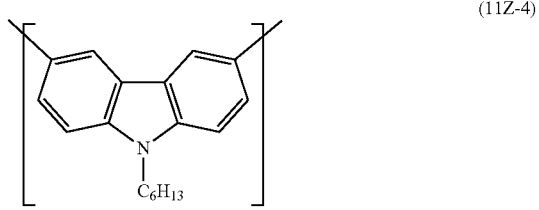
(11Z-4)

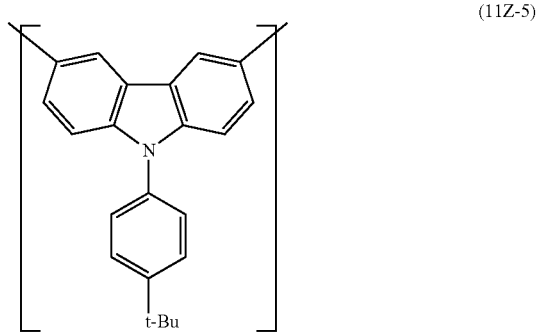
(11Z-5)

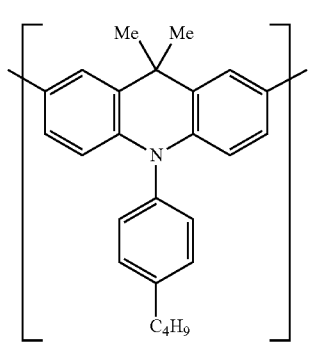
(11Z-6)

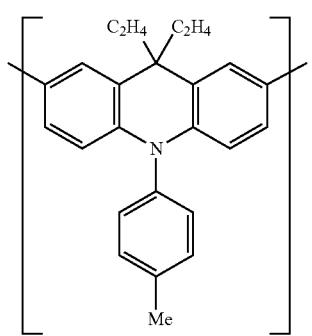
(11Z-7)

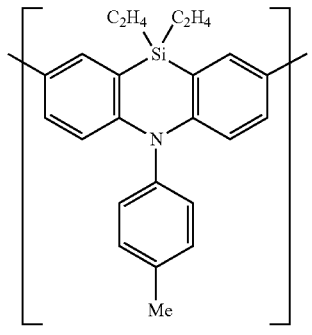
(11Z-8)

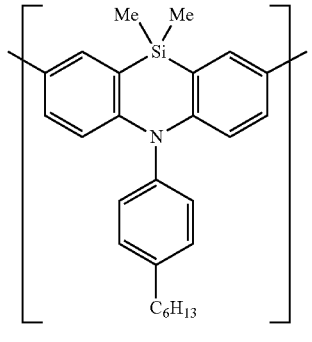
(11Z-9)

The constitutional unit represented by the formula (1Z) may be contained only singly or two or more units thereof may be contained in the polymer compound of the present invention.

[Constitutional Chain, Molar Ratio and the Like of the Constitutional Unit Represented by the Formula (1), the Constitutional Unit Represented by the Formula (1X) and the Constitutional Unit Represented by the Formula (1Z)]

In the polymer compound of the present invention, it is preferable that a constitutional unit represented by the formula (1) and at least one constitutional unit selected from the group consisting of the constitutional unit represented by the formula (1X) and the constitutional unit represented by the formula (1Z) comprise an adjacent constitutional chain, it is more preferable that the constitutional unit represented by the formula (1) and the constitutional unit represented by the formula (1X) contain an adjacent constitutional chain, because a light emitting device using the polymer compound of the present invention is more excellent in external quantum yield.

In the polymer compound of the present invention, the total content of the constitutional unit represented by the formula (1), the constitutional unit represented by the formula (1X) and the constitutional unit represented by the formula (1Z) is preferably 40 to 100 mol %, with respect to the total content of constitutional units contained in the polymer compound, because hole transportability is excellent.

[Crosslinkable Constitutional Unit]

The polymer compound of the present invention is preferably a polymer compound further comprising a crosslinkable constitutional unit having at least one crosslinkable group selected from Group A of crosslinkable groups, because the polymer compound of the present invention is excellent in crosslinkability.

The crosslinkable group selected from Group A of crosslinkable groups is preferably a crosslinkable group represented by the formula (XL-1), (XL-3), (XL-5), (XL-7), (XL-16) or (XL-17), preferably a crosslinkable group represented by the formula (XL-1) or the formula (XL-17), because the polymer compound of the present invention is excellent in crosslinkability. The constitutional unit having at least one crosslinkable group selected from Group A of crosslinkable groups is preferably a constitutional unit represented by the formula (5) or a constitutional unit represented by the formula (5') described later and may also be a constitutional unit shown below.

[Chemical Formula 48]

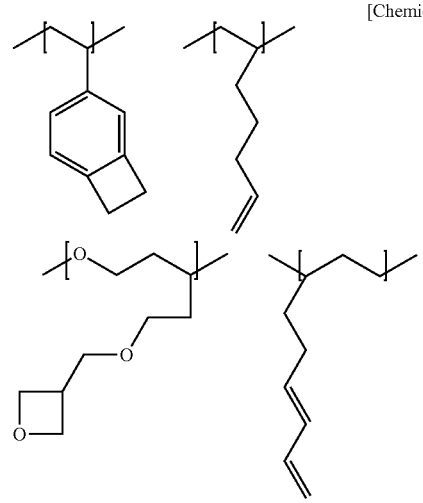

The constitutional unit having at least one crosslinkable group selected from Group A of crosslinkable groups is preferably a constitutional unit represented by the formula (5) or a constitutional unit represented by the formula (5'), because a light emitting device using the polymer compound of the present invention is more excellent in external quantum yield. The constitutional unit represented by the formula (5') is different from the constitutional unit represented by the formula (1), the constitutional unit represented by the formula (1X) and the constitutional unit represented by the formula (1Z).

[Constitutional Unit Represented by the Formula (5)]

nA is preferably 0 or 1, more preferably 0, because a light emitting device using the polymer compound of the present invention is excellent in luminance life.

n is preferably 2, because a light emitting device using the polymer compound of the present invention is excellent in luminance life.

$Ar^1$ is preferably an aromatic hydrocarbon group optionally having a substituent, because a light emitting device using the polymer compound of the present invention is excellent in luminance life.

The number of carbon atoms of the aromatic hydrocarbon group represented by $Ar^1$ is usually 6 to 60, preferably 6 to 30, more preferably 6 to 18, not including the number of carbon atoms of a substituent.

The arylene group portion obtained by removing n substituents of the aromatic hydrocarbon group represented by $Ar^1$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), the foregoing groups each optionally having a substituent.

The number of carbon atoms of the heterocyclic group represented by $Ar^1$ is usually 6 to 60, preferably 6 to 30, more preferably 6 to 18, not including the number of carbon atoms of a substituent.

The divalent heterocyclic group portion obtained by removing n substituents of the heterocyclic group represented by $Ar^1$ is preferably a group represented by the formula (AA-1) to the formula (AA-34).

The aromatic hydrocarbon group and the heterocyclic group represented by $Ar^1$ optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The number of carbon atoms of the alkylene group represented by $L^A$ is usually 1 to 10, preferably 1 to 5, more preferably 1 to 3, not including the number of carbon atoms of a substituent. The number of carbon atoms of the cycloalkylene group represented by $L^A$ is usually 3 to 10, not including the number of carbon atoms of a substituent.

The alkylene group and the cycloalkylene group optionally have a substituent, and include, for example, a methylene group, an ethylene group, a propylene group, a butylene group, a hexylene group, a cyclohexylene group and an octylene group.

The alkylene group and the cycloalkylene group represented by $L^A$ optionally have a substituent. The substituent which the alkylene group and the cycloalkylene group optionally have includes, for example, an alkyl group, a cycloalkyl group, an alkoxy group, a cycloalkoxy group, a halogen atom and a cyano group.

The arylene group represented by $L^A$ optionally has a substituent. The arylene group includes o-phenylene, m-phenylene and p-phenylene. The substituent which the aryl group optionally has includes, for example, an alkyl group, a cycloalkyl group, an alkoxy group, a cycloalkoxy group, an aryl group, an aryloxy group, a monovalent heterocyclic group, a halogen atom, a cyano group and a crosslinkable group selected from Group A of crosslinkable groups.

$L^A$ is preferably a phenylene group or an alkylene group because production of the polymer compound of the present invention is easy, the foregoing groups each optionally having a substituent.

The crosslinkable group represented by X is preferably a crosslinkable group represented by the formula (XL-1), (XL-3), (XL-5), (XL-7), (XL-16) or (XL-17), more preferably a crosslinkable group represented by the formula (XL-1) or the formula (XL-17), because the polymer compound of the present invention is excellent in crosslinkability.

The content of a constitutional unit represented by the formula (5) is preferably 0.5 to 50 mol %, more preferably 3 to 30 mol %, further preferably 3 to 20 mol %, with respect to the total content of constitutional units contained in the polymer compound, because the polymer compound of the present invention is excellent in stability and crosslinkability.

The constitutional unit represented by the formula (5) may be contained only singly or two or more units thereof may be contained in the polymer compound of the present invention.

[Constitutional Unit Represented by the Formula (5')]

mA is preferably 0 or 1, more preferably 0, because a light emitting device using the polymer compound of the present invention is excellent in luminance life.

m is preferably 2, because a light emitting device using the polymer compound of the present invention is excellent in luminance life.

c is preferably 0, because production of the polymer compound of the present invention is easy and because a light emitting device using the polymer compound of the present invention is excellent in luminance life.

$Ar^3$ is preferably an aromatic hydrocarbon group optionally having a substituent, because a light emitting device using the polymer compound of the present invention is excellent in luminance life.

The definition and examples of the arylene group portion obtained by removing m substituent of the aromatic hydrocarbon group represented by $Ar^3$ are the same as the definition and examples of the arylene group represented by $Ar^{X2}$ in the formula (1X).

The definition and examples of the divalent heterocyclic group portion obtained by removing m substituents of the heterocyclic group represented by $Ar^3$ are the same as the definition and examples of the divalent heterocyclic group portion represented by $Ar^{X2}$ in the formula (1X).

The definition and examples of the divalent group obtained by removing m substituents of the group in which at least one type of aromatic hydrocarbon ring and at least one type of heterocyclic ring are bonded directly represented by $Ar^3$ are the same as the definition and examples of the divalent group in which at least one type of arylene group and at least one type of divalent heterocyclic group are bonded directly represented by $Ar^{X2}$ in the formula (1X).

$Ar^2$ and $Ar^4$ represent preferably an arylene group optionally having a substituent, because a light emitting device using the polymer compound of the present invention is excellent in luminance life.

The definition and examples of the arylene group represented by $Ar^2$ and $Ar^4$ are the same as the definition and examples of the arylene group represented by $Ar^{X1}$ and $Ar^{X3}$ in the formula (1X).

The definition and examples of the divalent heterocyclic group represented by $Ar^2$ and $Ar^4$ are the same as the definition and examples of the divalent heterocyclic group represented by $Ar^{X1}$ and $Ar^{X3}$ in the formula (1X).

The group represented by $Ar^2$, $Ar^3$ and $Ar^4$ optionally has a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The definitions and examples of the alkylene group, the cycloalkylene group, the arylene group and the divalent heterocyclic group represented by $K^A$ are the same as the definitions and examples of the alkylene group, the cycloalkylene group, the arylene group and the divalent heterocyclic group represented by $L^A$.

$K^A$ is preferably a phenylene group or a methylene group, because synthesis of the polymer compound of the present invention is easy.

The crosslinkable group represented by X' is preferably a crosslinkable group represented by the formula (XL-1), (XL-3), (XL-5), (XL-7), (XL-16) or (XL-17), more preferably a crosslinkable group represented by the formula (XL-1) or the formula (XL-17), because the polymer compound of the present invention is excellent in crosslinkability.

The content of the constitutional unit represented by the formula (5') is preferably 0.5 to 50 mol %, more preferably 3 to 30 mol %, further preferably 3 to 20 mol %, with respect to the total content of constitutional units contained in the polymer compound, because the polymer compound of the present invention is excellent in stability and crosslinkability.

The constitutional unit represented by the formula (5') may be contained only singly or two or more units thereof may be contained in the polymer compound of the present invention.

[Preferable Embodiment of Constitutional Unit Represented by the Formula (5) or (5')]

The constitutional unit represented by the formula (5) includes, for example, constitutional units represented by the formula (5-1) to the formula (5-30), and the constitutional unit represented by the formula (5') includes, for example, constitutional units represented by the formula (5'-1) to the formula (5'-9). Of them, constitutional units represented by the formula (5-1) to the formula (5-30) are preferable, constitutional units represented by the formula (5-1) to the formula (5-15), the formula (5-19), the formula (5-20), the formula (5-23), the formula (5-25) or the formula (5-30) are more preferable, constitutional units represented by the formula (5-1) to the formula (5-9) or the formula (5-30) are further preferable, because the polymer compound of the present invention is excellent in crosslinkability.

[Chemical Formula 49]

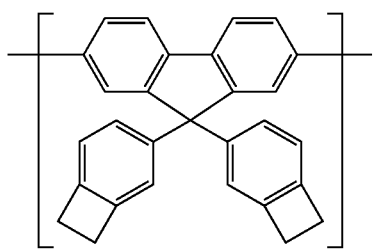

(5-1)

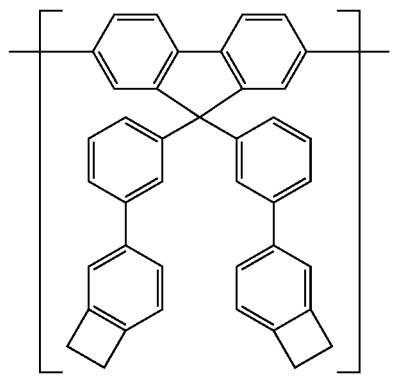

(5-2)

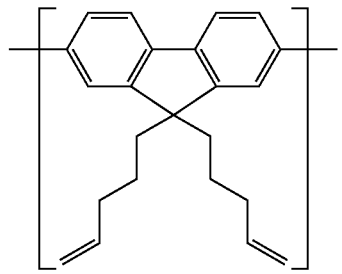

(5-3)

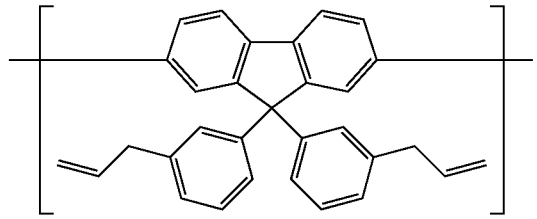

(5-4)

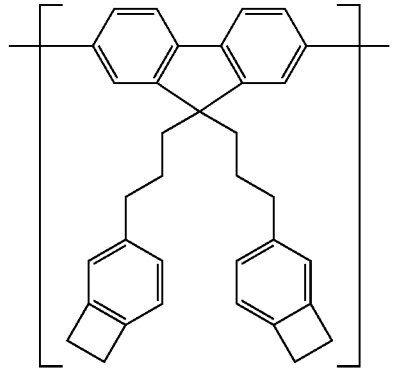

(5-5)

(5-6) 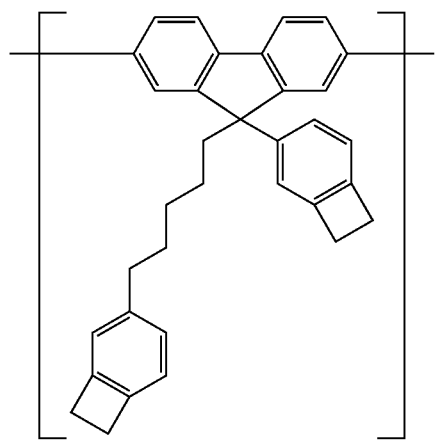
(5-7) 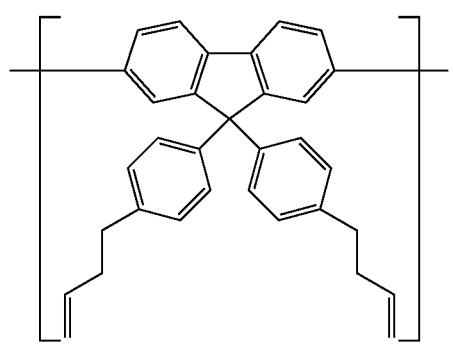
(5-8) 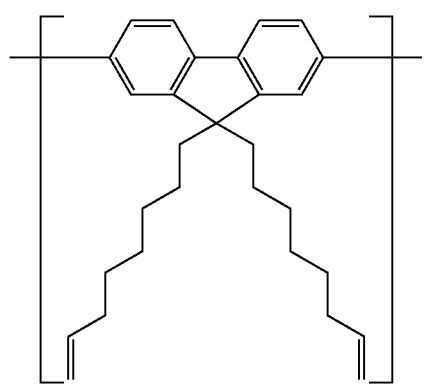
(5-9) 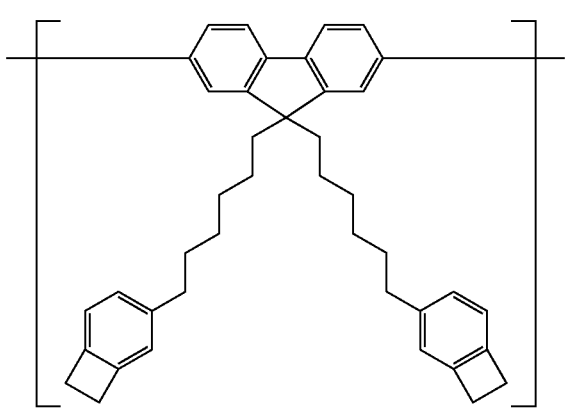
(5-10) 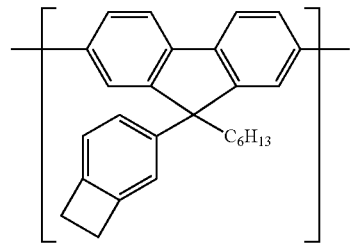
(5-11) 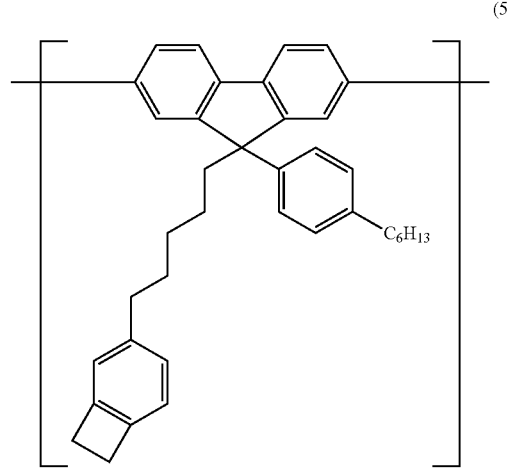
(5-12) 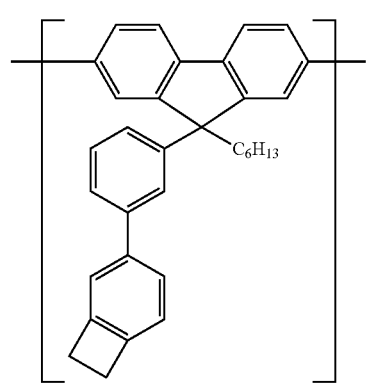
(5-13) 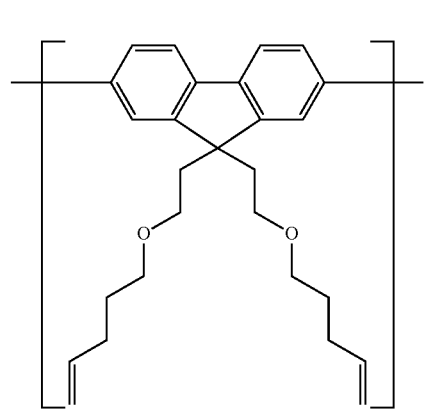

-continued
(5-14)
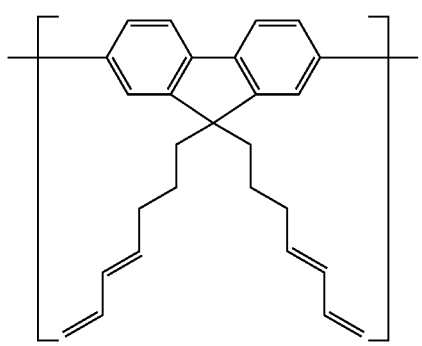
(5-18)
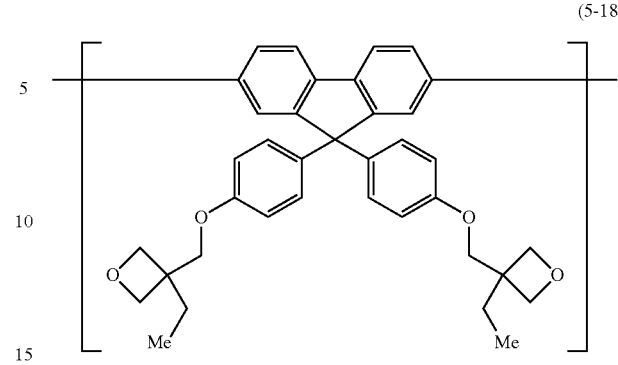
(5-15)
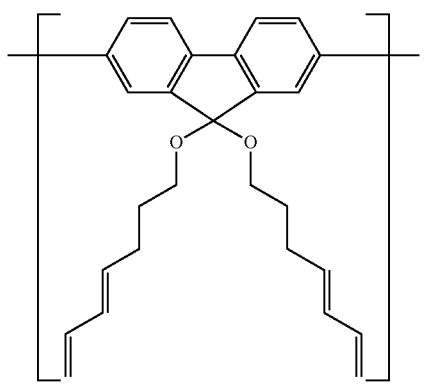
(5-19)
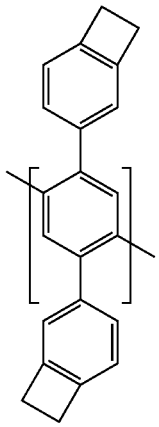
[Chemical Formula 50]
(5-16)
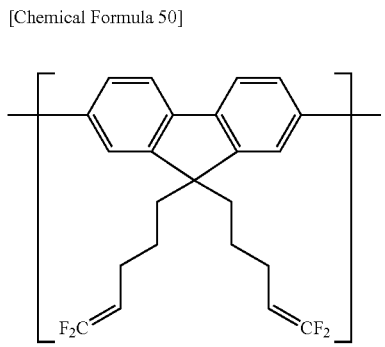
(5-20)
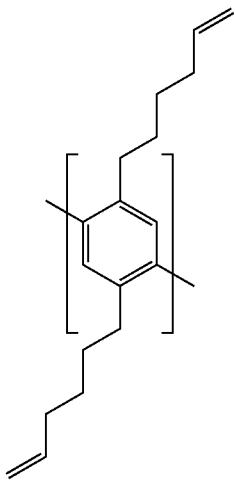
(5-17)
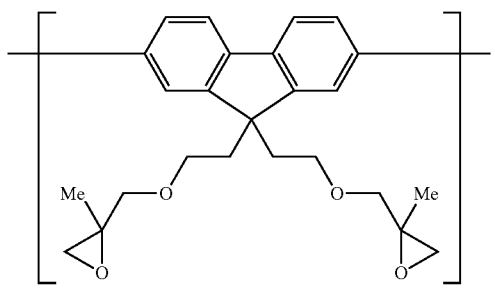
(5-21)
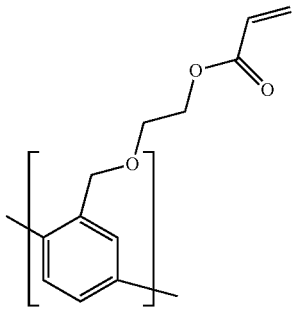

(5-22)
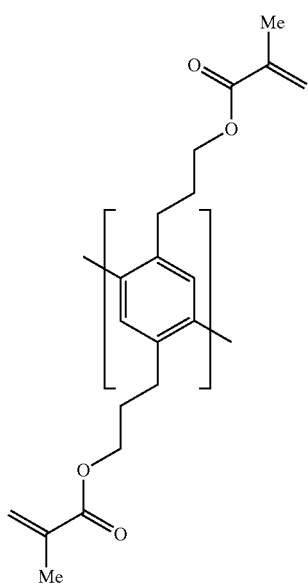
(5-23)
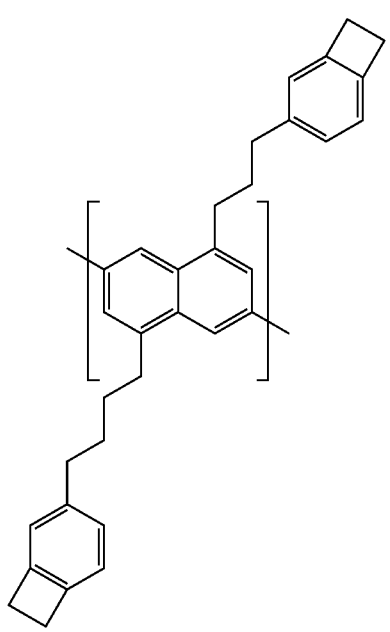
(5-24)
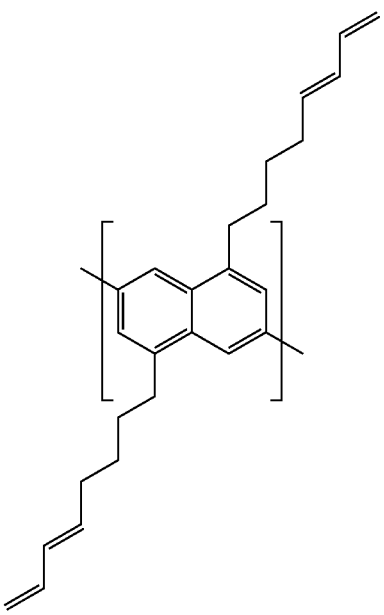
(5-25)
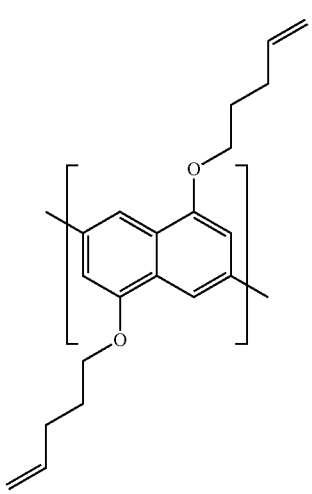

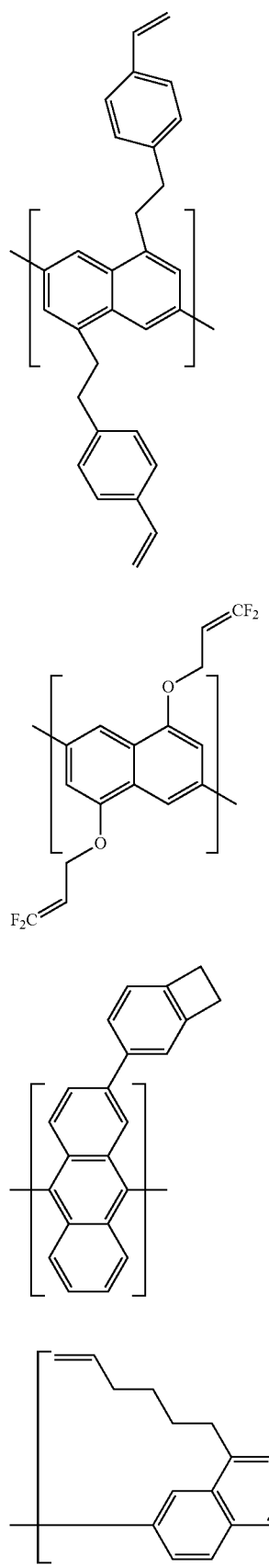
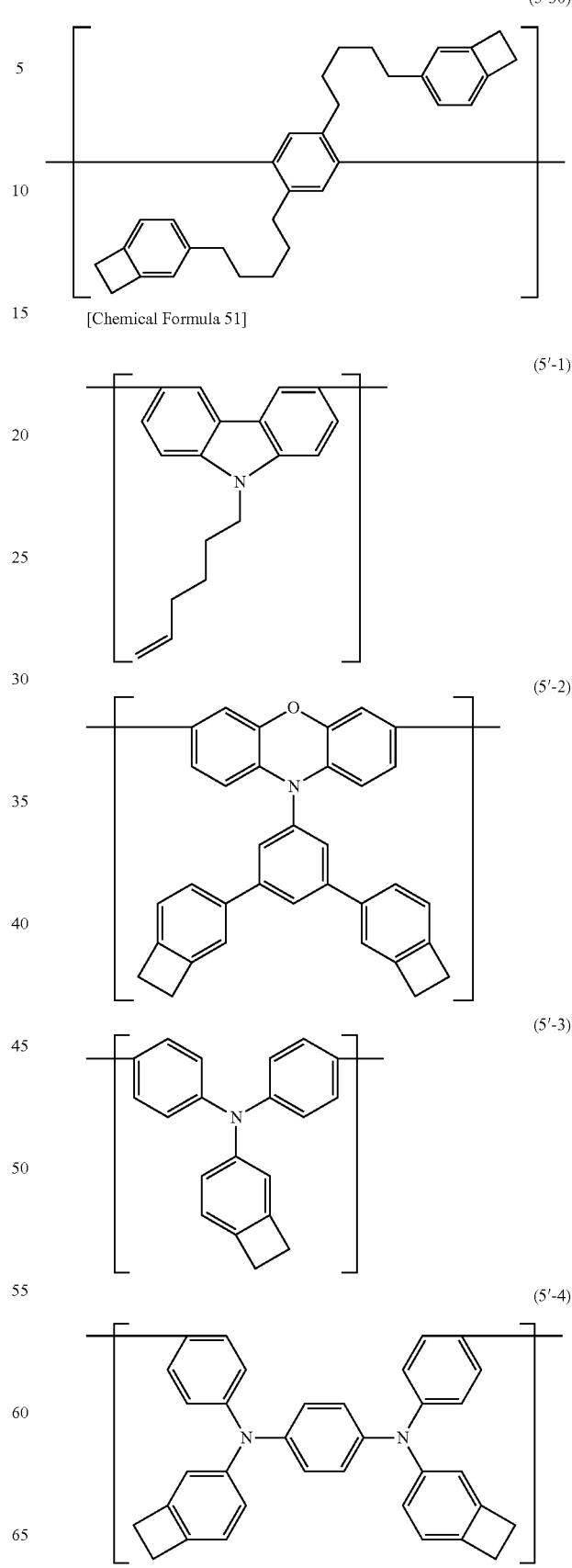
[Chemical Formula 51]

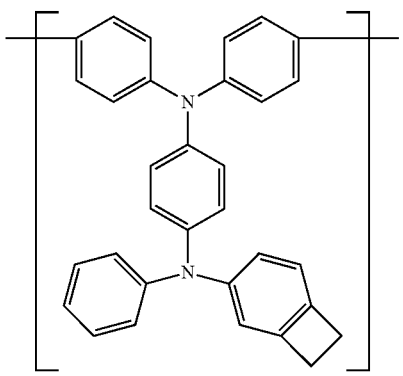

(5'-5)

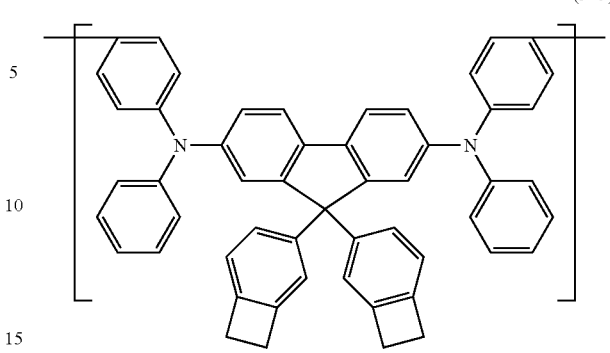

(5'-9)

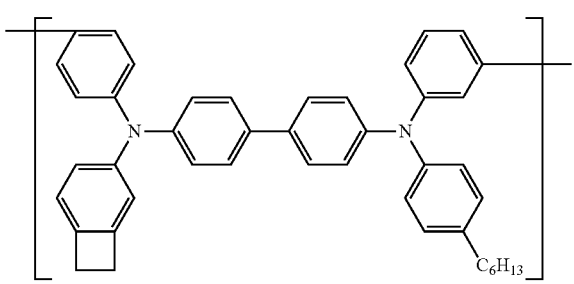

(5'-6)

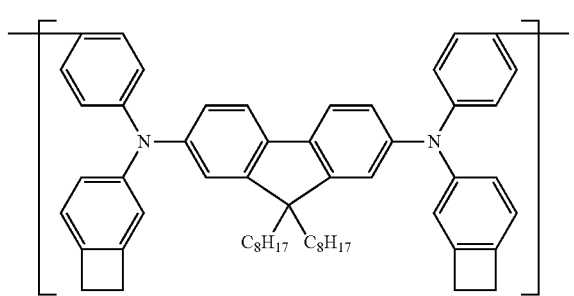

(5'-7)

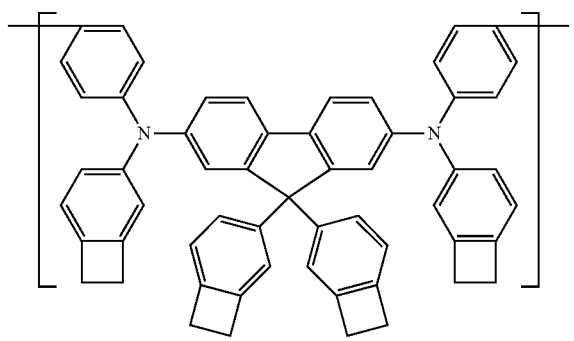

(5'-8)

[Other Constitutional Units]

The polymer compound of the present invention may further comprise a constitutional unit represented by the formula (Y) shown below. The constitutional unit represented by the formula (Y) is different from the constitutional unit represented by the formula (1Z).

$$-\!\!+\!\!Ar^{Y1}\!\!+\!\!-(Y)$$  [Chemical Formula 52]

[wherein, $Ar^{Y1}$ represents an arylene group, a divalent heterocyclic ring group or a divalent group in which at least one type of arylene group and at least one type of divalent heterocyclic ring group are bonded directly to each other, the foregoing groups each optionally having a substituent.].

The arylene group represented by $Ar^{Y1}$ is more preferably a group represented by the formula (A-1), the formula (A-6), the formula (A-7), the formula (A-9) to (A-11), the formula (A-13) or the formula (A-19), further preferably a group represented by the formula (A-1), the formula (A-7), the formula (A-9) or the formula (A-19), the foregoing groups each optionally having a substituent.

The divalent heterocyclic group represented by $Ar^{Y1}$ is more preferably a group represented by the formula (B-4), the formula (B-13) or the formula (B-15), further preferably a group represented by the formula (B-4), the foregoing groups each optionally having a substituent.

The more preferable range and the further preferable range of the arylene group and the divalent heterocyclic group in the divalent group in which at least one type of arylene group and at least one type of divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

The divalent group in which at least one type of arylene group and at least one type of divalent heterocyclic group are bonded directly to each other represented by $Ar^{Y1}$ includes the same groups as the divalent group in which at least one type of arylene group and at least one type of divalent heterocyclic group are bonded directly to each other represented by $Ar^{X2}$ and $Ar^{X4}$ in the formula (X).

The substituent which the group represented by $Ar^{Y1}$ optionally has is preferably an alkyl group, a cycloalkyl group or an aryl group, the foregoing groups each optionally further having a substituent.

The constitutional unit represented by the formula (Y) includes, for example, constitutional units represented by the formulae (Y-1) to (Y-4), and from the standpoint of the luminance life of a light emitting device produced by using the polymer compound of the present invention preferable is a constitutional unit represented by the formula (Y-1) or (Y-2), from the standpoint of electron transportability preferable is a constitutional unit represented by the formula (Y-3) or (Y-4).

[Chemical Formula 53]

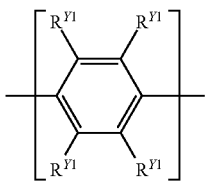

(Y-1)

[wherein, $R^{Y1}$ represents a hydrogen atom, an alkyl group, a cycloalkyl group, an alkoxy group, a cycloalkoxy group, an aryl group or a monovalent heterocyclic group, the foregoing groups each optionally having a substituent. The plurality of $R^{Y1}$ may be the same or different, and adjacent groups $R^{Y1}$ may be combined together to form a ring together with the carbon atoms to which they are attached.]

$R^{Y1}$ is preferably a hydrogen atom, an alkyl group or a cycloalkyl group the foregoing groups each optionally having a substituent.

[Chemical Formula 54]

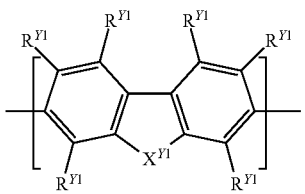

(Y-2)

[wherein, $R^{Y1}$ is as defined above. $X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, an alkyl group, a cycloalkyl group, an alkoxyl group, a cycloalkoxy group, an aryl group or a monovalent heterocyclic group, the foregoing groups each optionally having a substituent. The plurality of $R^{Y2}$ may be the same or different, and $R^{Y2}$s may be combined together to form a ring together with the carbon atoms to which they are attached.].

$R^{Y2}$ is preferably an alkyl group, a cycloalkyl group, an aryl group or a monovalent heterocyclic group, more preferably an alkyl group a cycloalkyl group or an aryl group, the foregoing groups each optionally having a substituent.

Regarding the combination of two $R^{Y2}$s in the group represented by —C($R^{Y2}$)$_2$— in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, the foregoing groups each optionally having a substituent. The two groups $R^{Y2}$ may be combined together to form a ring together with the atoms to which they are attached, and when the groups $R^{Y2}$ form a ring, the group represented by —C($R^{Y2}$)$_2$— is preferably a group represented by the formula (Y-A1) to (Y-A5), more preferably a group represented by the formula (Y-A4), the foregoing groups each optionally having a substituent.

[Chemical Formula 55]

(Y-A1)

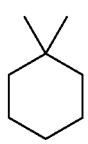

(Y-A2)

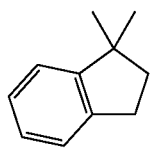

(Y-A3)

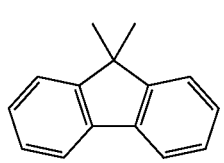

(Y-A4)

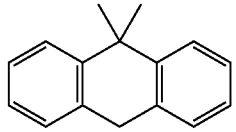

(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, the foregoing groups each optionally having a substituent.

Four $R^{Y2}$s in the group represented by —C($R^{Y2}$)$_2$—C($R^{Y2}$)$_2$— in $X^{Y1}$ are preferably an alkyl group or a cycloalkyl group optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), the foregoing groups each optionally having a substituent.

[Chemical Formula 56]

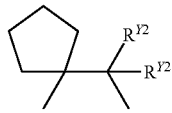

(Y-B1)

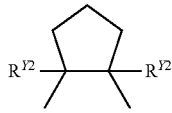

(Y-B2)

(Y-B3) 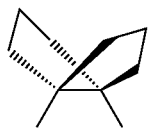

(Y-B4) 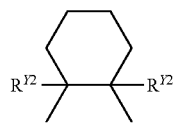

(Y-B5) 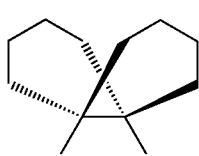

[wherein, $R^{Y2}$ is as defined above.]

[Chemical Formula 57]

(Y-3) 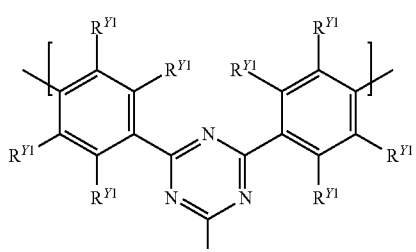

(Y-4) 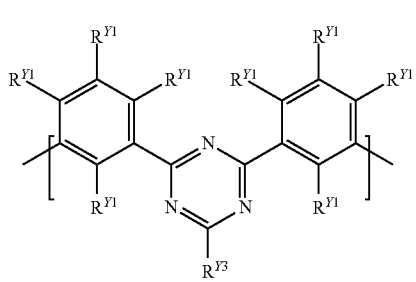

[wherein, $R^{Y1}$ is as defined above. $R^{Y3}$ represents a hydrogen atom, an alkyl group, a cycloalkyl group, an alkoxy group, a cycloalkoxy group, an aryl group or a monovalent heterocyclic group, the foregoing groups each optionally having a substituent.]

$R^{Y3}$ is preferably an alkyl group, a cycloalkyl group, an alkoxy group, a cycloalkoxy group, an aryl group or a monovalent heterocyclic group, more preferably an aryl group, the foregoing groups each optionally having a substituent.

The constitutional unit represented by the formula (Y) includes, for example, constitutional units represented by the formulae (Y-11) to (Y-51).

[Chemical Formula 58]

(Y-11) 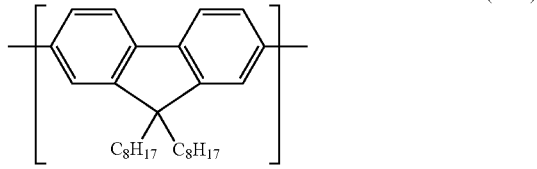

(Y-12) 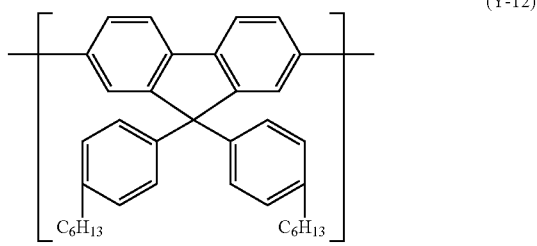

(Y-13) 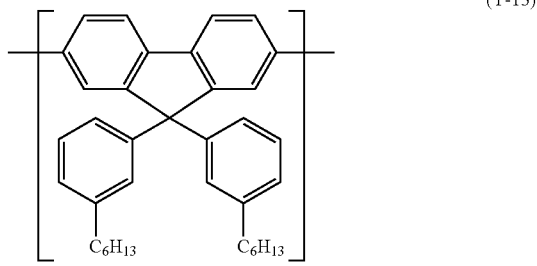

[Chemical Formula 59]

(Y-14) 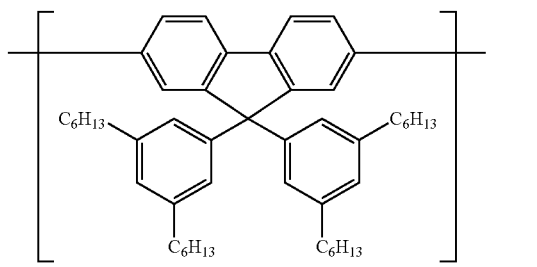

(Y-15) 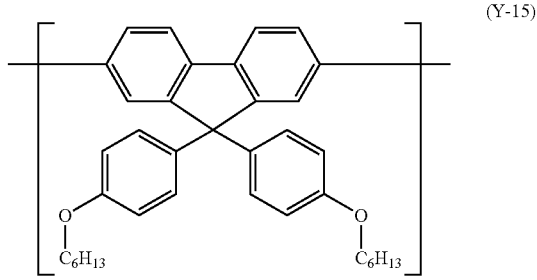

(Y-16) 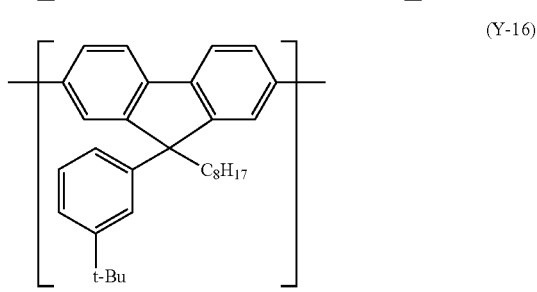

[Chemical Formula 60]
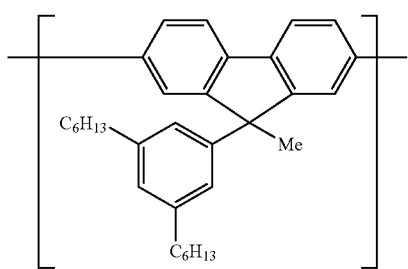 (Y-17)
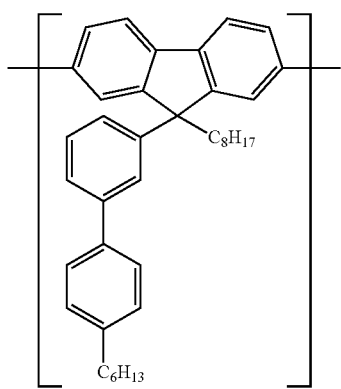 (Y-18)
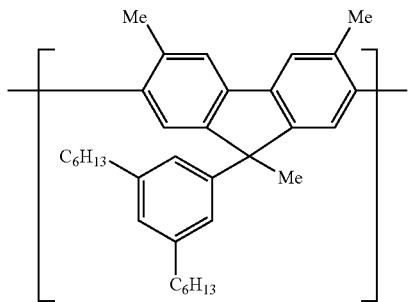 (Y-19)
[Chemical Formula 61]
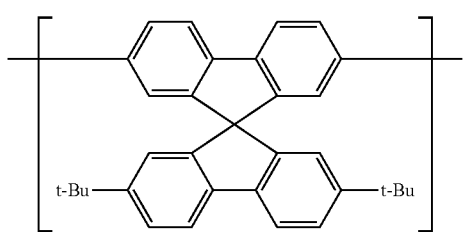 (Y-20)
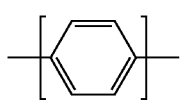 (Y-21)
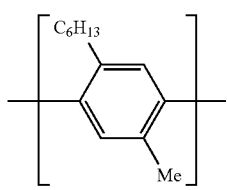 (Y-22)
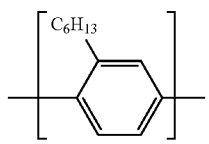 (Y-23)
[Chemical Formula 62]
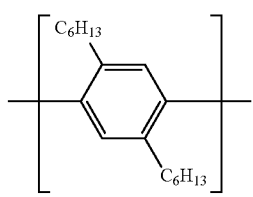 (Y-24)
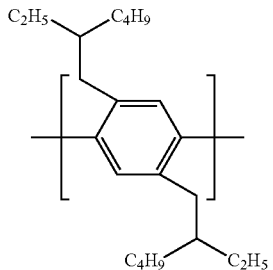 (Y-25)
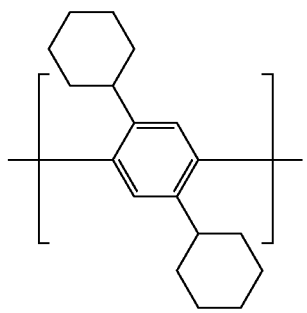 (Y-26)
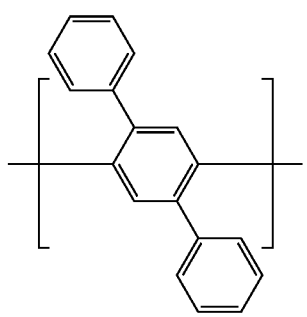 (Y-27)
[Chemical Formula 63]
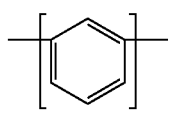 (Y-28)
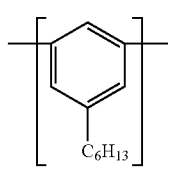 (Y-29)

-continued
(Y-30)
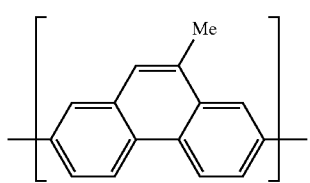
(Y-31)
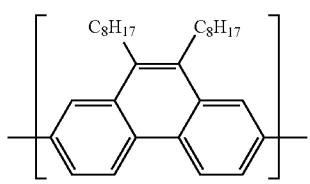
[Chemical Formula 64]
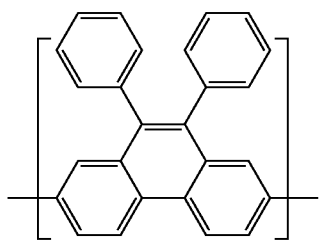
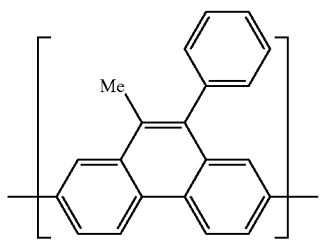
(Y-34)
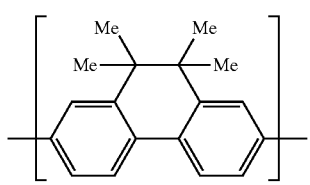
(Y-35)
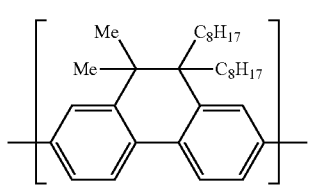
-continued
[Chemical Formula 65]
(Y-36)
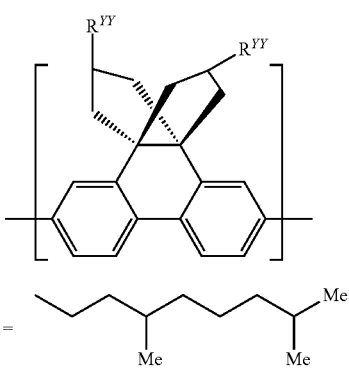
(Y-37)
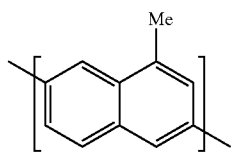
(Y-38)
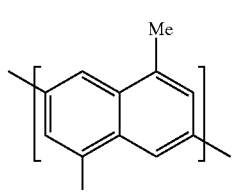
(Y-39)
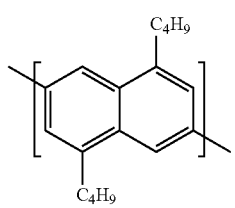
[Chemical Formula 66]
(Y-40)
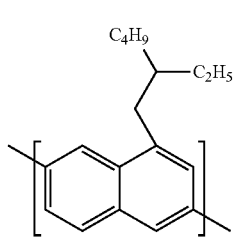
(Y-41)
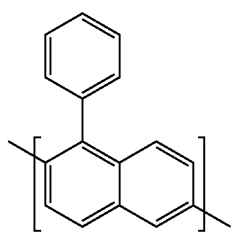

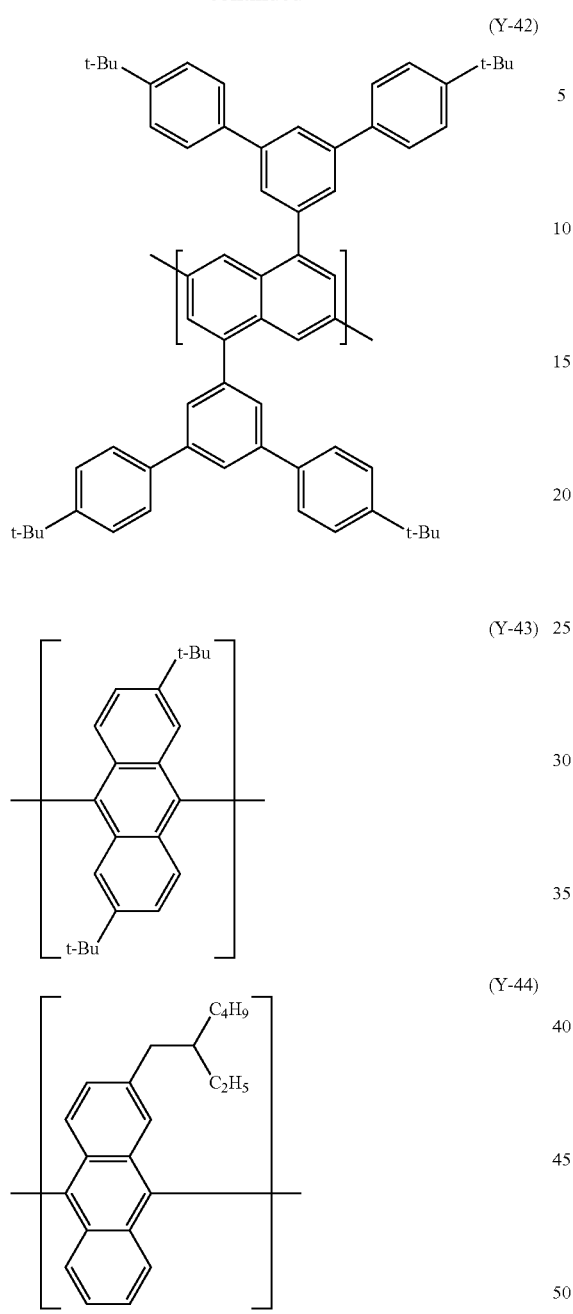
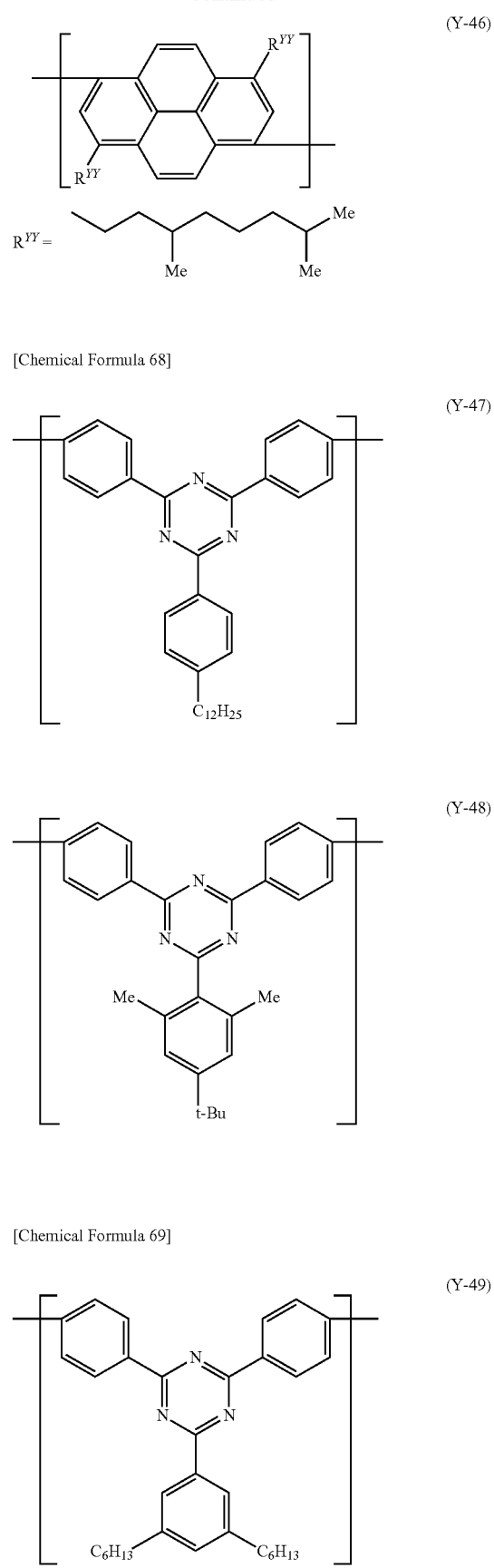

-continued

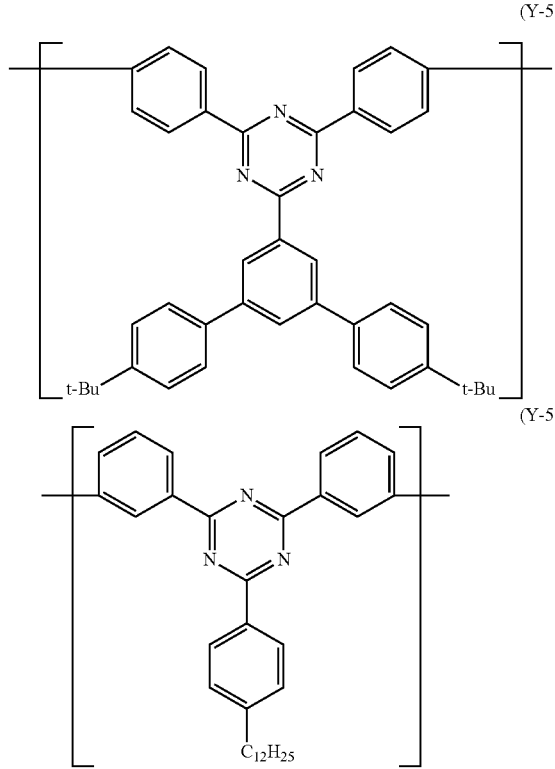

(Y-50)

(Y-51)

The content of the constitutional unit represented by the formula (Y) in which Ar$^{Y1}$ is an arylene group is preferably 0.5 to 80 mol %, more preferably 5 to 30 mol %, with respect to the total content of constitutional units contained in the polymer compound, because the luminance life of a light emitting device produced by using the polymer compound of the present invention is excellent.

The content of the constitutional unit represented by the formula (Y) in which Ar$^{Y1}$ is a divalent heterocyclic group or a divalent group in which at least one type of arylene group and at least one type of divalent heterocyclic group are bonded directly to each other is preferably 0.5 to 30 mol %, more preferably 3 to 30 mol %, with respect to the total content of constitutional units contained in the polymer compound, because the charge transportability of a light emitting device produced by using the polymer compound of the present invention is excellent.

The constitutional unit represented by the formula (Y) may be contained only singly or two or more units thereof may be contained in the polymer compound of the present invention.

The polymer compound of the present invention includes, for example, polymer compounds P-1 to P-24 shown in Table 1 and Table 2.

TABLE 1

| Polymer compound | formula (1) p | formula (1X) q | formula (1Z) r | formula (5) s | formula (5') t | formula (Y) u | other v |
|---|---|---|---|---|---|---|---|
| P-1 | 50.0 to 99.9 | 0.1 to 50.5 | 0 | 0 | 0 | 0 | 0 to 30 |
| P-2 | 50.0 to 99.8 | 0.1 to 49.9 | 0 | 0.1 to 49.9 | 0 | 0 | 0 to 30 |
| P-3 | 50.0 to 99.8 | 0.1 to 49.9 | 0 | 0 | 0.1 to 49.9 | 0 | 0 to 30 |
| P-4 | 50.0 to 99.8 | 0.1 to 49.9 | 0 | 0 | 0 | 0.1 to 49.9 | 0 to 30 |
| P-5 | 50.0 to 99.7 | 0.1 to 49.8 | 0 | 0.1 to 49.8 | 0 | 0.1 to 49.8 | 0 to 30 |
| P-6 | 50.0 to 99.7 | 0.1 to 49.8 | 0 | 0 | 0.1 to 49.8 | 0.1 to 49.8 | 0 to 30 |
| P-7 | 50.0 to 99.9 | 0 | 0.1 to 50.0 | 0 | 0 | 0 | 0 to 30 |
| P-8 | 50.0 to 99.8 | 0 | 0.1 to 49.9 | 0.1 to 49.9 | 0 | 0 | 0 to 30 |
| P-9 | 50.0 to 99.8 | 0 | 0.1 to 49.9 | 0 | 0.1 to 49.9 | 0 | 0 to 30 |
| P-10 | 50.0 to 99.8 | 0 | 0.1 to 49.9 | 0 | 0 | 0.1 to 49.9 | 0 to 30 |
| P-11 | 50.0 to 99.7 | 0 | 0.1 to 49.8 | 0.1 to 49.8 | 0 | 0.1 to 49.8 | 0 to 30 |
| P-12 | 50.0 to 99.7 | 0 | 0.1 to 49.8 | 0 | 0.1 to 49.8 | 0.1 to 49.8 | 0 to 30 |

TABLE 2

| Polymer compound | formula (1) p | formula (1X) q | formula (1Z) r | formula (5) s | formula (5') t | formula (Y) u | others v |
|---|---|---|---|---|---|---|---|
| P-13 | 50.0 to 99.8 | 0.1 to 49.9 | 0.1 to 49.9 | 0 | 0 | 0 | 0 to 30 |
| P-14 | 50.0 to 99.7 | 0.1 to 49.8 | 0.1 to 49.8 | 0.1 to 49.8 | 0 | 0 | 0 to 30 |
| P-15 | 50.0 to 99.7 | 0.1 to 49.8 | 0.1 to 49.8 | 0 | 0.1 to 49.8 | 0 | 0 to 30 |
| P-16 | 50.0 to 99.7 | 0.1 to 49.8 | 0.1 to 49.8 | 0 | 0 | 0.1 to 49.8 | 0 to 30 |
| P-17 | 50.0 to 99.6 | 0.1 to 49.7 | 0.1 to 49.7 | 0.1 to 49.7 | 0 | 0.1 to 49.7 | 0 to 30 |
| P-18 | 50.0 to 99.6 | 0.1 to 49.7 | 0.1 to 49.7 | 0 | 0.1 to 49.7 | 0.1 to 49.7 | 0 to 30 |
| P-19 | 70.0 to 100.0 | 0 | 0 | 0 | 0 | 0 | 0 to 30 |
| P-20 | 35.0 to 99.9 | 0 | 0 | 0.1 to 65.0 | 0 | 0 | 0 to 30 |
| P-21 | 35.0 to 99.9 | 0 | 0 | 0 | 0.1 to 65.0 | 0 | 0 to 30 |
| P-22 | 35.0 to 99.9 | 0 | 0 | 0 | 0 | 0.1 to 65.0 | 0 to 30 |

TABLE 2-continued

| Polymer compound | formula (1) p | formula (1X) q | formula (1Z) r | formula (5) s | formula (5') t | formula (Y) u | others v |
|---|---|---|---|---|---|---|---|
| P-23 | 35.0 to 99.8 | 0 | 0 | 0.1 to 64.9 | 0 | 0.1 to 64.9 | 0 to 30 |
| P-24 | 35.0 to 99.8 | 0 | 0 | 0.1 to 64.9 | 0.1 to 64.9 | 0 | 0 to 30 |

[in the table, p, q, r, s, t, u and v represent the mole fraction of each constitutional unit. P+q+r+s+t+u+v=100 and, 70≤p+q+r+s+t+v≤100. Other constitutional unit denotes a constitutional unit other than constitutional units represented by the formula (1), the formula (1X), the formula (1Z), the formula (5), the formula (5') and the formula (Y).].

The examples and preferable ranges of constitutional units represented by the formula (1), the formula (1X), the formula (1Z), the formula (5), the formula (5') and the formula (Y) in polymer compounds P-1 to P-24 are as described above.

An end group of the polymer compound of the present invention is preferably a stable group, because if a polymerization active group remains intact at the end, when the polymer compound is used for fabrication of a light emitting device, the light emitting property or luminance life possibly becomes lower. This end group is preferably a group having a conjugated bond to the main chain, and includes groups bonding to an aryl group or a monovalent heterocyclic group via a carbon-carbon bond.

The polymer compound of the present invention may be any of a block copolymer, a random copolymer, an alternative copolymer and a graft copolymer, and may also be other embodiment, and a copolymer produced by copolymerizing a several raw material monomers is preferable.

<Production Method of Polymer Compound>

Next, the production method of the polymer compound of the present invention will be illustrated.

The polymer compound of the present invention can be produced, for example, by condensation-polymerizing a compound represented by the formula (M-1) and other compounds (for example, at least one compound selected from the group consisting of a compound represented by the formula (M-1X), a compound represented by the formula (M-1Z), a compound represented by the formula (M-5), a compound represented by the formula (M-5') and a compound represented by the formula (M-Y)). In the present specification, compounds used for production of the polymer compound of the present invention are collectively called "raw material monomer" in some cases.

[Chemical Formula 70]

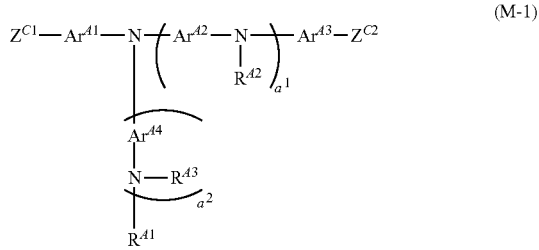

(M-1)

[Chemical Formula 71]

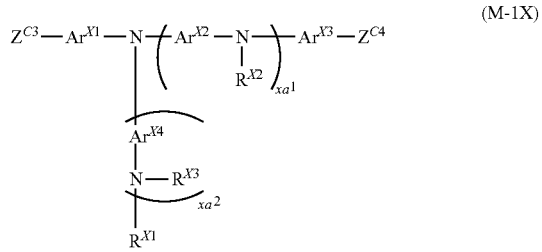

(M-1X)

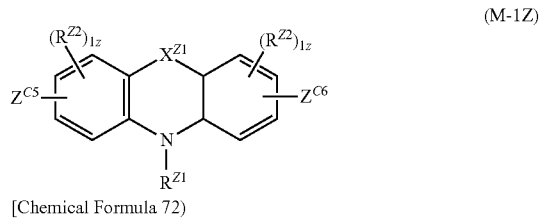

(M-1Z)

[Chemical Formula 72]

(M-5)

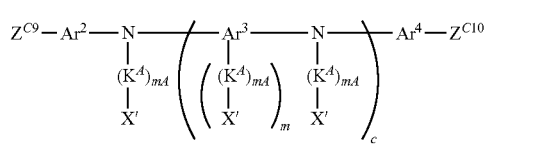

(M-5')

[Chemical Formula 73]

(M-Y)

[wherein, $a^1$, $a^2$, $Ar^{41}$, $Ar^{42}$, $Ar^{43}$, $Ar^{44}$, $R^{41}$, $R^{42}$, $R^{43}$, $Xa^1$, $Xa^2$, $Ar^{X1}$, $Ar^{X2}$, $Ar^{X3}$, $Ar^{X4}$, $R^{X1}$, $R^{X2}$, $R^{X3}$, $R^{Z1}$, $R^{Z2}$, $X^{Z1}$, nA, n, $Ar^1$, $L^A$, X, mA, m, c, $Ar^2$, $Ar^3$, $Ar^4$, $K^A$ and X' are as defined above.

$Z^{C1}$ to $Z^{C12}$ each independently represent a group selected from the group consisting of Group A of substituents and Group B of substituents.].

For example, when $Z^{C1}$ and $Z^{C2}$ are a group selected from Group A of substituents, $Z^{C3}$ to $Z^{C12}$ are selected from Group B of substituents.

For example, when $Z^{C1}$ and $Z^{C2}$ are a group selected from Group B of substituents, $Z^{C3}$ to $Z^{C12}$ are selected from Group A of substituents.

<Group A of Substituents>

A chlorine atom, a bromine atom, an iodine atom and a group represented by $-O-S(=O)_2 R^{C1}$ (wherein, $R^{C1}$ represents an alkyl group, a cycloalkyl group or an aryl group, the foregoing groups each optionally having a substituent.).

<Group B of Substituents>

A group represented by $-B(OR^{C2})_2$ (wherein, $R^{C2}$ represents a hydrogen atom, an alkyl group, a cycloalkyl group or an aryl group, the foregoing groups each optionally having a substituent. The plurality of $R^{C2}$ may be the same or different and may be combined together to form a cyclic structure together with the oxygen atoms to which they are attached.);

a group represented by $-BF_3 Q'$ (wherein, Q' represents Li, Na, K, Rb or Cs.);

a group represented by —MgY' (wherein, Y' represents a chlorine atom, a bromine atom or an iodine atom.);

a group represented by —ZnY" (wherein, Y" represents a chlorine atom, a bromine atom or an iodine atom.); and a group represented by —Sn($R^{C3}$)$_3$ (wherein, $R^{C3}$ represents a hydrogen atom, an alkyl group, a cycloalkyl group or an aryl group, the foregoing groups each optionally having a substituent. The plurality of $R^{C3}$ may be the same or different and may be combined together to form a cyclic structure together with the tin atom to which they are attached.).

As the group represented by —B(O$R^{C2}$)$_2$, groups represented by the following formulae are exemplified.

[Chemical Formula 74]

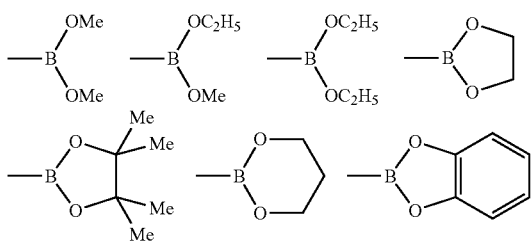

The compound having a group selected from Group A of substituents and the compound having a group selected from Group B of substituents undergo condensation polymerization by a known coupling reaction, thereby giving mutual bonding of carbon atoms linking the group selected from Group A of substituents and the group selected from Group B of substituents. Therefore, when a compound having two groups selected from Group A of substituents and a compound having two groups selected from Group B of substituents are subjected to a known coupling reaction, a condensed polymer of these compounds can be produced by condensation polymerization.

The condensation polymerization is carried out usually in the presence of a catalyst, a base and a solvent, and if necessary, a phase transfer catalyst may coexist.

The catalyst includes, for example, transition metal complexes such as palladium complexes such as dichlorobis(triphenylphosphine)palladium, dichlorobis(tris-o-methoxyphenylphosphine)palladium, palladium[tetrakis(triphenylphosphine)], [tris(dibenzylideneacetone)]dipalladium and palladium acetate, nickel complexes such as nickel[tetrakis(triphenylphosphine)], [1,3-bis(diphenylphosphino)propane]dichloronickel and [bis(1,4-cyclooctadiene)]nickel; these transition metal complexes further having a ligand such as triphenylphosphine, tri-o-tolylphosphine, tri-tert-butylphosphine, tricyclohexylphosphine, diphenylphosphinopropane and bipyridyl. The catalysts may be used singly or in combination.

The use amount of the catalyst is usually 0.00001 to 3 molar equivalents in terms of the amount of a transition metal, with respect to the sum of the molar numbers of raw material monomers.

The base and the phase transfer catalyst include, for example, inorganic bases such as sodium carbonate, potassium carbonate, cesium carbonate, potassium fluoride, cesium fluoride and tripotassium phosphate; organic bases such as tetrabutylammonium fluoride and tetrabutylammonium hydroxide; and phase transfer catalysts such as tetrabutylammonium chloride and tetrabutylammonium bromide. The bases and the phase transfer catalysts each may be used singly or in combination.

The use amounts of the base and the phase transfer catalyst are each usually 0.001 to 100 molar equivalents, with respect to the total molar number of raw material monomers.

The solvent includes, for example, organic solvents such as toluene, xylene, mesitylene, tetrahydrofuran, 1,4-dioxane, dimethoxyethane, N,N-dimethylacetamide and N,N-dimethylformamide; and water. The solvent may be used singly or two or more solvents may be used in combination.

The use amount of the solvent is usually 10 to 100000 parts by weight, with respect to 100 parts by weight of the total amount of raw material monomers.

The reaction temperature of condensation polymerization is usually −100 to 200° C. The reaction time is usually 1 hour or longer.

The post treatment of the polymerization reaction is conducted by known methods, such as a method of removing water-soluble impurities by liquid separation and a method in which the reaction solution resulting from the polymerization reaction is added to a lower alcohol such as methanol and a precipitate deposited is collected by filtration and dried, that are applied individually or in combination. When the polymer compound has a low purity, the polymer host can be purified by a usual method, such as recrystallization, reprecipitation, continuous extraction by a Soxhlet extractor and column chromatography.

A compound represented by the formula (1m-1) in which one embodiment of the compound represented by the formula (M-1) can be synthesized, for example, by a method shown below.

[Chemical Formula 75]

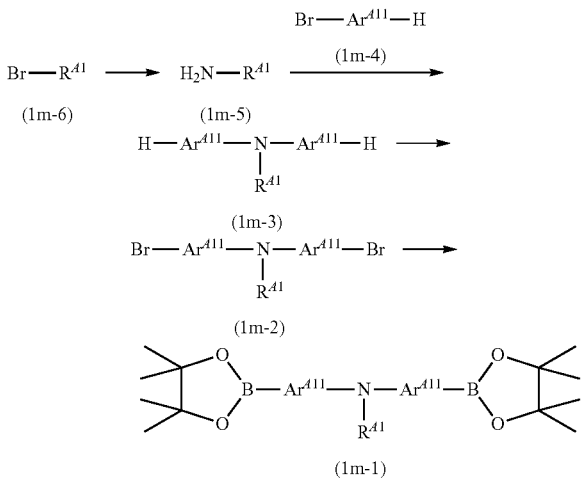

[wherein, $R^{41}$ is as defined above. $Ar^{411}$ represents an arylene group or a divalent heterocyclic group, the foregoing groups each optionally having a substituent. In $Ar^{411}$, at least one of atoms adjacent to an atom forming a bond to a bromine atom or the group represented by —B(O$R^{C2}$)$_2$ has an alkyl group, a cycloalkyl group, an alkoxy group, a cycloalkoxy group, an aryl group or a monovalent heterocyclic group as a substituent, the foregoing substituents each optionally further having a substituent.].

First, a compound represented by the formula (1m-6) and lithiumbis(trimethylsilyl)amide are reacted using a palladium catalyst, thereby inducing a compound represented by the formula (1m-5). Next, the compound represented by the formula (1m-5) and a compound represented by the formula (1m-4) are subjected to the Buchwald-Hartwig reaction, thereby synthesizing a compound represented by the formula (1m-3). Next, the compound represented by the formula (1m-3) and a brominating agent are reacted, thereby synthesizing a compound represented by the formula (1m-2). Next, the compound represented by the formula (1m-2) and bis(pinacolato)diboron are reacted using a palladium catalyst, thereby a compound represented by the formula (1m-1) can be synthesized.

A compound represented by the formula (2m-1) in which one embodiment of the compound represented by the formula (M-1) can be synthesized, for example, by a method shown below.

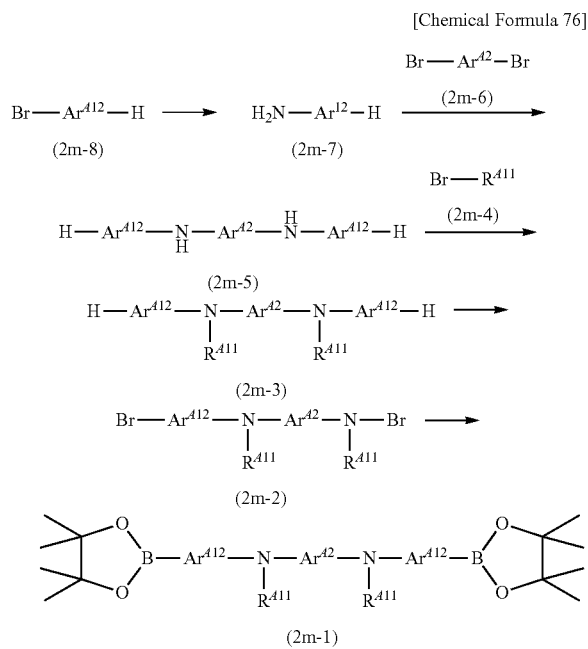

[Chemical Formula 76]

[wherein, $Ar^{412}$ represents an arylene group or a divalent heterocyclic group, the foregoing groups each optionally having a substituent. In $Ar^{412}$, at least one of atoms adjacent to an atom forming a bond to a bromine atom or the group represented by —$B(OR^{C2})_2$ has an alkyl group, a cycloalkyl group, an alkoxy group, a cycloalkoxy group, an aryl group or a monovalent heterocyclic group as a substituent, the foregoing substituents each optionally further having a substituent.

$Ar^{42}$ is as defined above. $R^{411}$ is as defined $R^{41}$.].

First, a compound represented by the formula (2m-8) and lithiumbis(trimethylsilyl)amide are reacted using a palladium catalyst, thereby inducing a compound represented by the formula (2m-7). Next, the compound represented by the formula (2m-7) and a compound represented by the formula (2m-6) are subjected to the Buchwald-Hartwig reaction, thereby synthesizing a compound represented by the formula (2m-5). Next, the compound represented by the formula (2m-5) and a compound represented by the formula (2m-4) are subjected to the Buchwald-Hartwig reaction, thereby synthesizing a compound represented by the formula (2m-3). Next, the compound represented by the formula (2m-3) and a brominating agent are reacted, thereby synthesizing a compound represented by the formula (2m-2). Next, the compound represented by the formula (2m-2) and bis(pinacolato)diboron are reacted using a palladium catalyst, there by a compound represented by the formula (2m-1) can be synthesized.

<Composition>

The composition of the present invention comprises the polymer compound of the present invention and at least one material selected from the group consisting of a hole transporting material, a hole injection material, an electron transporting material, an electron injection material, a light emitting material, an antioxidant and a solvent.

The composition comprising the polymer compound of the present invention and a solvent (hereinafter, referred to as "ink" in some cases) is suitable for fabrication of a light emitting device using a printing method such as an inkjet printing method and a nozzle printing method.

The viscosity of the ink may be adjusted depending on the kind of the printing method, and when a solution goes through a discharge apparatus such as in an inkjet printing method, the viscosity is preferably in the range of 1 to 20 mPa·s at 25° C. for preventing curved aviation and clogging in discharging.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as tetrahydrofuran, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methylethylketone, cyclohexanone and acetophenone; ester solvents such as ethyl acetate, butyl acetate, ethylcellosolve acetate, methyl benzoate and phenyl acetate; poly-hydric alcohols such as ethylene glycol, glycerin and 1,2-hexanediol and derivatives thereof; alcohol solvents such as isopropanol and cyclohexanol; sulfoxide solvents such as dimethyl sulfoxide; and amide solvents such as N-methyl-2-pyrrolidone and N,N-dimethylformamide. These solvents may be used singly or two or more of them may be used in combination.

In the ink, the compounding amount of the solvent is usually 1000 to 100000 parts by weight, preferably 2000 to 20000 parts by weight, with respect to 100 parts by weight of the polymer compound of the present invention.

[Hole Transporting Material]

The hole transporting material is classified into low molecular weight compounds and polymer compounds, and polymer compounds are preferable, polymer compounds having a crosslinkable group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene and trinitrofluorenone, preferably fullerene.

In the composition of the present invention, the compounding amount of the hole transporting material is usually 1 to 400 parts by weight, preferably 5 to 150 parts by weight, with respect to 100 parts by weight of the polymer compound of the present invention.

The hole transporting material may be used singly or two or more hole transporting materials may be used in combination.

[Electron Transporting Material]

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight, with respect to 100 parts by weight of the polymer compound of the present invention.

The electron transporting material may be used singly or two or more electron transporting materials may be used in combination.

[Hole Injection Material and Electron Injection Material]

The hole injection material and the electron injection material are each classified into low molecular weight compounds and polymer compounds. The hole injection material and the electron injection material each optionally has a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the main chain or side chain.

In the composition of the present invention, the compounding amounts of the hole injection material and the electron injection material are each usually 1 to 400 parts by weight, preferably 5 to 150 parts by weight, with respect to 100 parts by weight of the polymer compound of the present invention.

The hole injection material and the electron injection material may each be used singly or two or more of them may be used in combination.

[Ion Dope]

When the hole injection material or the electron injection material comprises an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

[Light Emitting Material]

The light emitting material is classified into low molecular weight compounds and polymer compounds. The light emitting material optionally has a crosslinkable group.

The low molecular weight compound includes, for example, naphthalene and derivatives thereof, anthracene and derivatives thereof, perylene and derivatives thereof, and, triplet light emitting complexes having iridium, platinum or europium as the central metal.

The polymer compound includes, for example, polymer compounds comprising a phenylene group, a naphthalenediyl group, an anthracenediyl group, a fluorenediyl group, a phenanthrenediyl group, dihydrophenanthrenediyl group, a group represented by the formula (1), a group represented by the formula (1X), a carbazolediyl group, a phenoxazinediyl group, a phenothiazinediyl group, a pyrenediyl group and the like.

The light emitting material may comprise a low molecular weight compound and a polymer compound, and preferably, comprises a triplet light emitting complex and a polymer compound.

As the triplet light emitting complex, iridium complexes represented by the formulae Ir-1 to Ir-5 are preferable.

[Chemical Formula 77]

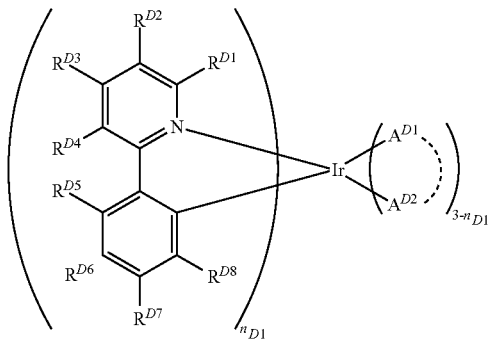

Ir-1

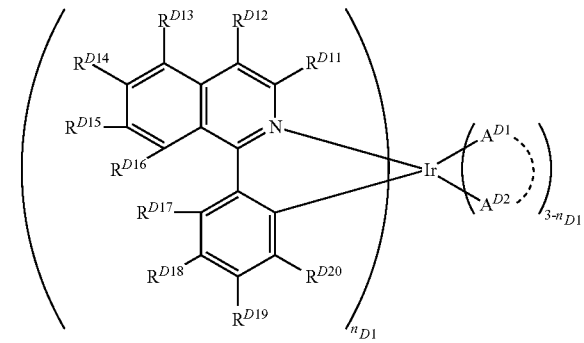

Ir-2

[Chemical Formula 78]

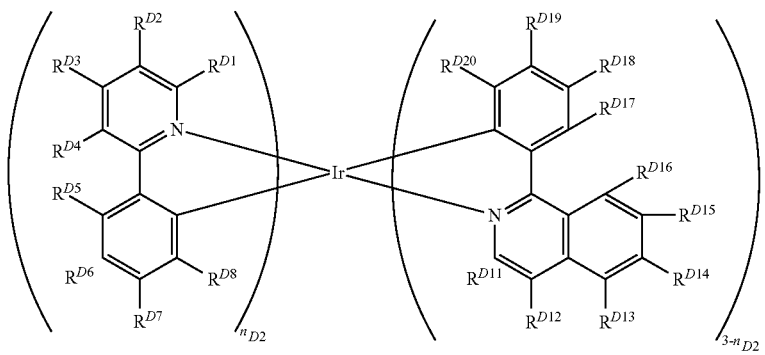

Ir-3

[Chemical Formula 79]

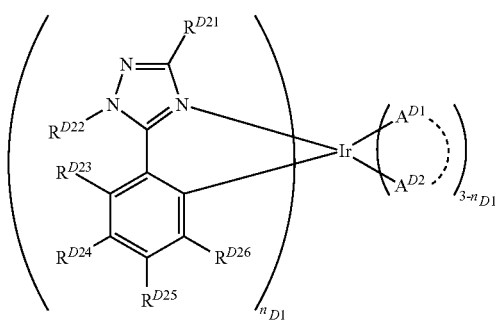

Ir-4

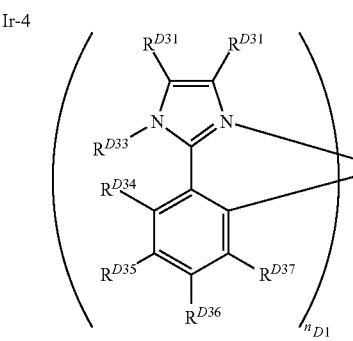

Ir-5

[Wherein, $R^{D1}$ to $R^{D8}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, the foregoing groups each optionally having a substituent. When a plurality of $R^{D1}$ to $R^{D8}$, $R^{D11}$ to $R^{D20}$, $R^{D21}$ to $R^{D26}$ and $R^{D31}$ to $R^{D37}$ are present, they may be the same or different at each occurrence.

$-A^{D1}-A^{D2}-$ represents an anionic bidentate ligand, and $A^{D1}$ and $A^{D2}$ each independently represent a carbon atom, an oxygen atom or a nitrogen atom linking to an iridium atom, and these atoms each may be an atom consisting a ring. When a plurality of $-A^{D1}-A^{D2}-$ are present, they may be the same or different.

$n_{D1}$ represents 1, 2 or 3, and $n_{D2}$ represents 1 or 2.]

In the metal complex represented by the Ir-1, at least one of $R^{D1}$ to $R^{D8}$ is preferably a group represented by the formula (D-A).

In the metal complex represented by the Ir-2, at least one of $R^{D11}$ to $R^{D20}$ is preferably a group represented by the formula (D-A).

In the metal complex represented by the Ir-3, at least one of $R^{D1}$ to $R^{D8}$ and $R^{D11}$ to $R^{D20}$ is preferably a group represented by the formula (D-A).

In the metal complex represented by the Ir-4, at least one of $R^{D21}$ to $R^{D26}$ is preferably a group represented by the formula (D-A).

In the metal complex represented by the Ir-5, at least one of $R^{D31}$ to $R^{D37}$ is preferably a group represented by the formula (D-A).

[Chemical Formula 80]

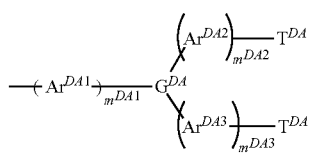

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, the foregoing groups each optionally having a substituent.

$Ar^{DA1}$, $Ar^{DA2}$ and $Ar^{DA3}$ each independently represent an arylene group or a divalent heterocyclic group, the foregoing groups each optionally having a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, the foregoing groups each optionally having a substituent. The plurality of $T^{DA}$ may be the same or different.]

$m^{DA1}$, $m^{DA2}$ and $m^{DA3}$ are usually an integer of 10 or less, preferably an integer of 5 or less, more preferably 0 or 1. It is preferable that $m^{DA1}$, $m^{DA2}$ and $m^{DA3}$ are the same integer.

$G^{DA}$ is preferably a group represented by the formula (GDA-11) to (GDA-15), the foregoing groups each optionally having a substituent.

[Chemical Formula 81]

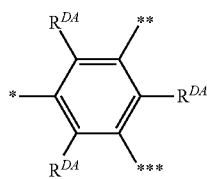 (GDA-11)

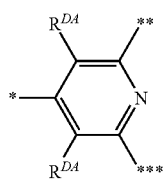 (GDA-12)

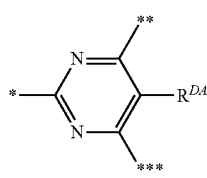 (GDA-13)

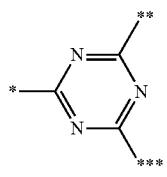 (GDA-14)

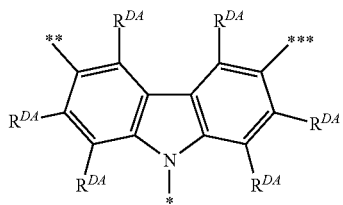 (GDA-15)

[wherein,

*,  and * each represent a linkage to $Ar^{DA1}$, $Ar^{DA2}$ and $Ar^{DA3}$.

$R^{DA}$ represents a hydrogen atom, an alkyl group, a cycloalkyl group, an alkoxy group, a cycloalkoxy group, an aryl group or a monovalent heterocyclic group, the foregoing groups each optionally further having a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, the foregoing groups each optionally having a substituent.

$Ar^{DA1}$, $Ar^{DA2}$ and $Ar^{DA3}$ are preferably groups represented by the formulae (ArDA-1) to (ArDA-3).

[Chemical Formula 82]

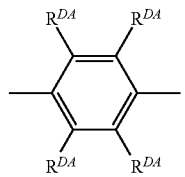 (ArDA-1)

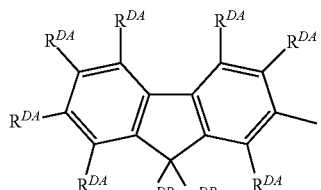 (ArDA-2)

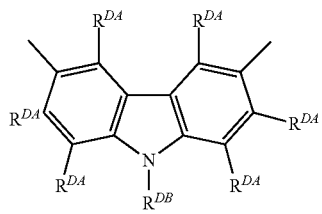 (ArDA-3)

[wherein, $R^{DA}$ is as defined above.

$R^{DB}$ represents a hydrogen atom, an alkyl group, a cycloalkyl group, an aryl group or a monovalent heterocyclic group, the foregoing groups each optionally having a substituent. When a plurality of $R^{DB}$ are present, they may be the same or different.]

$T^{DA}$ is preferably groups represented by the formulae (TDA-1) to (TDA-3).

[Chemical Formula 83]

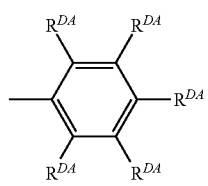 (TDA-1)

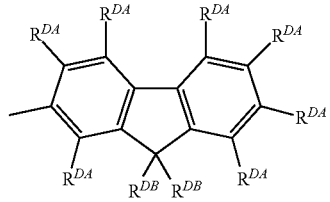 (TDA-2)

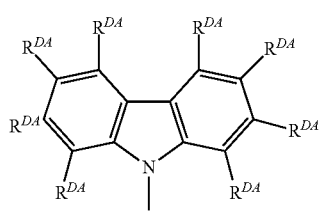 (TDA-3)

[wherein, $R^{DA}$ and $R^{DB}$ are as defined above.]

The group represented by the formula (D-A) is preferably a group represented by the formula (D-A1) to (D-A3).

[Chemical Formula 84]

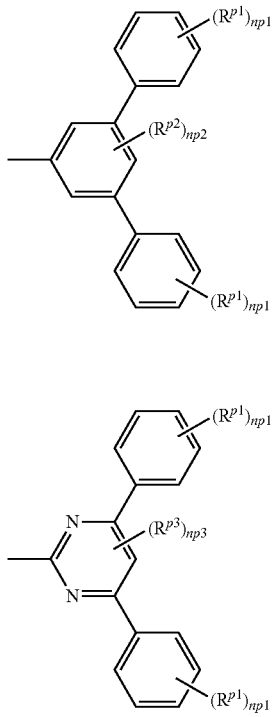

(D-A1)

(D-A2)

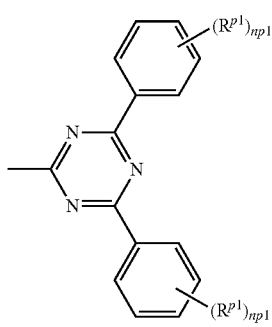

(D-A3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. The plurality of np1 may be the same or different.]

np1 is preferably 0 or 1, more preferably 1. np2 is preferably 0 or 1, more preferably 0. np3 is preferably 0.

$R^{p1}$, $R^{p2}$ and $R^{p3}$ are preferably an alkyl group or a cycloalkyl group.

The anionic bidentate ligand represented by -$A^{D1}$-$A^{D2}$- includes, for example, ligands represented by the following formulae.

[Chemical Formula 85]

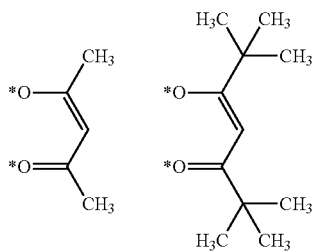

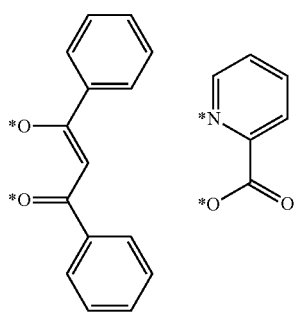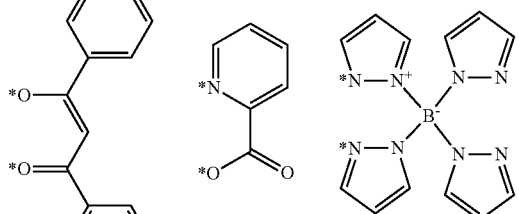

[wherein, * represents a position linking to Ir.]

The metal complex represented by the formula Ir-1 is preferably a metal complex represented by the formula Ir-11 to Ir-13. The metal complex represented by the formula Ir-2 is preferably a metal complex represented by the formula Ir-21. The metal complex represented by the formula Ir-3 is preferably a metal complex represented by the formula Ir-31 to Ir-33. The metal complex represented by the formula Ir-4 is preferably a metal complex represented by the formula Ir-41 to Ir-43. The metal complex represented by the formula Ir-5 is preferably a metal complex represented by the formula Ir-51 to Ir-53.

[Chemical Formula 86]

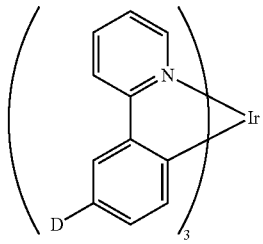

Ir-11

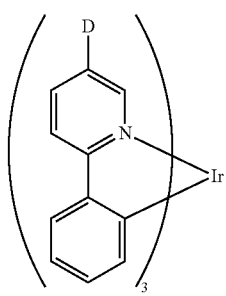

Ir-12

Ir-13
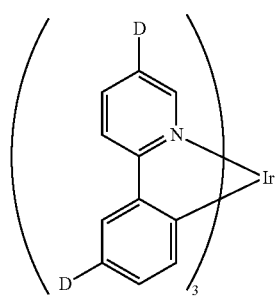
Ir-21
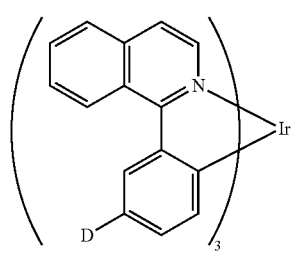
[Chemical Formula 87]
Ir-31
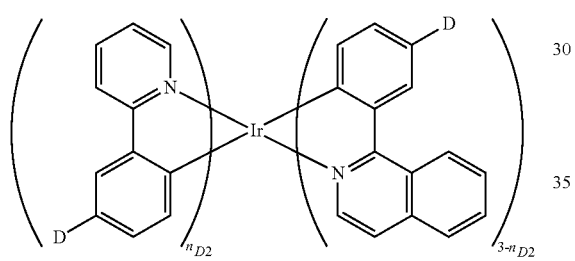
Ir-32
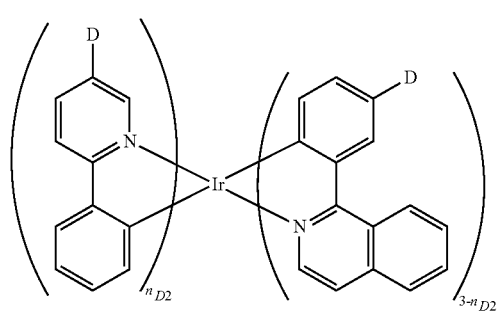
[Chemical Formula 88]
Ir-33
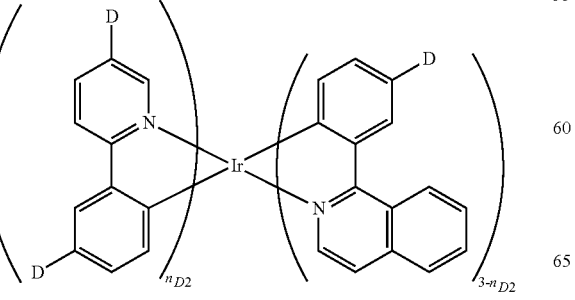
[Chemical Formula 89]
Ir-41
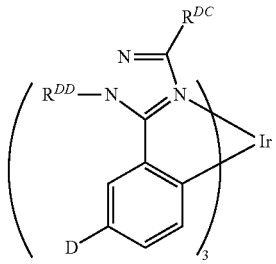
Ir-42
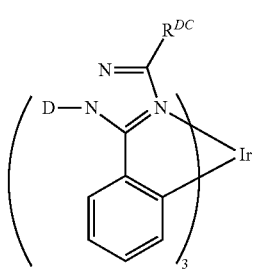
Ir-43
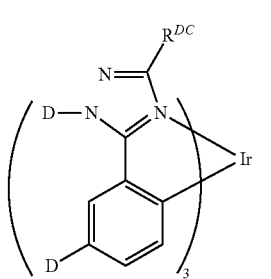
[Chemical Formula 90]
Ir-51
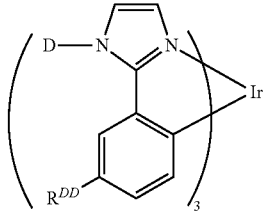
Ir-52
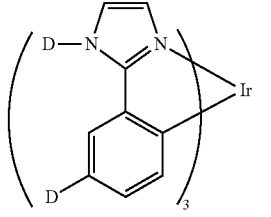
Ir-53

[wherein, $n_{D2}$ represents 1 or 2.

D represents a group represented by the formula (D-A). The plurality of D are the same or different.

$R^{DC}$ represents a hydrogen atom, an alkyl group, a cycloalkyl group, an aryl group or a monovalent heterocyclic group, the foregoing groups each optionally having a substituent. The plurality of $R^{DC}$ are the same or different.

$R^{DD}$ represents an alkyl group, a cycloalkyl group, an aryl group or a monovalent heterocyclic group, the foregoing groups each optionally having a substituent. The plurality of $R^{DD}$ are the same or different.]

The triplet light emitting complex includes, for example, metal complexes listed below.

[Chemical Formula 91]

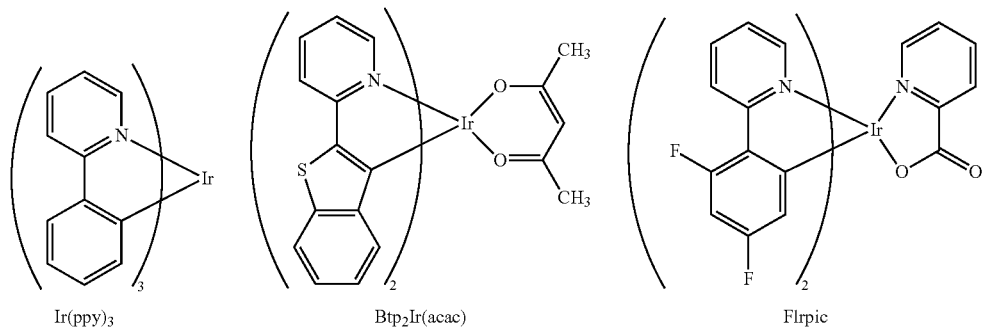

Ir(ppy)₃   Btp₂Ir(acac)   FIrpic

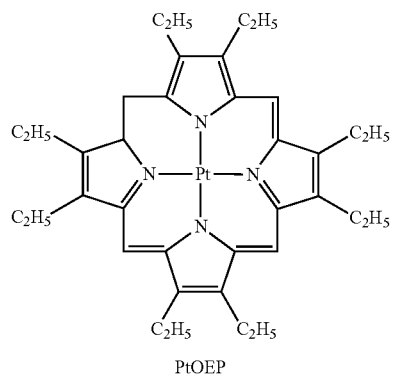

PtOEP

[Chemical Formula 92]

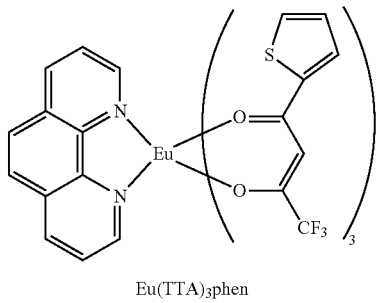

Eu(TTA)₃phen

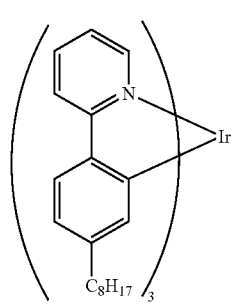

COM-1

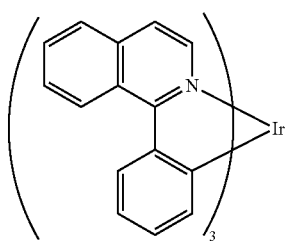

COM-2

-continued
[Chemical Formula 93]
COM-3
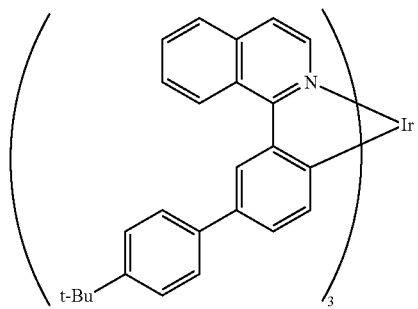
COM-4
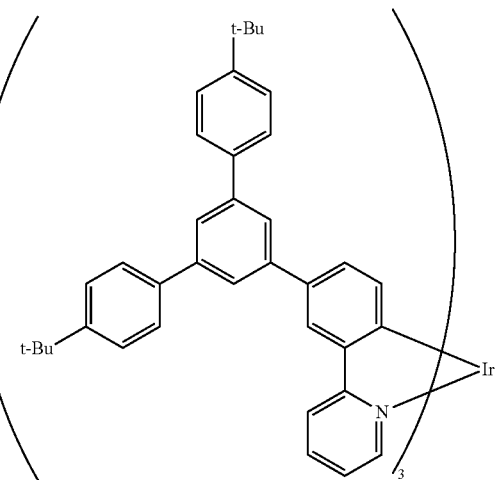
COM-5
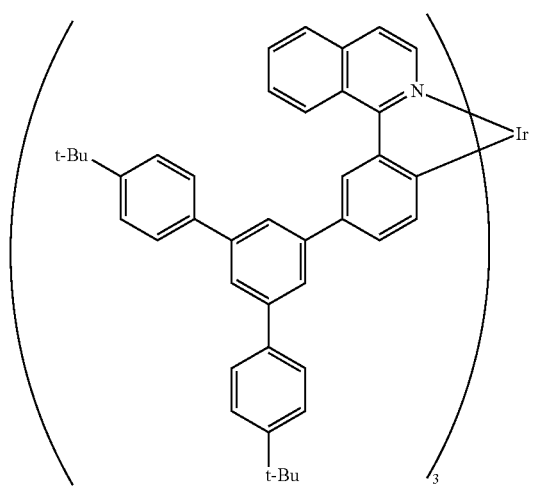
COM-6
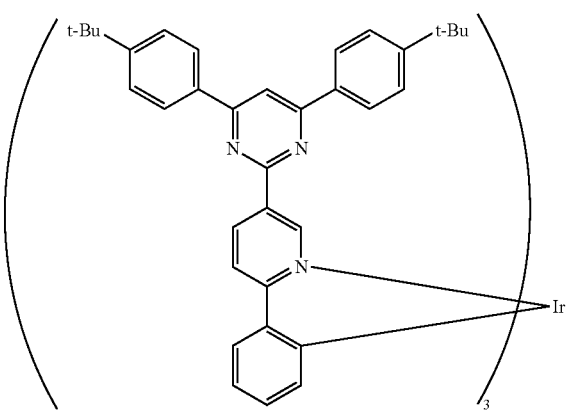
[Chemical Formula 94]
COM-7
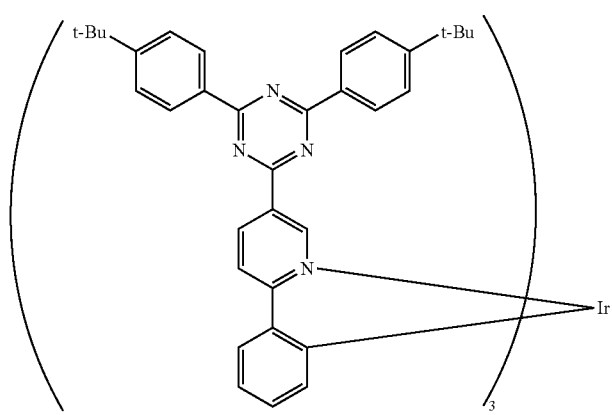

COM-8
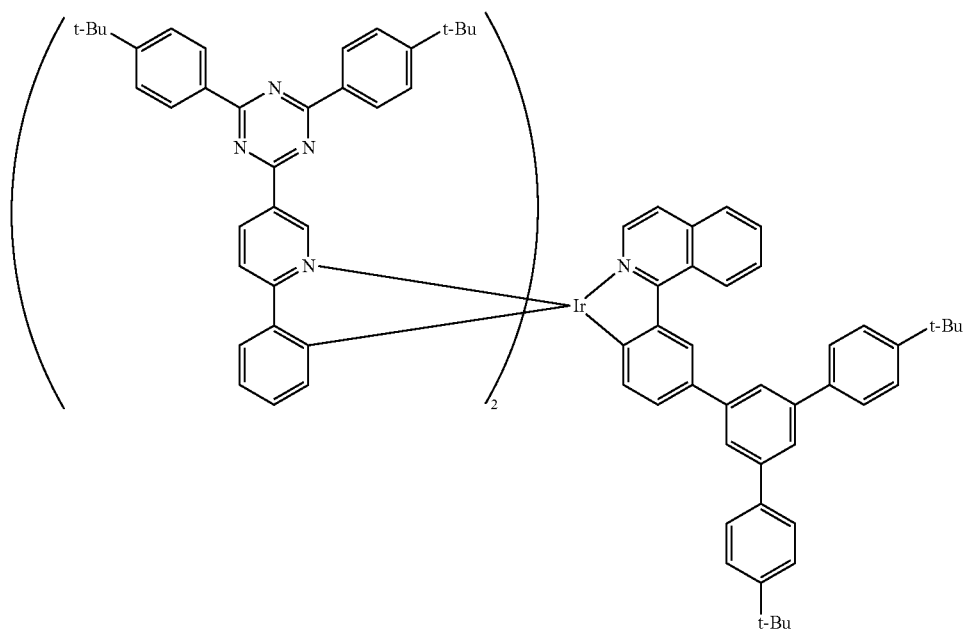
[Chemical Formula 95]
COM-9 COM-10
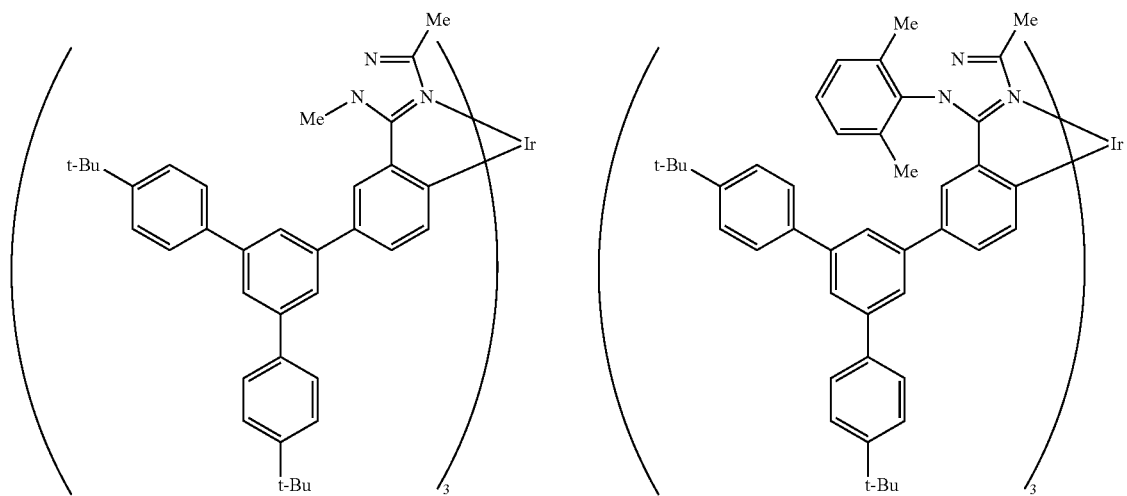
COM-11 COM-12
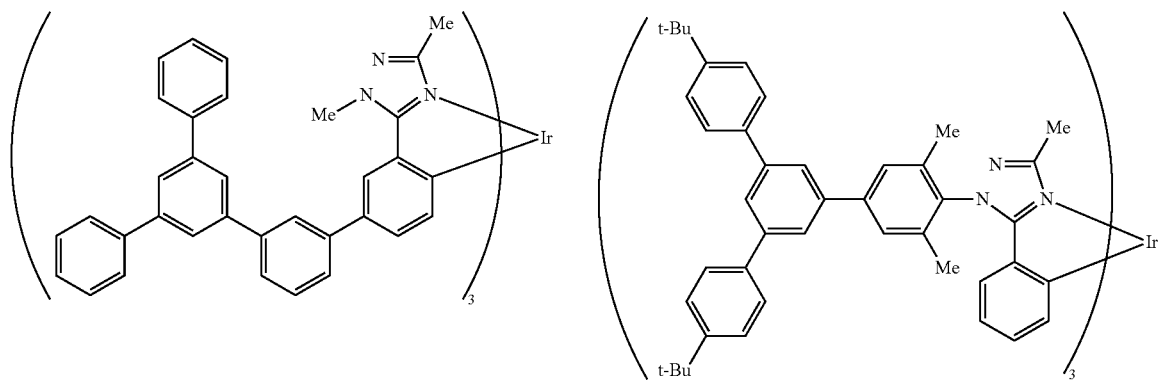

-continued
[Chemical Formula 96]
COM-13
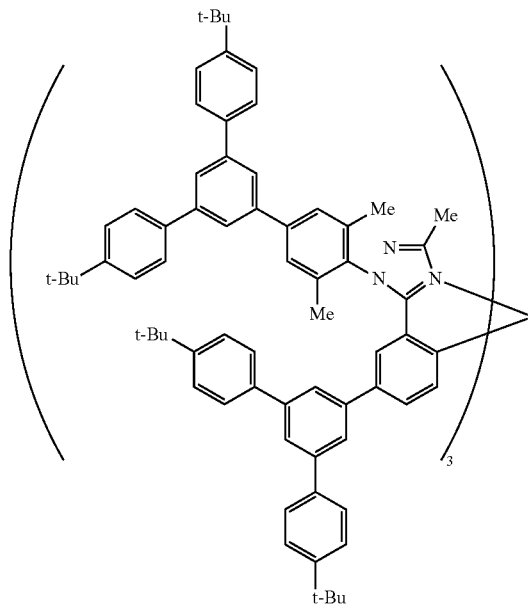
COM-14
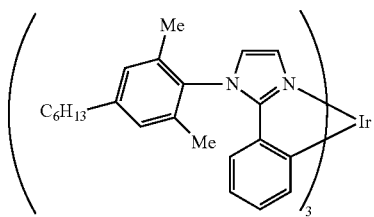
COM-15
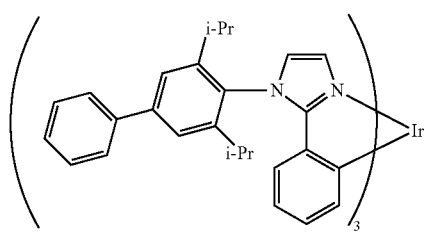
COM-16
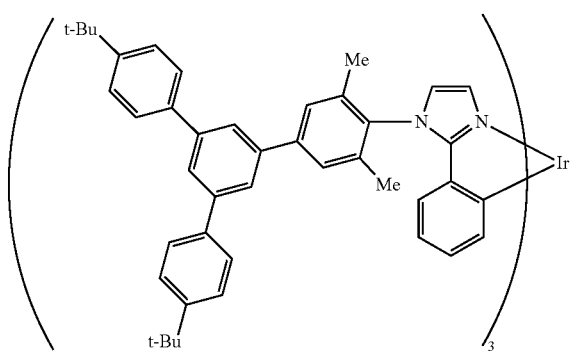
COM-17
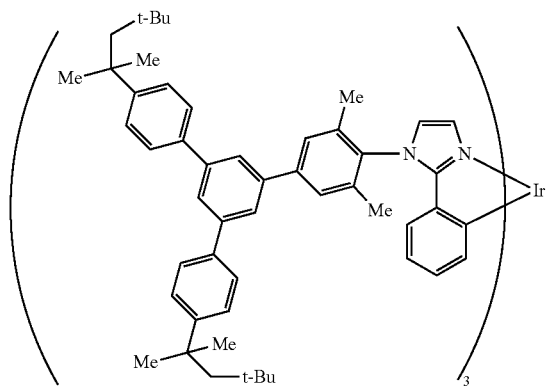
COM-18
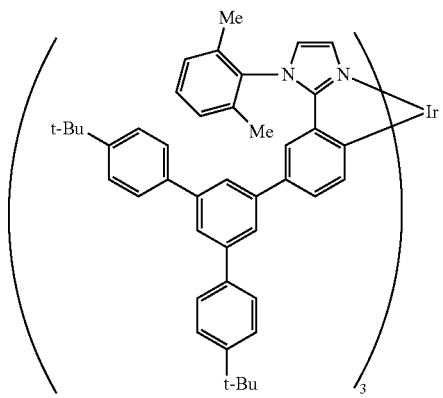

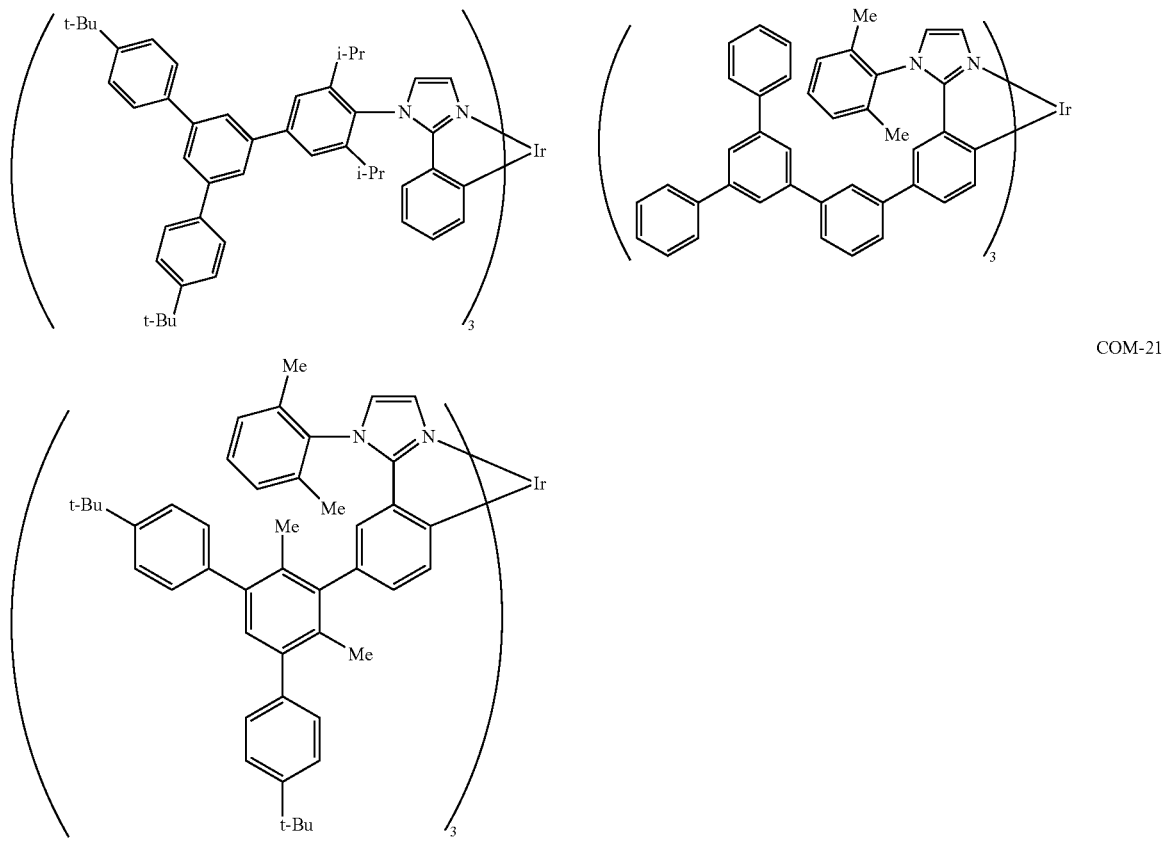

In the composition of the present invention, the compounding amount of the light emitting material is usually 0.1 to 400 parts by weight, with respect to 100 parts by weight of the polymer compound of the present invention.

[Antioxidant]

The antioxidant may advantageously be one which is soluble in the same solvent as for the polymer compound of the present invention and does not disturb light emission and charge transportation, and the examples thereof include phenol antioxidants and phosphorus-based antioxidants.

In the composition of the present invention, the compounding amount of the antioxidant is usually 0.001 to 10 parts by weight, with respect to 100 parts by weight of the polymer compound of the present invention.

The antioxidant may be used singly or two or more antioxidants may be used in combination.

<Film>

The film may contain the polymer compound of the present invention as it is, or contain the polymer compound of the present invention in the condition crosslinked intramolecularly, or intermolecularly, or intramolecularly and intermolecularly (crosslinked body). The crosslinked body of the polymer compound of the present invention may be a crosslinked body in which the polymer compound of the present invention and another compound are crosslinked intermolecularly. The film containing the crosslinked body of the polymer compound of the present invention is a film obtained by crosslinking a film containing the polymer compound of the present invention by an external stimulus such as heating, light irradiation and the like. The film containing the crosslinked body of the polymer compound of the present invention is substantially insolubilized in a solvent, therefore, the film can be suitably used for lamination of a light emitting device described later.

The temperature of heating for crosslinking the film is usually 25 to 300° C., and it is preferably 50 to 250° C., more preferably 150 to 200° C. because external quantum yield is excellent.

The kind of light used in light irradiation for crosslinking the film is, for example, ultraviolet light, near ultraviolet light or visible light.

The film is suitable as a hole transporting layer or a hole injection layer in a light emitting device.

The film can be fabricated by, for example, a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an inkjet printing method, a capillary coating method or a nozzle coat method, using an ink.

The thickness of the film is usually 1 nm to 10 μm.

<Light Emitting Device>

The light emitting device of the present invention is a light emitting device such as an organic electroluminescent device produced by using the polymer compound of the present invention, and the light emitting device includes, for example, light emitting devices comprising the polymer compound of the present invention, and light emitting devices produced by intramolecularly or intermolecularly crosslinking the polymer compound of the present invention or produced by crosslinking the polymer compound in both modes.

The constitution of the light emitting device of the present invention comprises, for example, electrodes consisting of an anode and a cathode, and a layer produced by using the polymer compound of the present invention disposed between the electrodes.

[Layer Constitution]

The layer produced by using the polymer compound of the present invention is usually at least one selected from a light emitting layer, a hole transporting layer, a hole injection layer, an electron transporting layer and an electron injection layer, preferably a hole transporting layer. These layers comprise a light emitting material, a hole transporting material, a hole injection material, an electron transporting material and an electron injection material, respectively. These layers can be formed by the same method as the above-described film fabrication using inks prepared by dissolving a light emitting material, a hole transporting material, a hole injection material, an electron transporting material and an electron injection material, respectively, in the solvent described above.

The light emitting device comprises a light emitting layer between an anode and a cathode. The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the polymer compound of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslinkable group to avoid dissolution of the materials in the solvent. After forming the layers using the materials having a crosslinkable group, the layers can be insolubilized by crosslinking the crosslinkable group.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer may be controlled in view of external quantum yield and device life.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO) and indium.zinc.oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

[Use]

For producing planar light emission by using a light emitting device, a planar anode and a planar cathode are disposed so as to overlap with each other. Patterned light emission can be produced by a method of placing a mask with a patterned window on the surface of a planer light emitting device, a method of forming extremely thick a layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

EXAMPLES

The present invention will be illustrated further in detail by examples below, but the present invention is not limited to these examples.

In the present examples, the polystyrene-equivalent number average molecular weight (Mn) and the polystyrene-equivalent weight average molecular weight (Mw) of a polymer compound were measured by size exclusion chromatography (SEC) (manufactured by Shimadzu Corp., trade name: LC-10Avp). SEC measurement conditions are as described below.

[Measurement Condition]

The polymer compound to be measured was dissolved in THF at a concentration of about 0.05 wt %, and 10 μL of the solution was injected into SEC. As the mobile phase of SEC, THF was used and allowed to flow at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

Measurement of liquid chromatograph mass spectrometry (LC-MS) was carried out according to the following method.

A measurement sample was dissolved in chloroform or THF so as to give a concentration of about 2 mg/mL, and about 1 μL of the solution was injected into LC-MS (manufactured by Agilent Technologies, trade name: 1100LCMSD). As the mobile phase of LC-MS, acetonitrile and THF were used while changing the ratio thereof and allowed to flow at a flow rate of 0.2 mL/min. As the column, L-column 2 ODS (3 μm) (manufactured by Chemicals Evaluation and Research Institute, internal diameter: 2.1 mm, length: 100 mm, particle size: 3 μm) was used.

Measurement of NMR was carried out according to the following method.

5 to 10 mg of a measurement sample was dissolved in about 0.5 mL of deuterated chloroform ($CDCl_3$), deuterated tetrahydrofuran (THF-$d_8$) or deuterated methylene chloride ($CD_2Cl_2$), and measurement was performed using an NMR apparatus (manufactured by Varian, Inc., trade name: MERCURY 300).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise state. In this operation, the compound to be measured was dissolved in THF or chloroform so as to give a concentration of 0.01 to 0.2 wt %, and depending on the concentration, 1 to 10 μL of the solution was injected into HPLC. As the mobile phase of HPLC, acetonitrile and THF were used and allowed to flow at a flow rate of 1 mL/min as gradient analysis of acetonitrile/THF=100/0 to 0/100 (volume ratio). As the column, Kaseisorb LC ODS 2000 (manufactured by Tokyo Chemical Industry Co., Ltd.) or an ODS column having an equivalent performance was used. As the detector, a photo diode array detector (manufactured by Shimadzu Corp., trade name: SPD-M20A) was used.

<Synthesis Example 1> Synthesis of Compound 2

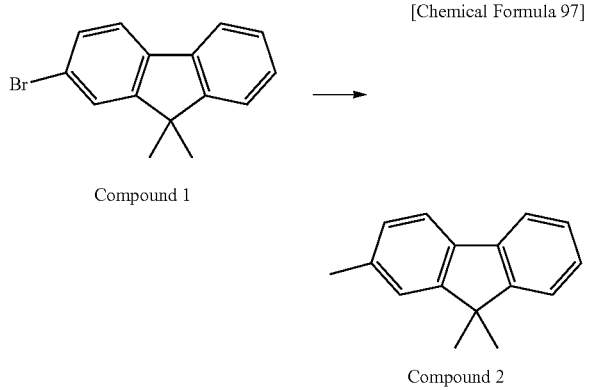

[Chemical Formula 97]

Compound 1

Compound 2

An argon gas atmosphere was prepared in a reaction vessel, then, a compound 1 (199.0 g), dichloro[1,3-bis(diphenylphosphino)propane]nickel (15.4 g) and cyclopentyl methyl ether (1460 mL) were added, and the mixture was stirred. Thereafter, to this was added a methylmagnesium bromide ether solution (3 mol/L, 292 mL) over a period of 1 hour. The resultant reaction liquid was heated up to 40° C., and stirred for 4 hours at 40° C. The resultant reaction liquid was cooled down to room temperature, then, a hydrochloric acid aqueous solution (1 mol/L, 200 mL) was added. The resultant reaction liquid was separated, and the resultant organic layer was washed with ion exchanged water. The resultant wash liquid was dried over anhydrous magnesium sulfate, then, filtrated, and the resultant filtrate was concentrated under reduced pressure, thereby obtaining a solid. To the resultant solid were added toluene and activated carbon, and the mixture was stirred for 30 minutes. The resultant toluene solution was filtrated through a filter paved with silica gel and celite, and the resultant filtrate was concentrated under reduced pressure, thereby obtaining a solid. The resultant solid was purified by silica gel column chromatography (a mixed solvent of hexane and ethyl acetate), recrystallized using isopropanol, then, the crystal was dried under reduced pressure at 50° C., thereby obtaining a compound 2 (81 g, white solid). The compound 2 had a HPLC area percentage value of 97.2%. This operation was repeated, thereby obtaining a necessary amount of the compound 2.

LC-MS (APPI, positive): $[M]^+208$.

<Synthesis Example 2> Synthesis of Compound 3

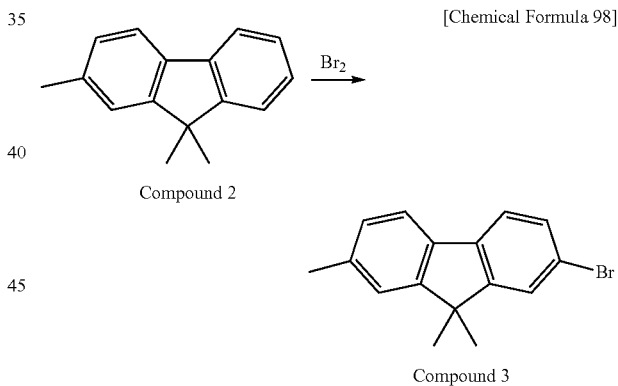

[Chemical Formula 98]

Compound 2

Compound 3

A nitrogen gas atmosphere was prepared in a reaction vessel, then, the compound 2 (96 g) and dichloromethane (1200 mL) were added, and the reaction vessel was cooled using an ice bath. Thereafter, into this was dropped bromine (74 g) over a period of 2 hours, and the mixture was stirred for 3 hours while cooling the reaction vessel using an ice bath. Thereafter, a 10 wt % sodium sulfite aqueous solution (150 mL) was added, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated under reduced pressure, thereby obtaining a solid. To the resultant solid were added hexane, toluene and activated carbon, and the mixture was stirred for 1 hour. The resultant solution was filtrated through a filter paved with silica gel and celite, and the resultant filtrate was concentrated under reduced pressure, thereby obtaining a solid. The resultant solid was recrystallized using a mixed solution of toluene and isopropanol, then, the crystal was dried under reduced pressure at 50° C., thereby obtaining a compound 3 (83 g, white solid). The compound 3 had a HPLC area percentage value of 98.9%.

LC-MS (APPI, positive): [M]⁺ 286.

<Synthesis Example 3> Synthesis of Compound 4

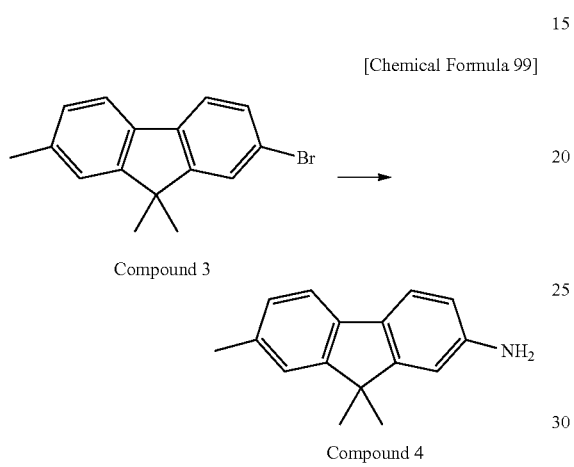

[Chemical Formula 99]

Compound 3

Compound 4

An argon gas atmosphere was prepared in a reaction vessel, then, the compound 3 (83.0 g), tris(dibenzylideneacetone)dipalladium(0) (2.6 g), (2-biphenyl)dicyclohexylphosphine (2.4 g) and tetrahydrofuran (800 mL) were added, and the mixture was stirred. Thereafter, to this was added a lithiumbis(trimethylsilyl)amide tetrahydrofuran solution (1.3 mol/mL, 334 mL) over a period of 30 minutes. The resultant reaction liquid was heated up to 65° C., then, stirred for 4 hours at 65° C. Thereafter, the reaction vessel was cooled using an ice bath, and a hydrochloric acid aqueous solution (2 mol/L, 800 mL) was added, and the mixture was stirred for 1.5 hours while cooling the reaction vessel using an ice bath. Thereafter, to this was added a sodium hydroxide aqueous solution (6 mol/L, 600 mL) thereby attaining neutralization. The resultant reaction liquid was separated, and the resultant organic layer was washed with ion exchanged water. The resultant wash liquid was separated, and the resultant organic layer was dried over magnesium sulfate, then, filtrated. The resultant filtrate was concentrated under reduced pressure, then, hexane was added, and the mixture was suspended and stirred for 1 hour, then, filtrated, thereby obtaining a yellow solid. The resultant yellow solid was suspended and stirred with hexane, then, filtrated. An operation of recrystallizing the resultant residue by using a mixed solution of hexane and toluene was repeated, then, the crystal was dried under reduced pressure at 50° C., thereby obtaining a compound 4 (40 g, pale yellow solid). The compound 4 had a HPLC area percentage value of 99.1%.

¹H-NMR (CDCl₃, 300 MHz): δ (ppm)=1.43 (6H, s), 2.40 (3H, s), 3.72 (2H, s), 6.64 (1H, dd), 6.743 (1H, d), 7.09 (1H, d), 7.17 (1H, d), 7.46 (2H, d).

<Synthesis Example 4> Synthesis of Compound 6

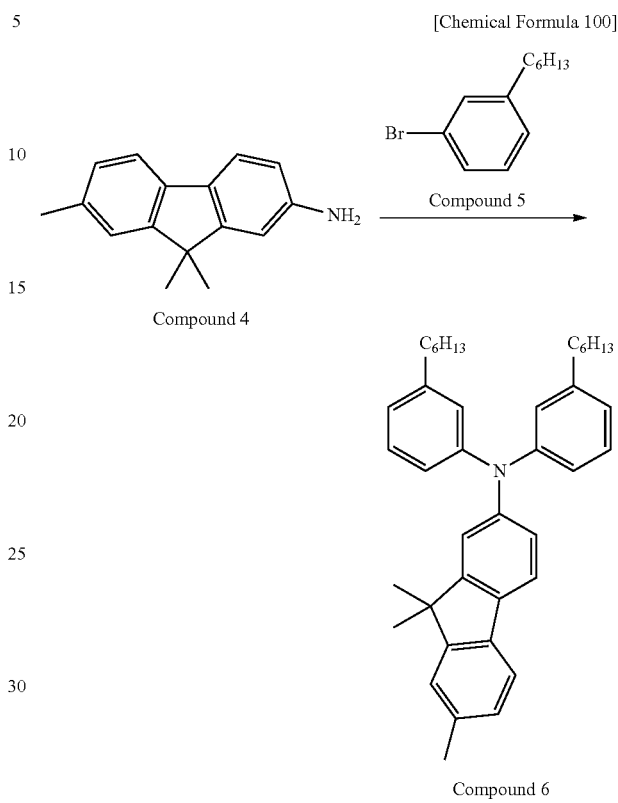

[Chemical Formula 100]

Compound 4

Compound 6

An argon gas atmosphere was prepared in a reaction vessel, then, the compound 4 (34.0 g), a compound 5 (80.8 g), tris(dibenzylideneacetone)dipalladium(0) (1.4 g), tri-tert-butylphosphine tetrafluoroborate salt (0.9 g) and toluene (680 mL) were added, and the mixture was heated up to 50° C., and stirred at 50° C. Thereafter, to this was added sodium tert-butoxide (43.9 g), and the mixture was heated up to 110° C., then, stirred for 4 hours at 110° C. Thereafter, to this was added toluene, and the mixture was filtrated through a filter paved with celite. The resultant filtrate was washed with ion exchanged water and 15 wt % saline water in series. The resultant wash liquid was separated, then, the resultant organic layer was concentrated under reduced pressure, thereby obtaining a coarse product. To the resultant coarse product were added hexane and activated carbon, and the mixture was stirred for 1 hour. The resultant solution was filtrated through a filter paved with silica gel and celite, and the resultant filtrate was concentrated under reduced pressure, thereby obtaining an oil. The resultant oil was purified by silica gel column chromatography (a mixed solvent of hexane and ethyl acetate), thereby obtaining a compound 6 (22 g, colorless oil). The compound 6 had a HPLC area percentage value of 99.5%.

LC-MS (APCI, positive): [M+H]⁺ 544.

107

<Synthesis Example 5> Synthesis of Compound 7

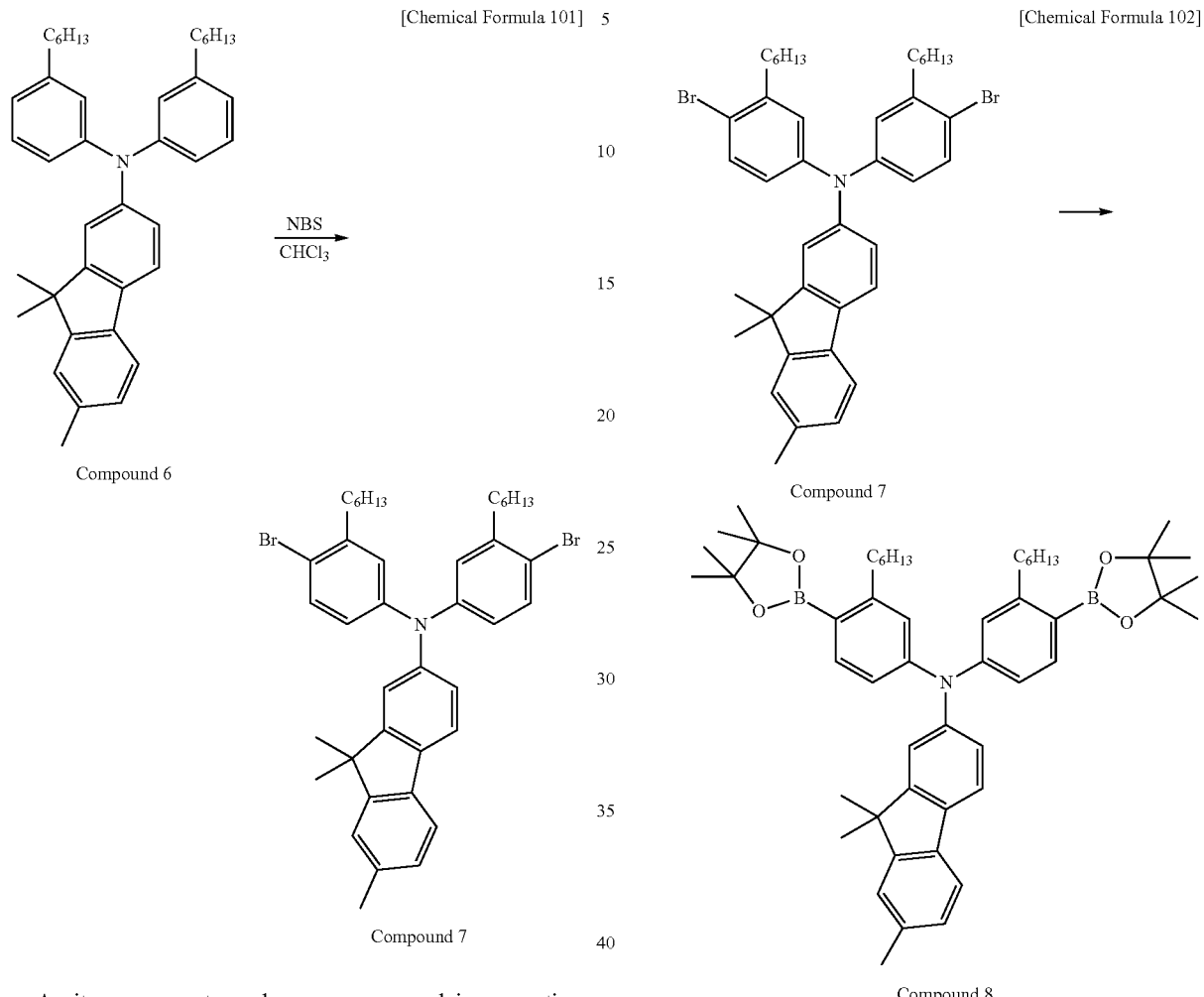

A nitrogen gas atmosphere was prepared in a reaction vessel, then, the compound 6 (22 g) and chloroform (360 mL) were added, and the reaction vessel was cooled using an ice bath. Thereafter, to this was added N-bromosuccinimide (84 g), and the mixture was stirred for 6 hours while cooling the reaction vessel using an ice bath. Thereafter, a 10 wt % sodium sulfite aqueous solution (50 mL) was added, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated under reduced pressure, thereby obtaining a solid. To the resultant solid were added hexane and activated carbon, and the mixture was stirred for 1 hour. The resultant solution was filtrated through a filter paved with silica gel and celite, and the resultant filtrate was concentrated under reduced pressure, thereby obtaining a solid. The resultant solid was purified by silica gel column chromatography (hexane), recrystallized using acetone, then, the crystal was dried under reduced pressure at 50° C., thereby obtaining a compound 7 (12 g, white solid). The compound 7 had a HPLC area percentage value of 99.5% or more. This operation was repeated, thereby obtaining a necessary amount of the compound 7.

LC-MS (APCI, positive): [M+H]$^+$ 700.

108

<Synthesis Example 6> Synthesis of Compound 8

An argon gas atmosphere was prepared in a reaction vessel, then, bis-pinacoldiboron (14.0 g), cyclopentyl methyl ether (60 mL), potassium acetate (10.6 g) and [1,1'-bis(diphenylphosphino)ferrocene]palladium dichloride (0.4 g) were added, and the mixture was heated up to 100° C. Thereafter, to this was added the compound 7 (12.9 g) dissolved in cyclopentyl methyl ether (69 mL) over a period of 1 hour, and the mixture was stirred at 100° C. for 5 hours. The resultant reaction liquid was cooled down to room temperature, then, washed with ion exchanged water. The resultant wash liquid was separated, and the resultant organic layer was washed with ion exchanged water. The resultant wash liquid was dried over magnesium sulfate, then, filtrated, and the resultant filtrate was concentrated under reduced pressure, thereby obtaining a solid. To the resultant solid were added hexane, toluene and activated carbon, and the mixture was stirred for 1 hour. The resultant solution was filtrated through a filter paved with silica gel and celite, and the resultant filtrate was concentrated under reduced pressure, thereby obtaining a solid. The resultant solid was purified by silica gel column chromatography (a mixed solvent of hexane and toluene), then, dried under reduced pressure at 50° C., thereby obtaining a compound 8 (8.1 g, white solid). The compound 8 had a HPLC area percentage value of 99.5% or more.

LC-MS (ESI, positive): [M+K]$^+$795.

$^1$H-NMR (CDCl$_3$, 300 MHz): δ (ppm)=0.86 (6H, s), 1.23-1.53 (46H, m), 2.42 (3H, s), 2.74 (4H, t), 6.88-6.92 (4H, m), 6.99 (1H, d), 7.12 (1H, d), 7.19 (2H, d), 7.50 (1H, d), 7.53 (1H, d), 7.63 (2H, d).

<Synthesis Example 7> Synthesis of Compound 10

[Chemical Formula 103]

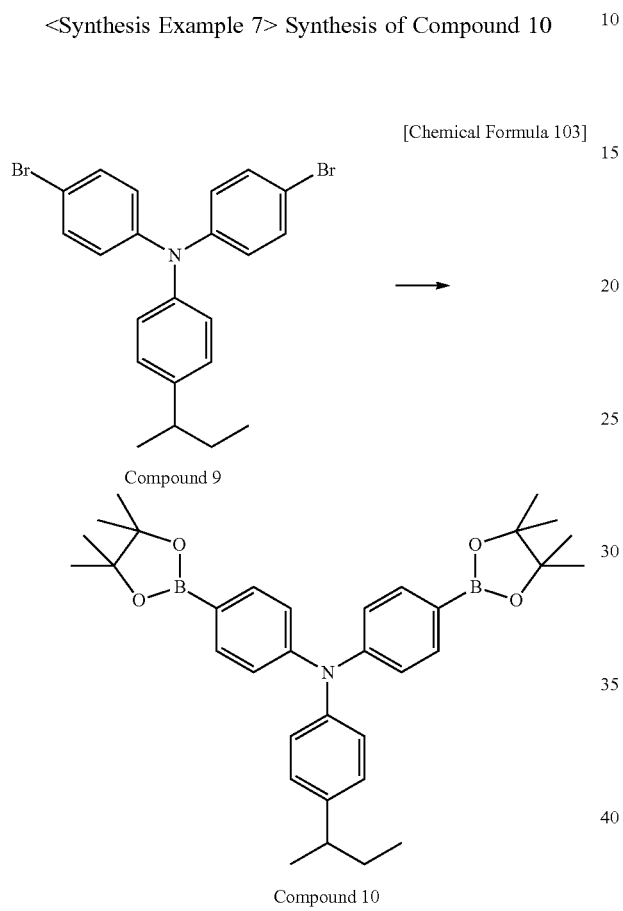

Compound 9

Compound 10

An argon gas atmosphere was prepared in a reaction vessel, then, a compound 9 (12.9 g), bis-pinacoldiboron (25.4 g), dimethoxyethane (280 mL), potassium acetate (25.6 g): [1,1'-bis(diphenylphosphino)ferrocene]palladium dichloride (3.2 g) and diphenylphosphinoferrocene (2.2 g) were added, and the mixture was stirred at 85° C. for 7 hours. Thereafter, to this was added toluene, and the resultant organic layer was washed with ion exchanged water. The resultant wash liquid was separated, then, the resultant organic layer was concentrated under reduced pressure. To the resultant solid were added hexane, toluene and activated carbon, and the mixture was stirred for 1 hour. The resultant solution was filtrated through a filter paved with silica gel and celite, and an operation of concentrating the resultant filtrate under reduced pressure was repeated three times, thereby obtaining a solid. The resultant solid was recrystallized using a mixed solvent of toluene and acetonitrile, then, recrystallized using toluene, then, the crystal was dried under reduced pressure, thereby obtaining a compound 10 (11 g, white solid). The compound 10 had a HPLC area percentage value of 99.5% or more.

LC-MS (APCI, positive): [M+H]$^+$ 554.4.

$^1$H-NMR (CDCl$_3$, 300 MHz): δ (ppm)=0.84 (3H, t), 1.23 (3H, d), 1.33 (24H, s), 1.60 (2H, dq), 2.56 (1H, tq), 7.07 (8H, m), 7.66 (4H, d).

<Synthesis Example 8> Synthesis of Compound 11

[Chemical Formula 104]

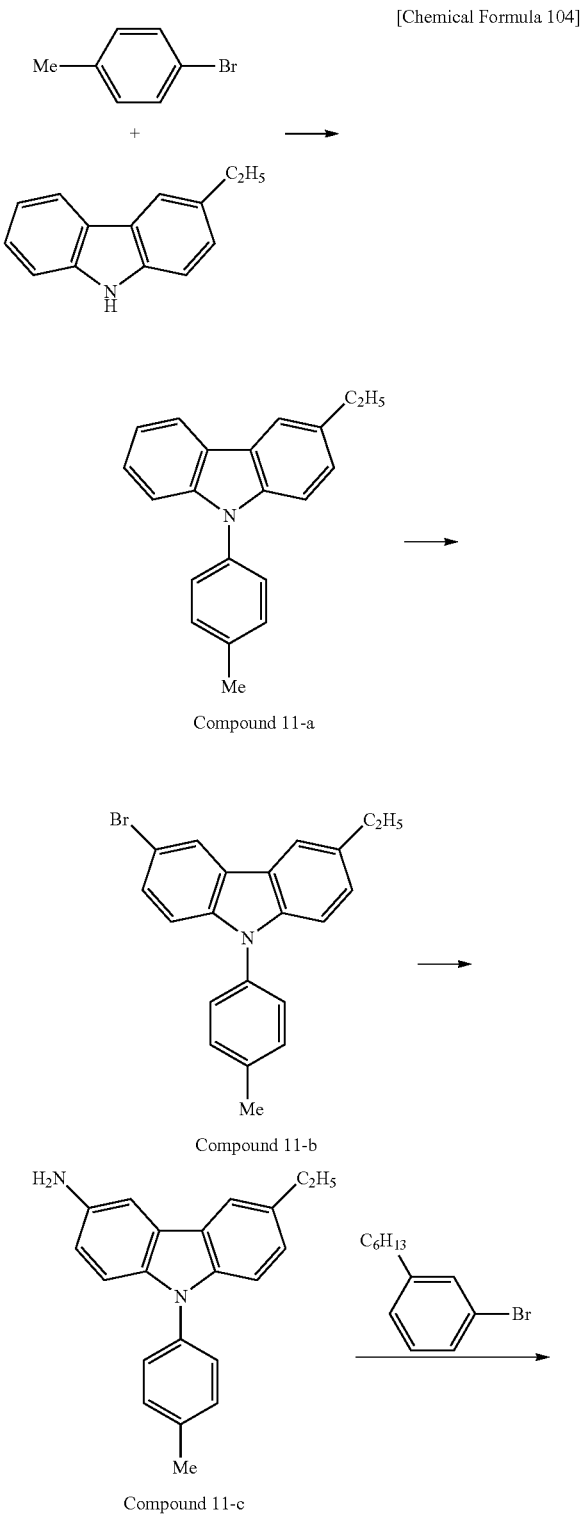

Compound 11-a

Compound 11-b

Compound 11-c

-continued

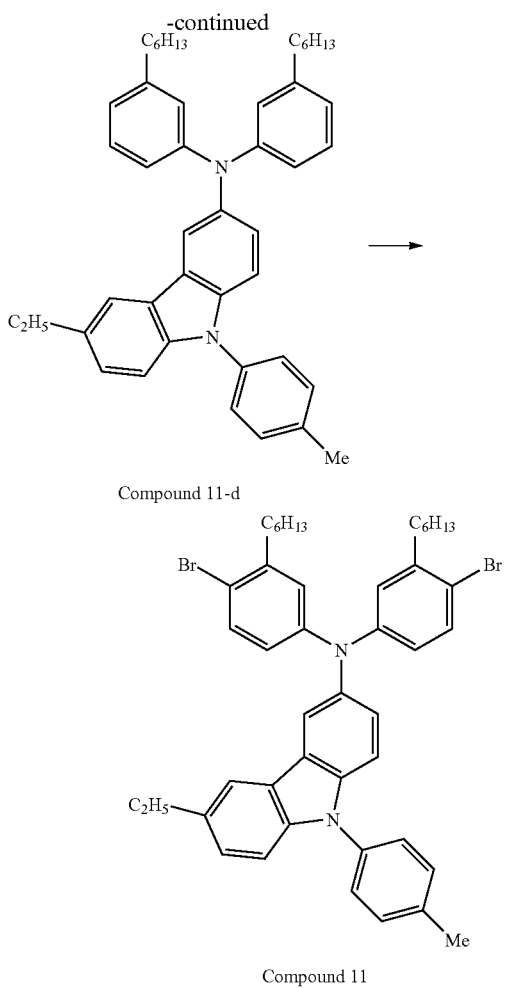

Compound 11-d

Compound 11

An argon gas atmosphere was prepared in a reaction vessel, then, 4-bromotoluene (31.5 g), 3-ethylcarbazole (30.0 g), xylene (1200 mL), potassium acetate (1.0 g) and tri-tert-butylphosphine tetrafluoroborate salt (2.9 g) were added, and the mixture was stirred. Thereafter, to this was added sodium tert-butoxide (44.3 g), and the mixture was stirred at 130° C. for 13 hours. Thereafter, the reaction vessel was cooled using an ice bath, and ion exchanged water (200 mL) was added and the mixture was washed. The resultant wash liquid was separated, and the resultant organic layer was washed with ion exchanged water. The resultant wash liquid was separated, and the resultant organic layer was dried over magnesium sulfate, then, filtrated. The resultant filtrate was concentrated, then, hexane and activated carbon were added, and the mixture was stirred at room temperature for 30 minutes, then, filtrated through a filter paved with celite. The resultant filtrate was concentrated under reduced pressure, then, hexane and activated white earth were added, and the mixture was stirred at room temperature for 30 minutes, then, filtrated through a filter paved with silica gel and celite. The resultant filtrate was concentrated under reduced pressure, thereby obtaining an oil. The resultant oil was purified by silica gel column chromatography (a mixed solvent of hexane and ethyl acetate), and dried under reduced pressure at 50° C., thereby obtaining a compound 11-a (43.0 g, oil). The compound 11-a had a HPLC area percentage value of 99.4%.

$^1$H-NMR (CDCl$_3$, 300 MHz): δ (ppm): 1.32 (3H, t), 2.48 (3H, s), 2.85 (2H, q), 7.25-7.41 (9H, m), 7.95 (1H, s), 8.12 (d, 1H).

A nitrogen gas atmosphere was prepared in a reaction vessel, then, the compound 11-a (42.0 g) and chloroform (330 mL) were added, and the mixture was cooled down to −10° C. Thereafter, to this was added benzyltrimethylammonium tribromide (57.4 g), and the mixture was stirred at −10° C. for 10 hours. Thereafter, to this was added a 10 wt % sodium sulfite aqueous solution, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated, thereby obtaining a white solid. Thereafter, to this were added hexane, toluene and activated carbon, and the mixture was stirred at room temperature for 30 minutes, then, filtrated through a filter paved with celite, and the resultant filtrate was concentrated under reduced pressure, thereby obtaining a solid. To the resultant solid was added hexane, and the mixture was suspended and stirred, then, filtrated. The resultant solid was recrystallized using a mixed solvent of toluene, methanol and ethanol, then, the crystal was dried under reduced pressure at 50° C., thereby obtaining a compound 11-b (35.0 g, white solid). The compound 11-b had a HPLC area percentage value of 99.5% or more.

$^1$H-NMR (CDCl$_3$, 300 MHz): δ (ppm): 1.34 (3H, t), 2.48 (3H, s), 2.83 (2H, q), 7.20 (1H, d), 7.28 (2H, s), 7.39 (4H, s), 7.44 (dd, 1H), 7.89 (s, 1H), 8.22 (d, 1H).

A nitrogen gas atmosphere was prepared in a reaction vessel, then, the compound 11-b (34.0 g), tris(dibenzylideneacetone)dipalladium(0) (0.9 g), (2-biphenyl)dicyclohexylphosphine (0.8 g) and tetrahydrofuran (136 mL) were added, and the mixture was stirred at room temperature. Thereafter, into this was dropped a lithiumbis(trimethylsilyl)amide tetrahydrofuran solution (1.3 mol/L, 108 mL) over a period of 1 hour, then, the mixture was stirred for 4 hours at 65° C. The reaction vessel was cooled using an ice bath, then, a hydrochloric acid aqueous solution (2 M, 240 mL) was added, and the mixture was stirred for 30 minutes while cooling the reaction vessel using an ice bath, thereby causing deposition of a solid. The deposited solid was filtrated, and the resultant residue was dissolved in a mixed solvent of toluene and hexane. Thereafter, to this was added a sodium hydroxide aqueous solution (2 M, 200 mL), to neutralize the liquid. The resultant reaction liquid was separated, and the resultant organic layer was washed with ion exchanged water. The resultant wash liquid was separated, and the resultant organic layer was dried over magnesium sulfate, filtrated, and the resultant filtrate was concentrated. Thereafter, to this were added hexane, toluene and activated carbon, and the mixture was stirred at room temperature for 30 minutes, then, filtrated through a filter paved with celite, and the resultant filtrate was concentrated under reduced pressure, thereby obtaining an oil. The resultant oil was purified by silica gel column chromatography (a future solvent of hexane and ethyl acetate), and dried under reduced pressure at 50° C., thereby obtaining a compound 11-c (19.0 g, red solid). The compound 11-c had a HPLC area percentage value of 99.5% or more.

$^1$H-NMR (CDCl$_3$, 300 MHz): δ (ppm): 1.33 (t, 3H), 2.46 (s, 3H), 2.81 (q, 2H), 6.81 (dd, 1H), 7.18 (s, 1H), 7.21 (s, 1H), 7.25-7.43 (m, 6H), 7.84 (s, 1H).

An argon gas atmosphere was prepared in a reaction vessel, then, the compound 11-c (17.5 g), 3-bromohexylbenzene (30.9 g), tris(dibenzylideneacetone)dipalladium(0) (0.5 g), tri-tert-butylphosphine tetrafluoroborate salt (0.3 g) and toluene (350 mL) were added, and the mixture was stirred at 50° C. Thereafter, to this was added sodium tert-butoxide (16.8 g), and the mixture was stirred for 4 hours at 110° C. The resultant reaction mixture was cooled down to room temperature, then, ion exchanged water (100 mL) was added and the mixture was washed, and the resultant wash liquid was separated. The resultant organic layer was washed with ion exchanged water, and the resultant wash liquid was separated. The resultant organic layer was dried over magnesium sulfate, then, filtrated, and the resultant filtrate was concentrated. Thereafter, to this were added hexane and activated carbon, and the mixture was stirred at room temperature for 30 minutes, then, filtrated through a filter paved with celite. The resultant filtrate was concentrated under reduced pressure, thereby obtaining an oil. The resultant oil was purified by silica gel column chromatography (a mixed solvent of hexane and ethyl acetate), and dried under reduced pressure at 50° C., thereby obtaining a compound 11-d (24.0 g, orange oil). The compound 11-d had a HPLC area percentage value of 97.6%.

$^1$H-NMR (CDCl$_3$, 300 MHz): δ (ppm): 0.85 (6H, t), 1.18-1.36 (16H, m), 1.54 (4H, m), 2.47 (4H, s), 2.48-2.60 (2H, m), 2.78 (2H, q), 6.77 (2H, d), 6.89 (2H, d), 6.96 (2H, s), 7.07-7.48 (10H, m), 7.81 (1H, s), 7.90 (1H, s).

A nitrogen gas atmosphere was prepared in a reaction vessel, then, the compound 11-d (23.3 g) and dichloromethane (396 mL) were added, and the mixture was cooled down to −10° C. Thereafter, to this was added benzyltrimethylammonium tribromide (29.3 g), and the mixture was stirred at −10° C. for 13 hours. Thereafter, to this was added a 10 wt % sodium sulfite aqueous solution, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated. Thereafter, to this were added heptane and activated carbon, and the mixture was stirred at room temperature for 30 minutes, then, filtrated through a filter paved with celite, and the resultant filtrate was concentrated under reduced pressure, thereby obtaining an oil. The resultant oil was purified by silica gel column chromatography (a mixed solvent of hexane and ethyl acetate) several times, and dried under reduced pressure at 50° C., thereby obtaining a compound 11 (17.0 g, oil). The compound 11 had a HPLC area percentage value of 99.5% or more.

LC-MS (APCI, positive): [M+H]$^+$777.

$^1$H-NMR (CDCl$_3$, 300 MHz): δ (ppm): 0.85 (6H, t), 1.19-1.37 (15H, m), 1.46-1.69 (4H, m), 2.48 (3H, s), 2.59 (4H, t), 2.79 (2H, q), 6.75 (2H, dd), 6.96 (2H, s), 7.12 (1H, d), 7.28-7.46 (9H, m), 7.82 (1H, s), 7.85 (1H, s).

<Synthesis Example 9> Synthesis of Compound 12

[Chemical Formula 105]

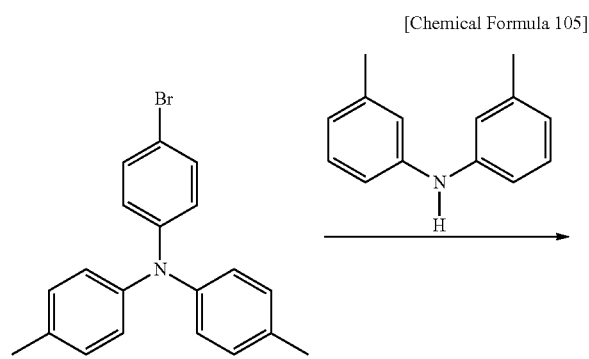

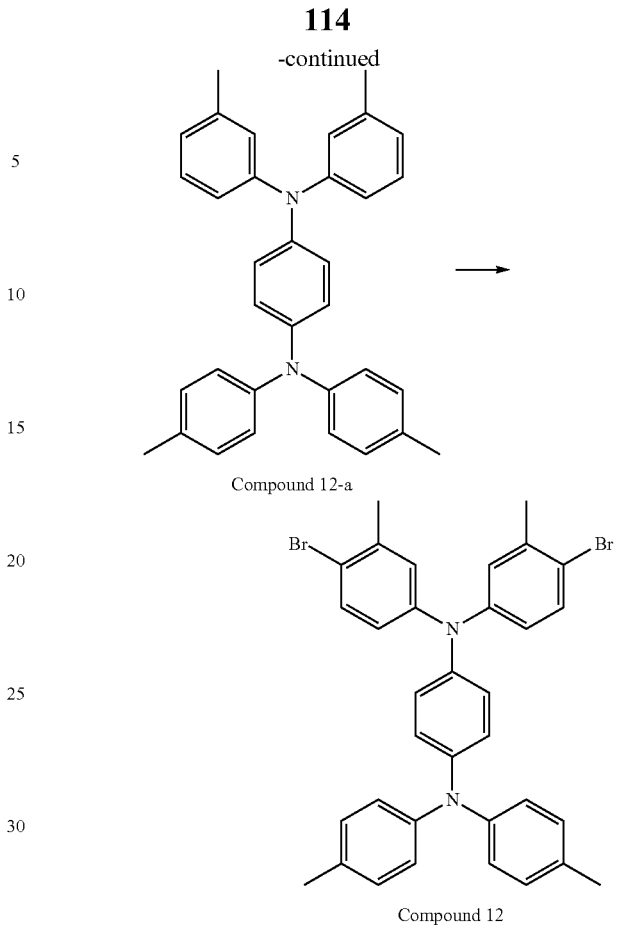

Compound 12-a

Compound 12

A nitrogen gas atmosphere was prepared in a reaction vessel, then, 4-bromo-4',4"-dimethyltriphenylamine (14.0 g), 3,3'-dimethyldiphenylamine (7.2 g), tris(dibenzylideneacetone)dipalladium(0) (0.3 g), tri-tert-butylphosphine tetrafluoroborate salt (0.2 g) and toluene (143 mL) were added, and the mixture was stirred at 50° C. Thereafter, to this was added sodium tert-butoxide (10.5 g), and the mixture was stirred for 4 hours at 80° C. The resultant reaction mixture was cooled down to room temperature, then, washed with ion exchanged water (100 mL). The resultant wash liquid was separated, and the resultant organic layer was washed with ion exchanged water. The resultant wash liquid was separated, and the resultant organic layer was dried over magnesium sulfate, then, filtrated, and the resultant filtrate was concentrated. Thereafter, to this were added toluene and activated carbon, and the mixture was stirred at room temperature for 30 minutes, then, filtrated through a filter paved with celite, and the resultant filtrate was concentrated under reduced pressure, thereby obtaining a white solid. An operation of recrystalling the resultant white solid by using a mixed solvent of toluene and methanol was repeated, then, the crystal was dried under reduced pressure at 50° C., thereby obtaining a compound 12-a (12.0 g, white solid). The compound 12-a had a HPLC area percentage value of 99.5% or more.

$^1$H-NMR (CDCl$_3$, 300 MHz): δ (ppm): 2.26 (12H, s), 6.57-7.23 (20H, br).

A nitrogen gas atmosphere was prepared in a reaction vessel, then, the compound 12-a (11.6 g) and chloroform (198 mL) were added, and the mixture was cooled down to −10° C. Thereafter, to this was added N-bromosuccinimide (8.8 g), and the mixture was stirred at −10° C. for 8 hours.

Thereafter, to this was added a 10 wt % sodium sulfite aqueous solution, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated, thereby obtaining a white solid. Thereafter, to this were added hexane and activated carbon, and the mixture was stirred at room temperature for 30 minutes, then, filtrated through a filter paved with celite, and the resultant filtrate was concentrated under reduced pressure. The resultant solid was recrystallized using acetone, then, recrystallized using a mixed solvent of toluene and methanol. Thereafter, to this were added hexane and activated white earth, and the mixture was stirred at room temperature for 30 minutes, then, filtrated through a filter paved with celite, and the resultant filtrate was concentrated under reduced pressure. Further, the resultant solid was recrystallized using a mixed solvent of toluene and methanol, then, the crystal was dried under reduced pressure at 50° C., thereby obtaining a compound 12 (10.0 g, white solid). The compound 12 had a HPLC area percentage value of 99.5% or more.

LC-MS (APCI, positive): [M+H]$^+$ 625

$^1$H-NMR (CDCl$_3$, 300 MHz): δ (ppm): 2.29 (s, 12H), 6.75 (s, 2H), 6.91-7.05 (br, 14H), 7.35 (d, 2H).

<Synthesis Example 10> Synthesis of Compound 13

[Chemical Formula 106]

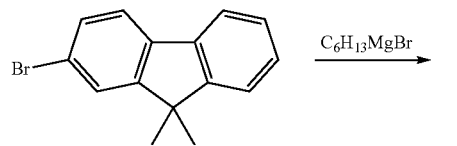

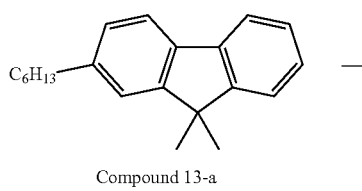

Compound 13-a

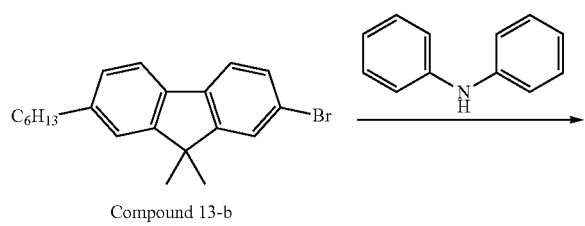

Compound 13-b

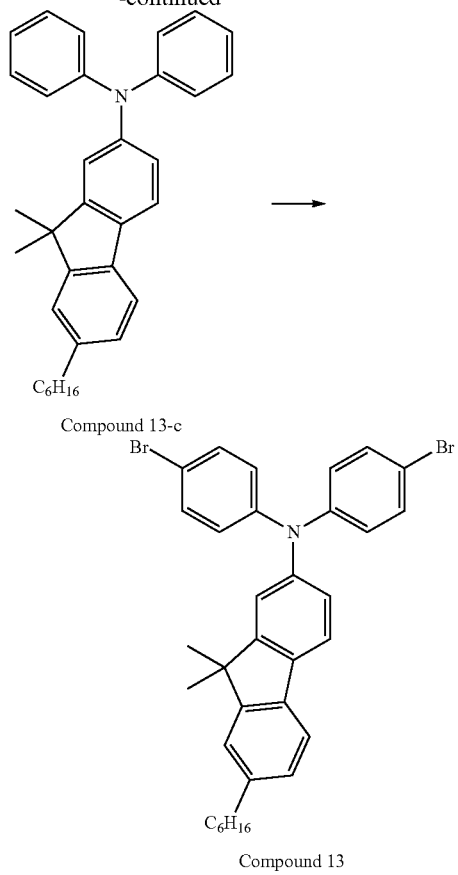

Compound 13

A nitrogen gas atmosphere was prepared in a reaction vessel, then, magnesium (100.9 g), tetrahydrofuran (2500 mL) and iodine (0.1 g) were added, and the mixture was stirred. Thereafter, to this was added 1-bromohexane (604.0 g), and the mixture was stirred at 60° C. for 3 hours, thereby preparing a Grignard reagent.

A nitrogen gas atmosphere was prepared in another reaction vessel, then, 2-bromo-9,9'-dimethylfluorene (250.0 g), dichloro[1,3-bis(diphenylphosphino)propane]nickel (37.2 g) and tetrahydrofuran (2500 mL) were added, and the mixture was stirred. Thereafter, into this was dropped the Grignard reagent prepared above at room temperature, and the mixture was stirred at 80° C. for 16 hours. The resultant reaction mixture was cooled down to room temperature, then, a hydrochloric acid aqueous solution (1.5 M, 3000 mL) was added, then, ethyl acetate was added. The resultant reaction liquid was separated, and the resultant organic layer was washed with ion exchanged water, dried over anhydrous sodium sulfate, then, filtrated, and the resultant filtrate was concentrated under reduced pressure, thereby obtaining an oil. The resultant oil was distilled under reduced pressure, thereby obtaining a compound 13-a (195 g, yellow oil). The compound 13-a had a HPLC area percentage value of 98.8%. This operation was repeated, thereby obtaining a necessary amount of the compound 13-a.

$^1$H-NMR (CDCl$_3$, 300 MHz): δ (ppm): 0.91 (t, J=6.93 Hz, 3H), 1.31-1.42 (m, 6H), 1.49 (s, 6H), 1.63-1.73 (m, 2H), 2.67-2.72 (m, 2H), 7.17 (dd, J=1.38, 7.71 Hz, 1H), 7.25-7.36 (m, 3H), 7.42-7.44 (m, 1H), 7.64 (d, J=7.71 Hz, 1H), 7.68-7.71 (m, 1H).

A nitrogen gas atmosphere was prepared in a reaction vessel, then, the compound 13-a (354.0 g) and dichloromethane (3540 mL) were added, and the reaction vessel was cooled using an ice bath. Thereafter, into this was dropped bromine (213.6 g) dissolved in dichloromethane (1770 mL) over a period of 2 hours, and the mixture was stirred for 16 hours while cooling the reaction vessel using an ice bath. Thereafter, to this was added a 10 wt % sodium sulfite aqueous solution, and the mixture was stirred. The resultant reaction liquid was separated, and the resultant organic layer was washed with ion exchanged water and saline water. The resultant wash liquid was separated, and the resultant organic layer was dried over sodium sulfate, then, filtrated, and the resultant filtrate was concentrated. The resultant concentrate was purified by silica gel column chromatography (a mixed solvent of hexane and ethyl acetate), then, dried under reduced pressure at 50° C., thereby obtaining a compound 13-b (250.0 g). The compound 13-b had a HPLC area percentage value of 97.6%.

$^1$H-NMR (CDCl$_3$, 300 MHz): δ (ppm): 0.90 (t, J=7.20 Hz, 3H), 1.32-1.40 (m, 6H), 1.48 (s, 6H), 1.63-1.68 (m, 2H), 2.66-2.70 (m, 2H), 7.17 (dd, J=0.80, 7.80 Hz, 1H), 7.23 (s, 1H), 7.44 (dd, J=1.60, 8.40 Hz, 1H), 7.54 (s, 1H), 7.55 (d, J=7.60 Hz, 1H), 7.60 (d, J=7.60 Hz, 1H).

A nitrogen gas atmosphere was prepared in a reaction vessel, then, the compound 13-b (250.0 g), diphenylamine (148.1 g), tri-tert-butylphosphine tetrafluoroborate salt (8.1 g), sodium tert-butoxide (168.2 g) and toluene (2500 mL) were added, and the mixture was stirred at 50° C. Thereafter, to this was added tris(dibenzylideneacetone)dipalladium(0) (12.8 g), and the mixture was stirred at 115° C. for 16 hours. The resultant reaction mixture was cooled down to room temperature, then, filtrated through a filter paved with celite. To the resultant filtrate were added ethyl acetate and ion exchanged water, then, the liquid was separated, and the resultant organic layer was washed with ion exchanged water and saline water. The resultant wash liquid was separated, and the resultant organic layer was dried over sodium sulfate, then, filtrated, and the resultant filtrate was concentrated. The resultant concentrate was further purified by silica gel column chromatography (a mixed solvent of petroleum and ethyl acetate), then, dried under reduced pressure at 50° C., thereby obtaining a compound 13-c (166.0 g). The compound 13-c had a HPLC area percentage value of 99.0%.

$^1$H-NMR (CDCl$_3$, 300 MHz): δ (ppm): 0.92 (t, J=7.00 Hz, 3H), 1.34-1.39 (m, 6H), 1.42 (s, 6H), 1.64-1.69 (m, 2H), 2.69 (br s, 2H), 7.00-7.05 (m, 3H), 7.14-7.16 (m, 5H), 7.19-7.21 (m, 2H), 7.26-7.29 (m, 4H), 7.55 (d, J=8.12 Hz, 2H).

A nitrogen gas atmosphere was prepared in a reaction vessel, then, the compound 13-c (83.0 g) and chloroform (830 mL) were added, and the mixture was cooled down to −30° C. Thereafter, into this was dropped N-bromosuccinimide (66.7 g) dissolved in N,N-dimethylformamide (415 mL) over a period of 45 minutes, then, the mixture was heated up to room temperature, then, stirred for 16 hours. Thereafter, to this was added ion exchanged water, and the mixture was washed. The resultant wash liquid was separated, and the resultant organic layer was washed with ion exchanged water. The resultant wash liquid was separated, and the resultant organic layer was dried over sodium sulfate, then, filtrated, and the resultant filtrate was concentrated. The resultant concentrate was purified by silica gel column chromatography (hexane), thereby obtaining a solid. The resultant solid was recrystallized using methanol, then, the crystal was dried under reduced pressure at 50° C., thereby obtaining a compound 13 (54.0 g, white solid). The compound 13 had a HPLC area percentage value of 99.5% or more.

$^1$H-NMR (CDCl$_3$, 300 MHz): δ (ppm): 0.91 (t, J=7.00 Hz, 3H), 1.34-1.39 (m, 6H), 1.42 (s, 6H), 1.65-1.69 (m, 2H), 2.69 (t, J=7.60 Hz, 2H), 6.99-7.01 (m, 5H), 7.14-7.17 (m, 2H), 7.22 (s, 1H), 7.35-7.38 (m, 4H), 7.56-7.58 (m, 2H).

<Synthesis Example 11> Synthesis of Compound 14

[Chemical Formula 107]

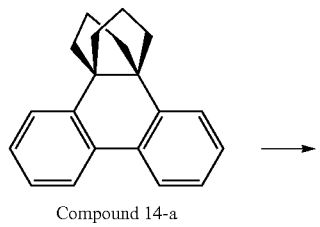

Compound 14-a

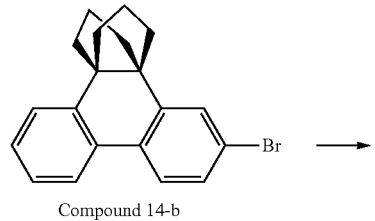

Compound 14-b

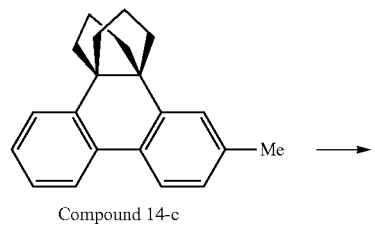

Compound 14-c

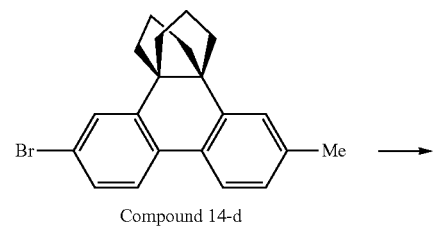

Compound 14-d

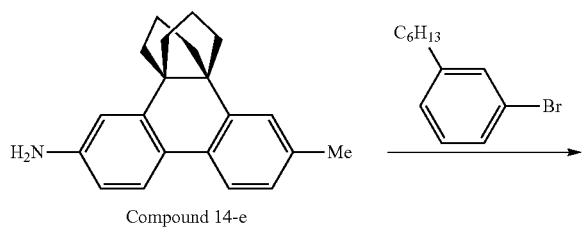

Compound 14-e

-continued

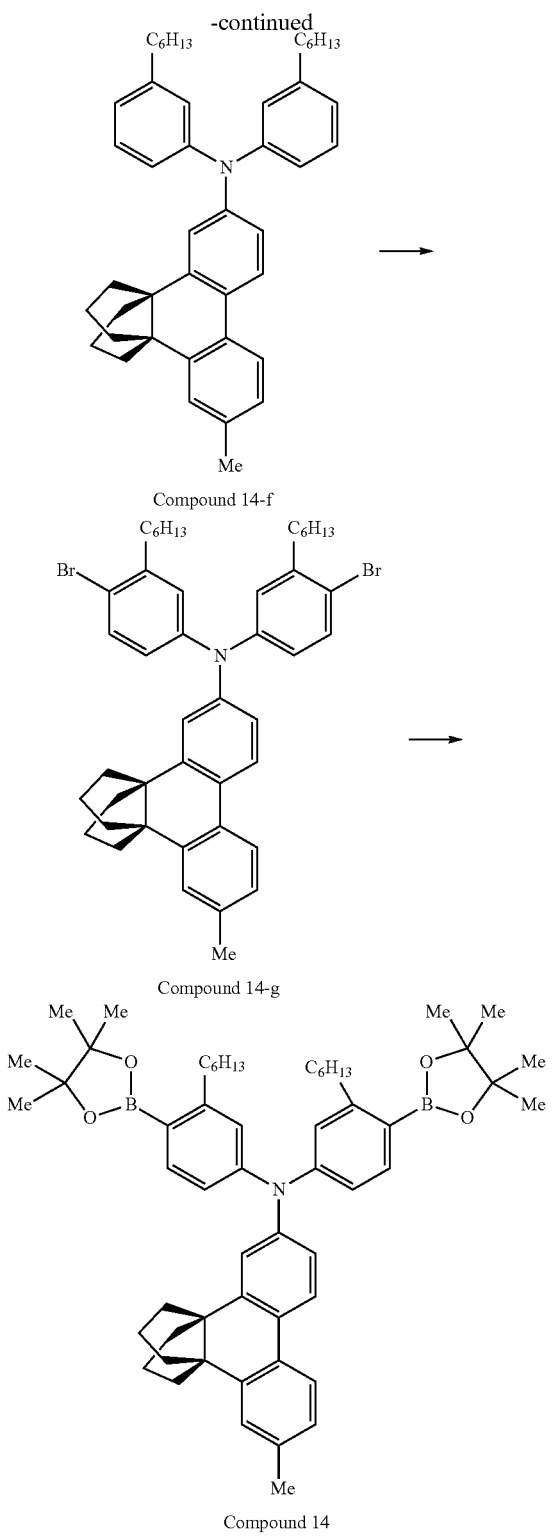

Compound 14-f

Compound 14-g

Compound 14

A nitrogen gas atmosphere was prepared in a reaction vessel, then, a compound 14-a (154.0 g), trifluoroacetic acid (200 mL) and chloroform (1200 mL) were added, and the mixture was stirred. Thereafter, into this was dropped bromine (99 g) dissolved in chloroform (990 mL) over a period of 3 hours. Thereafter, to this was added a 10 wt % sodium sulfite aqueous solution, and the mixture was stirred. The resultant reaction liquid was separated, and the resultant organic layer was washed with ion exchanged water and saturated sodium hydrogen carbonate water. The resultant wash liquid was separated, and the resultant organic layer was dried over magnesium sulfate, then, filtrated, and the resultant filtrate was concentrated. The resultant concentrate was purified by silica gel column chromatography (hexane), thereby obtaining a solid. To the resultant solid were added toluene and activated white earth, and the mixture was shaken at 50° C. for 30 minutes. The resultant reaction mixture was cooled down to room temperature, then, filtrated through a laminated glass filter paved with silica gel. The resultant filtrate was concentrated under reduced pressure, then, dried under reduced pressure at 50° C., thereby obtaining a compound 14-b (193.0 g, white solid). The compound 14-b had a HPLC area percentage value of 80.6%.

$^1$H-NMR (CDCl$_3$, 300 MHz): δ (ppm): 1.41-1.92 (4H, m), 1.95-2.16 (8H, m), 7.04 (1H, d), 7.18-7.27 (3H, m), 7.36 (1H, dd), 7.79 (1H, d), 7.87 (1H, d).

A nitrogen gas atmosphere was prepared in a reaction vessel, then, the compound 14-b (73.0 g), dichloro[1,3-bis(diphenylphosphino)propane]nickel (7.0 g) and cyclopentyl methyl ether (861 mL) were added, and the mixture was stirred. Thereafter, into this was dropped a methylmagnesium bromide ether solution (3 mol/L, 108 mL) over a period of 1 hour, and the mixture was stirred at 55° C. for 6 hours. The resultant reaction liquid was cooled down to room temperature, then, a hydrochloric acid aqueous solution (1 M, 100 mL) was added. The resultant reaction liquid was separated, and the resultant organic layer was washed with ion exchanged water. The resultant wash liquid was separated, and the resultant organic layer was dried over anhydrous magnesium sulfate, then, filtrated, and the resultant filtrate was concentrated under reduced pressure, thereby obtaining a solid. To the resultant solid were added toluene and activated carbon, and the mixture was stirred at room temperature for 1 hour, then, filtrated through a filter paved with silica gel and celite, and the resultant filtrate was concentrated under reduced pressure, thereby obtaining a solid. The resultant solid was recrystallized using isopropanol, then, the crystal was dried under reduced pressure at 50° C., thereby obtaining a compound 14-c (44.5 g, white solid). The compound 14-c had a HPLC area percentage value of 99.4%.

$^1$H-NMR (CDCl$_3$, 300 MHz): δ (ppm): 1.38-1.71 (4H, m), 1.94-2.18 (8H, m), 2.36 (3H, s), 7.04 (1H, d), 7.18-7.27 (3H, m), 7.36 (1H, dd), 7.79 (1H, d), 7.87 (1H, d).

A nitrogen gas atmosphere was prepared in a reaction vessel, then, the compound 14-c (44.5 g) and dichloromethane (705 mL) were added, and the vessel was cooled using an ice bath containing sodium chloride. Thereafter, into this was dropped bromine (26 g) dissolved in dichloromethane (26 mL) over a period of 2 hours, and the mixture was stirred for 5 hours while cooling the reaction vessel using an ice bath containing sodium chloride. Thereafter, into this was dropped a 10 wt % sodium sulfite aqueous solution, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated. To the resultant concentrate were added toluene and activated carbon, and the mixture was stirred at room temperature for 1 hour, then, filtrated through a filter paved with silica gel and celite, and the resultant filtrate was concentrated under reduced pressure, thereby obtaining a solid. The resultant solid was recrystallized using a mixed solution of toluene and isopropanol, then, the crystal was dried under reduced pressure at 50° C., thereby obtaining a compound 14-d (51.8 g, white solid). The compound 14-d had a HPLC area percentage value of 98.9%. This operation was repeated, thereby obtaining a necessary amount of the compound 14-d.

A nitrogen gas atmosphere was prepared in a reaction vessel, then, the compound 14-d (55.0 g), tris(dibenzylideneacetone)dipalladium(0) (1.4 g), (2-biphenyl)dicyclohexylphosphine (1.3 g) and tetrahydrofuran (220 mL) were added, and the mixture was stirred. Thereafter, into this was dropped a lithiumbis(trimethylsilyl)amide tetrahydrofuran solution (1.3 mol/L, 180 mL) over a period of 1 hour, then, the mixture was stirred at 65° C. for 5 hours. The reaction vessel was cooled using an ice bath, then, a hydrochloric acid aqueous solution (2M, 400 mL) was added, and the mixture was stirred for 1 hour while cooling the reaction vessel using an ice bath. Thereafter, to this was added a sodium hydroxide aqueous solution (2 M, 400 mL), thereby attaining neutralization. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated. The resultant concentrate was dissolved in a mixed solvent of acetonitrile and toluene, then, a hydrochloric acid aqueous solution (12 M, 30 mL) was added, and the mixture was stirred, then, concentrated, thereby obtaining a hydrochloride. To the resultant hydrochloride was added hexane, and the mixture was suspended and stirred for 30 minutes, then, filtrated. To the resultant residue was added tetrahydrofuran and the mixture was suspended and stirred for 30 minutes, then, filtrated. To the resultant residue were added a sodium hydroxide aqueous solution (2 M, 150 mL) and methanol, and the mixture was stirred, then, extracted using chloroform. The resultant organic layer was dried over magnesium sulfate, then, filtrated, and the resultant filtrate was concentrated. The resultant solid was recrystallized using a mixed solution of hexane and toluene, then, the crystal was dried under reduced pressure at 50° C., thereby obtaining a compound 14-e (33.0 g, pale yellow solid). The compound 14-e had a HPLC area percentage value of 99.5% or more.

$^1$H-NMR (CDCl$_3$, 300 MHz): δ (ppm): 1.39-1.69 (4H, m), 1.93-2.15 (8H, m), 2.34 (3H, s), 3.66 (2H, s), 6.57 (1H, dd), 6.67 (1H, d), 6.99 (1H, d), 7.13 (1H, s), 7.66 (1H, d), 7.69 (1H, d).

A nitrogen gas atmosphere was prepared in a reaction vessel, then, the compound 14-e (30.7 g), 3-bromohexylbenzene (56.2 g), tris(dibenzylideneacetone)dipalladium(0) (1.0 g), tri-tert-butylphosphine tetrafluoroborate salt (0.6 g) and toluene (580 mL) were added, and the mixture was stirred at 50° C. Thereafter, to this was added sodium tert-butoxide (30.5 g), then, the mixture was stirred at 110° C. for 8 hours. Thereafter, to this was added toluene, and the mixture was filtrated through a filter paved with celite, and the resultant filtrate was washed with ion exchanged water. The resultant wash liquid was separated, and the resultant organic layer was concentrated under reduced pressure, thereby obtaining a coarse product. Thereafter, to this were added hexane and methanol, and the liquid was separated. The resultant hexane layer was washed with methanol. The resultant wash liquid was separated, and the resultant hexane layer was concentrated under reduced pressure. Thereafter, to this were added hexane and activated carbon, and the mixture was stirred at room temperature for 30 minutes, then, filtrated through a filter paved with celite. The resultant filtrate was concentrated under reduced pressure, thereby obtaining an oil. The resultant oil was purified by silica gel column chromatography (a mixed solvent of hexane and ethyl acetate), thereby obtaining a compound 14-f (44.0 g, colorless clear oil). The compound 14-f had a HPLC area percentage value of 99.4%.

LC-MS (APCI, positive): [M+H]$^+$ 610.

$^1$H-NMR (CDCl$_3$, 300 MHz): δ (ppm): 0.87 (6H, t), 1.20-1.66 (20H, m), 1.84-2.18 (8H, m), 2.35 (3H, s), 2.51 (4H, t), 6.80-7.19 (12H, m), 7.70 (2H, t).

A nitrogen gas atmosphere was prepared in a reaction vessel, then, the compound 14-f (43.0 g) and dichloromethane (731 mL) were added, and the reaction vessel was cooled using an ice bath. Thereafter, to this was added benzyltrimethylammonium tribromide (55.0 g), and the mixture was stirred for 12 hours while cooling the reaction vessel using an ice bath. Thereafter, into this was dropped a 10 wt % sodium sulfite aqueous solution, and the mixture was stirred. The resultant reaction liquid was separated, and the resultant organic layer was washed with ion exchanged water. The resultant wash liquid was separated, and the resultant organic layer was dried over magnesium sulfate, then, filtrated, and the resultant filtrate was concentrated. Thereafter, to this were added hexane and activated carbon, and the mixture was stirred at room temperature for 30 minutes, then, filtrated through a filter paved with celite. The resultant filtrate was concentrated under reduced pressure, thereby obtaining an oil. The resultant oil was purified by silica gel column chromatography (a mixed solvent of hexane and ethyl acetate) several times, and dried under reduced pressure at 40° C., thereby obtaining a compound 14 g (12.5 g, white solid). The compound 14 g had a HPLC area percentage value of 99.5% or more.

LC-MS (APCI, positive): [M+H]$^+$ 766.

$^1$H-NMR (CDCl$_3$, 300 MHz): δ (ppm): 0.86 (6H, t), 1.20-1.69 (20H, m), 1.80-2.19 (8H, m), 2.36 (3H, s), 2.60 (4H, t), 6.77 (1H, d), 6.79 (1H, d), 6.83 (1H, dd), 6.97 (2H, d), 7.01 (1H, d), 7.04 (1H, d), 7.15 (1H, s), 7.35 (1H, s), 7.38 (1H, s), 7.69 (1H, d), 7.73 (1H, d).

A nitrogen gas atmosphere was prepared in a reaction vessel, then, bis-pinacoldiboron (12.4 g), cyclopentyl methyl ether (100 mL), potassium acetate (9.4 g) and [1,1'-bis(diphenylphosphino)ferrocene]palladium dichloride (0.4 g) were added, and the mixture was heated up to 100° C. Thereafter, into this was dropped the compound 14-g (12.5 g) dissolved in cyclopentyl methyl ether (25 mL) over a period of 2 hours, and the mixture was stirred for 4 days under reflux. The resultant reaction mixture was cooled down to room temperature, then, ion exchanged water was added, and the mixture was washed. The resultant wash liquid was separated, and the resultant organic layer was washed with ion exchanged water. The resultant wash liquid was separated, and the resultant organic layer was dried over magnesium sulfate, then, filtrated, and the resultant filtrate was concentrated. Thereafter, to this were added hexane, toluene and activated carbon, and the mixture was stirred at room temperature for 30 minutes, then, filtrated through a filter paved with celite. The resultant filtrate was concentrated under reduced pressure, thereby obtaining a solid. The resultant solid was purified by silica gel column chromatography (a mixed solvent of hexane and toluene), and dried under reduced pressure at 50° C., thereby obtaining a compound 14 (5.9 g, white solid). The compound 14 had a HPLC area percentage value of 99.5% or more.

LC-MS (APCI, positive): [M+H]$^+$862.

$^1$H-NMR (CDCl$_3$, 300 MHz): δ (ppm): 0.86 (6H, t), 1.18-1.68 (44H, m), 1.83-2.19 (8H, m), 2.35 (3H, s), 2.75

(4H, t), 6.83-6.94 (5H, m), 7.00 (1H, dd), 7.12 (1H, d), 7.15 (1H, d), 7.62 (1H, s), 7.65 (1H, s), 7.69 (1H, d), 7.72 (1H, d).

<Synthesis Example 12> Synthesis of Compound 15

"first organic layer") and an aqueous layer (hereinafter, referred to as "first aqueous layer"). The first aqueous layer was washed with heptane (90 mL) twice. The resultant wash liquid was separated, thereby obtaining an organic layer (hereinafter, referred to as "second organic layer"). The first organic layer and the second organic layer were combined,

[Chemical Formula 108]

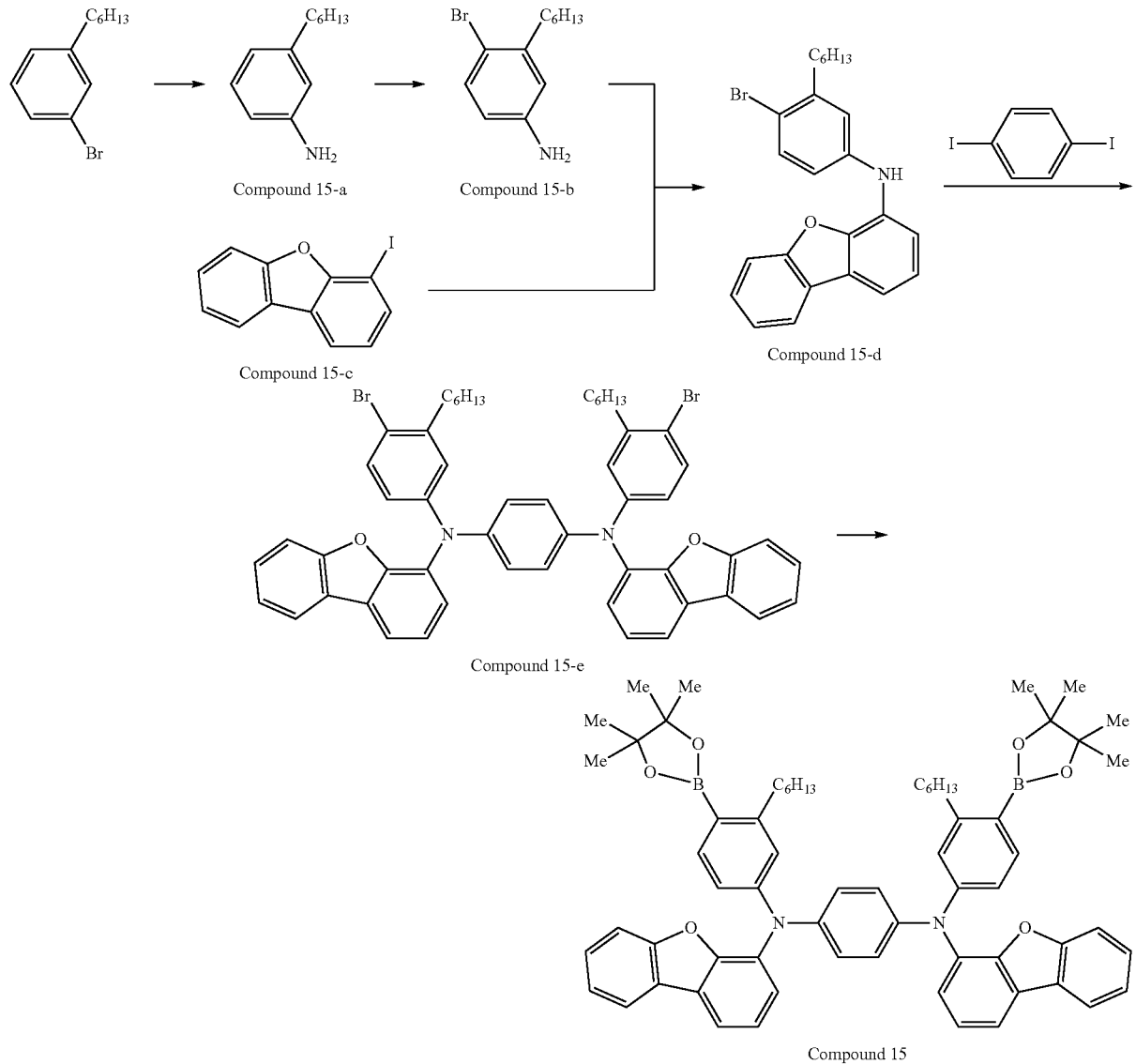

An argon gas atmosphere was prepared in a reaction vessel, then, 3-bromohexylbenzene (45.0 g), tris(dibenzylideneacetone)dipalladium(0) (1.7 g), tri-tert-butylphosphine tetrafluoroborate salt (1.0 g) and tetrahydrofuran (225 mL) were added, then, a lithiumbis(trimethylsilyl)amide tetrahydrofuran solution (1.3 mol/L, 179 mL) was dropped, then, the mixture was stirred at 65° C. for 2 hours. The reaction vessel was cooled using an ice bath, then, a hydrochloric acid aqueous solution (2.4 M, 475 mL) was dropped. Thereafter, the ice bath was detached from the reaction vessel, and the mixture was stirred at room temperature for 1 hour. The resultant reaction mixture was separated, thereby obtaining an organic layer (hereinafter referred to as dried over magnesium sulfate, then, filtrated, and the resultant filtrate was concentrated, thereby obtaining an oil. The resultant oil was purified by silica gel column chromatography (a mixed solvent of hexane and ethyl acetate), thereby obtaining a compound 15-a (32.0 g, brown oil). The compound 15-a had a HPLC area percentage value of 98.6%.

1H-NMR (CDCl3, 300 Hz): δ (ppm): 0.82-0.96 (3H, m), 1.10-1.65 (8H, m), 2.45-2.57 (2H, m), 3.60 (2H, br.s), 6.45-6.62 (3H, m), 7.00-7.10 (1H, m).

An argon gas atmosphere was prepared in a reaction vessel, then, the compound 15-a (17.7 g) and chloroform (177 mL) were added, and the mixture was cooled down to a temperature in a range from −20° C. to −25° C. Thereafter, to this was added N-bromosuccinimide (17.77 g). Thereafter, the reaction vessel was cooled using an ice bath, and a saturated sodium sulfite aqueous solution (15 mL) was added, and the mixture was stirred. The resultant reaction liquid was separated, and the resultant organic layer was washed with ion exchanged water. The resultant wash liquid was separated, dried over magnesium sulfate, then, filtrated, and the resultant filtrate was concentrated, thereby obtaining a solid. The resultant solid was purified by silica gel column chromatography (a mixed solvent of hexane and ethyl acetate), thereby obtaining a compound 15-b (14.6 g). The compound 15-b had a HPLC area percentage value of 98.4%.

1H-NMR (CDCl3, 300 Hz): δ (ppm): 0.80-0.96 (3H, m), 1.22-1.65 (8H, m), 2.55-2.64 (2H, m), 3.58 (2H, br.s), 6.35-6.60 (2H, m), 7.18-7.28 (1H, m).

An argon gas atmosphere was prepared in a reaction vessel, then, a compound 15-c (13.0 g) synthesized according to a method described in EU Patent Application Publication No. 2594573, [1,1'-bis(diphenylphosphine)ferrocene] palladium dichloride (0.72 g), sodium tert-butoxide (8.5 g) and toluene (195 mL) were added, then, a toluene solution prepared by dissolving the compound 15-b (13.0 g) in toluene (10 mL) was dropped, and the mixture was stirred at 110° C. for 7 hours. The resultant reaction mixture was cooled down to room temperature, then, toluene (50 mL) and ion exchanged water (50 mL) were added, and the mixture was washed. The resultant wash liquid was separated, and the resultant organic layer was washed with ion exchanged water. The resultant wash liquid was separated, and the resultant organic layer was dried over magnesium sulfate, then, filtrated, and the resultant filtrate was concentrated, thereby obtaining a solid. The resultant solid was purified by silica gel column chromatography (a mixed solvent of hexane and toluene), thereby obtaining a compound 15-d (14.6 g, white crystal). The compound 15-d had a HPLC area percentage value of 99.4%.

An argon gas atmosphere was prepared in a reaction vessel, then, copper(I) iodide (0.72 g), trans-1,2-diaminocyclohexane (0.86 g), xylene (50 mL), the compound 15-d (8.0 g), 1, 4-diiodobenzene (2.5 g) and sodium-tert-amoxid (5.0 g) were added, and the mixture was stirred at 85° C. for 12 hours. The resultant reaction mixture was cooled down to room temperature, then, toluene (20 mL), hexane (20 mL) and activated carbon (2.8 g) were added, and the mixture was stirred at room temperature for 1 hour, then, filtrated through a filter paved with silica gel and celite. The resultant filtrate was concentrated under reduced pressure, thereby obtaining a solid. The resultant solid was recrystallized using a mixed solvent of toluene and methanol, then, the crystal was dried under reduced pressure at 50° C., thereby obtaining a compound 15-e (4.8 g, white crystal). The compound 15-e had a HPLC area percentage value of 99.5% or more.

LC-MS (APC1, positive): [M+H]+ 916.

An argon gas atmosphere was prepared in a reaction vessel, then, bis-pinacoldiborane (3.31 g), dimethoxyethane (72 mL), potassium acetate (3.08 g): [1,1'-bis(diphenylphosphino)ferrocene]palladium dichloride (0.72 g) and compound 15-e (4.8 g) were added, and the mixture was refluxed with heating (6 hours). The resultant reaction mixture was cooled down to room temperature, then, toluene (72 mL) was added, and the mixture was filtrated through a filter paved with silica gel and celite, and the resultant filtrate was concentrated under reduced pressure, thereby obtaining a solid. The resultant solid was dissolved in toluene (50 mL), then, the solution was washed with ion exchanged water. The resultant wash liquid was separated, and to the resultant organic layer was added activated carbon (2.5 g), and the mixture was stirred, then, filtrated through a filter paved with celite. The resultant filtrate was concentrated under reduced pressure, thereby obtaining a solid. The resultant solid was purified by silica gel column chromatography (a mixed solvent of hexane and toluene), then, recrystallized using a mixed solvent of toluene and acetonitrile, then, the crystal was dried under reduced pressure at 50° C., thereby obtaining a compound 15 (3.9 g). The compound 15 had a HPLC area percentage value of 99.5% or more.

1H-NMR (CDCl3, 300 Hz): δ (ppm): 0.78-0.85 (6H, m), 1.12-1.50 (40H, m), 2.73 (4H, t), 6.80 (6H, br, s), 7.05 (6H, br.s), 7.22-7.40 (6H, m), 7.58-7.80 (4H, m), 7.94 (2H, d).

<Synthesis Example 13> Synthesis of Iridium Complex 1

An iridium complex 1 shown below was synthesized according to a method described in WO2009/131255.

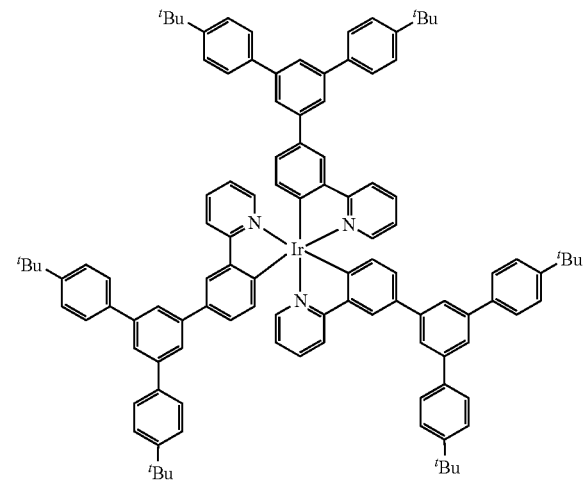

[Chemical Formula 109]

Iridium complex 1

<Synthesis Example 14> Synthesis of Compounds CM1 to CM6, Compounds CM8 to CM10, Compounds CM12 to CM16, Compounds CM20 to CM21 and Compounds CM26 to CM27

Compounds CM1 to CM6, compounds CM8 to CM10, compounds CM12 to CM16 and compounds CM20 to CM21 synthesized according to methods described in the following documents and showing a HPLC area percentage value of 99.5% or more were used. Compounds CM26 to CM27 synthesized according to a method described in the following document and showing a HPLC area percentage value of 99.5% or more were used.

The compound CM7 is the same as the compound 8 synthesized above, the compound CM11 is the same as the compound 10 synthesized above, the compound CM18 is the same as the compound 14 synthesized above, the compound CM19 is the same as the compound 11 synthesized above, the compound CM22 is the same as the compound 12 synthesized above, the compound CM23 is the same as the compound 15 synthesized above, the compound CM24 is the same as the compound 7 synthesized above, and the compound CM25 is the same as the compound 13 synthesized above.

Compounds CM1 and CM4: JP-A No. 2010-189630

Compounds CM2 and CM3: International Publication WO2012/086671

Compound CM5: JP-A No. 2004-143419

Compound CM6: International Publication WO2002/045184

Compound CM8: Journal of Polymer Science, Part A: Polymer Chemistry, 2011, vol. 49, #2, p. 352-360

Compound CM9: JP-A No. 2008-106241

Compound CM10: JP-A No. 2010-215886

Compound CM12: JP-A No. 2007-511636

Compound CM13: JP-A No. 2011-174061

Compounds CM14 and CM15: JP-A No. 2011-174062

Compound CM16: International Publication WO2007/071957

Compounds CM20 and CM21: International Publication WO2013/191088

Compounds CM26 and CM27: Journal of Polymer Science, Part A: Polymer Chemistry, 2011, vol. 49, #2, p. 352-360

[Chemical Formula 110]

Compound CM1

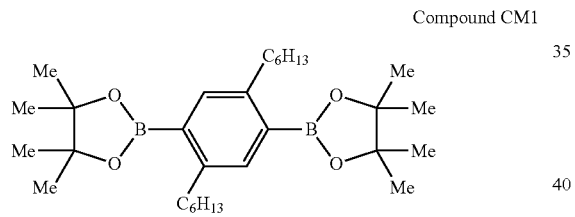

Compound CM2

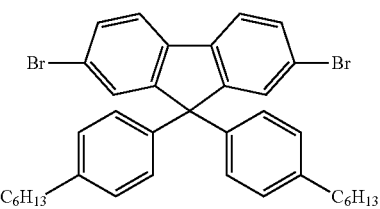

Compound CM3

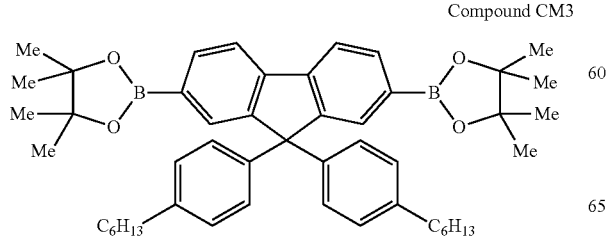

Compound CM4

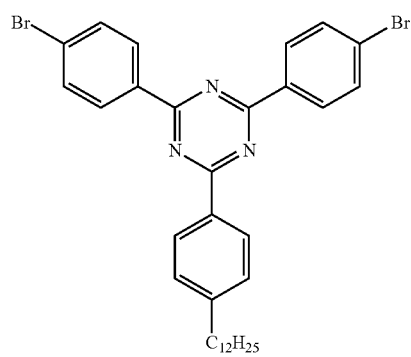

Compound CM5

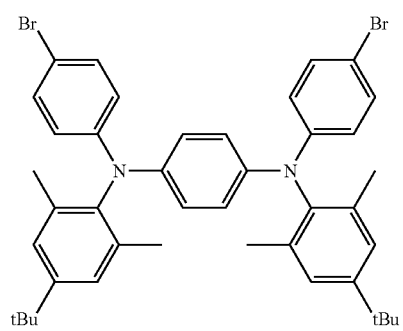

Compound CM6

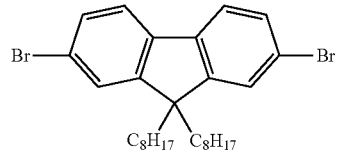

[Chemical Formula 111]

Compound CM8

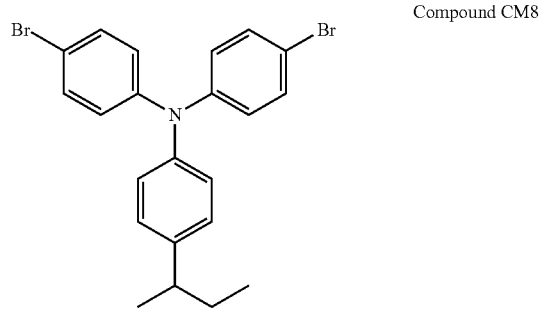

Compound CM9

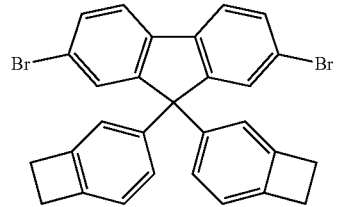

Compound CM10

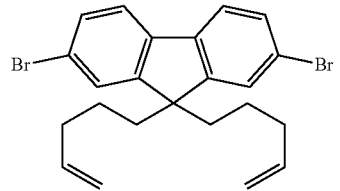

-continued
[Chemical Formula 112]
Compound CM12
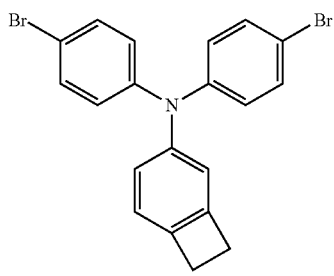
Compound CM13
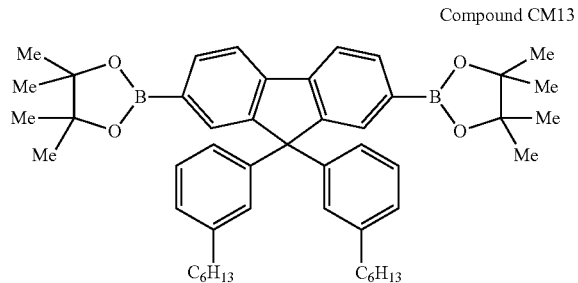
[Chemical Formula 113]
Compound CM14
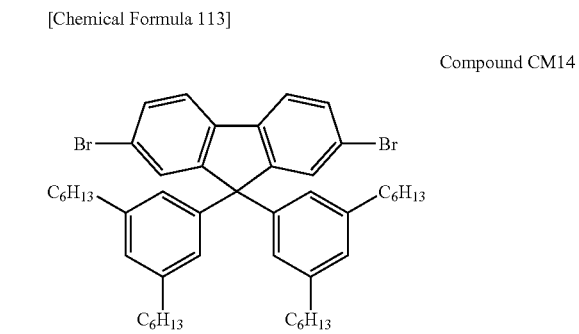
Compound CM15
Compound CM16
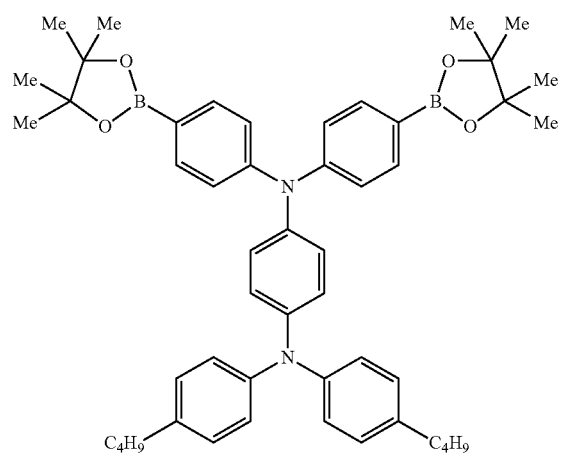
-continued
[Chemical Formula 114]
Compound CM20
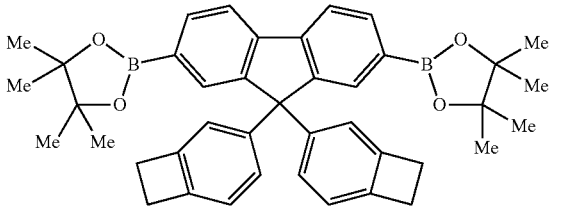
Compound CM21
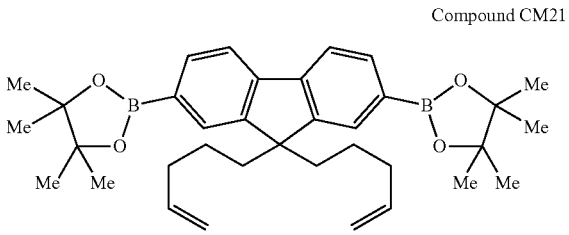
[Chemical Formula 115]
Compound CM7
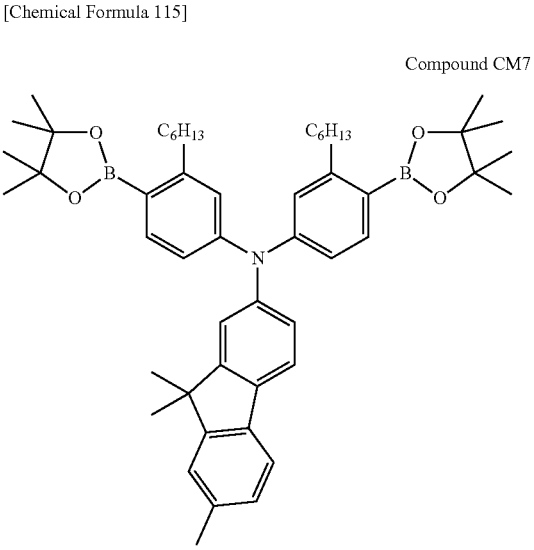
Compound CM11
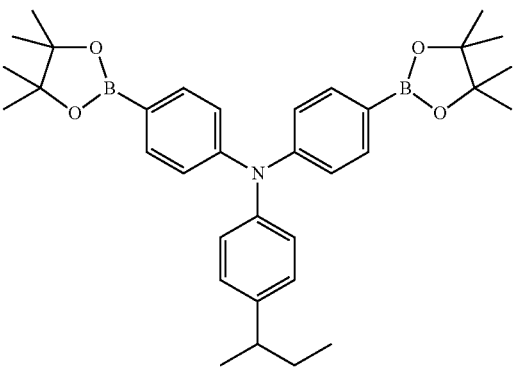

131
-continued
[Chemical Formula 116]
Compound CM18
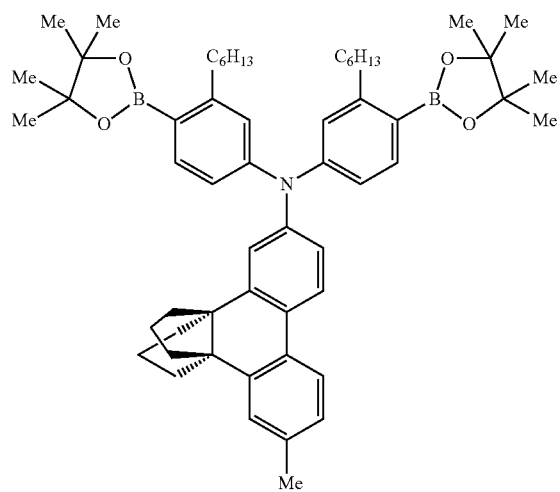
Compound CM19
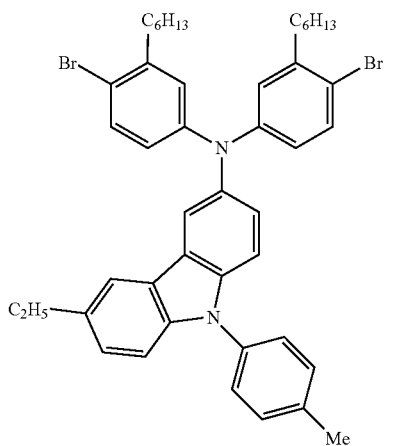
Compound CM22
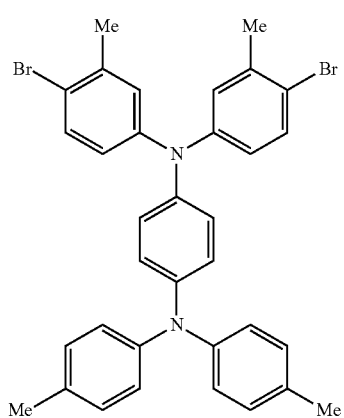
132
-continued
[Chemical Formula 117]
Compound CM23
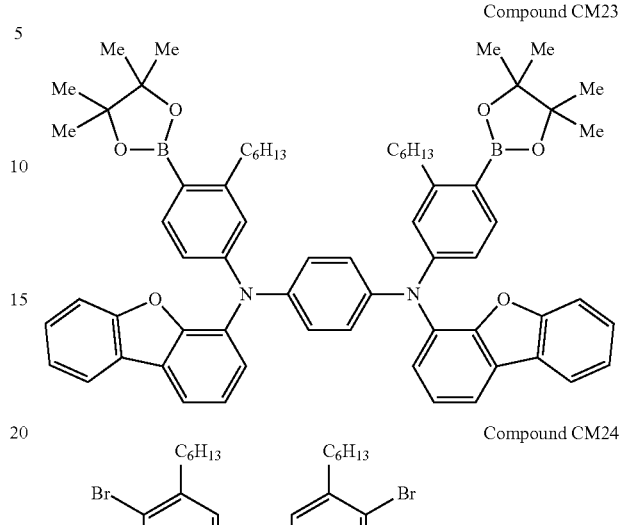
Compound CM24
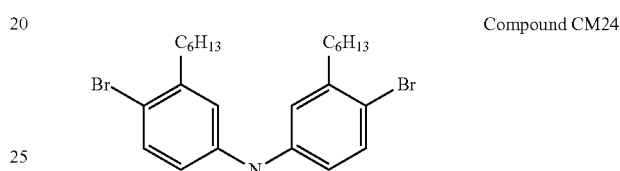
Compound CM25
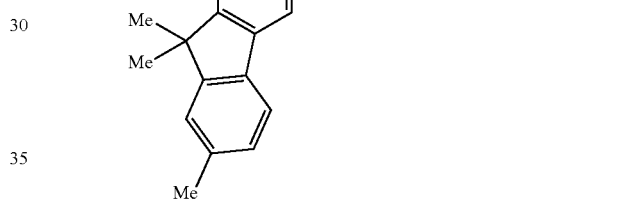
Compound CM26
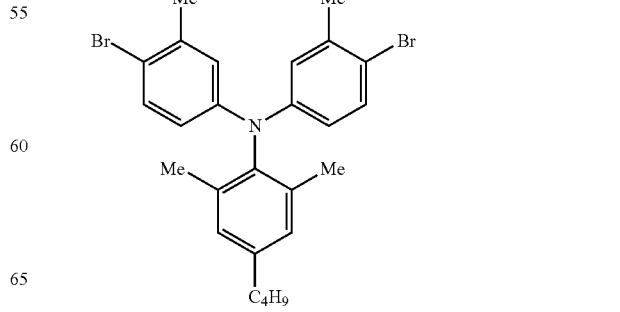

Compound CM27

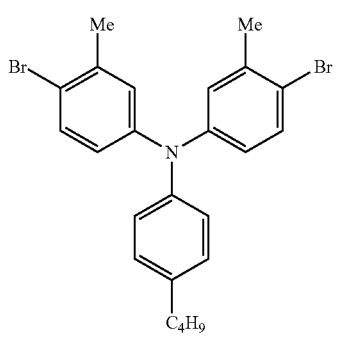

<Example 1> Synthesis of Polymer Compound 1

(Step 1) An inert gas atmosphere was prepared in a reaction vessel, then, the compound CM7 (0.9870 g), the compound CM8 (0.4602 g), the compound CM9 (0.0669 g), the compound CM10 (0.0578 g), dichlorobis(tris-o-methoxyphenylphosphine)palladium (1.1 mg) and toluene (49 mL) were added, and the mixture was heated at 105° C.

(Step 2) Thereafter, into this was dropped a 20 wt % tetrabutylammonium hydroxide aqueous solution (9.2 g), and the mixture was stirred at 105° C. for 6 hours.

(Step 3) Thereafter, to this were added phenylboronic acid (15.2 mg) and dichlorobis(tris-o-methoxyphenylphosphine)palladium (1.1 mg), and the mixture was stirred at 105° C. for 16 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitation. The resultant precipitate was dissolved in toluene, and the solution was purified by passing through an alumina column and a silica gel column in this order. The resultant solution was dropped into methanol and the mixture was stirred, thereby observing precipitation. The resultant precipitate was isolated by filtration and dried, thereby obtaining 0.75 g of a polymer compound 1. The polymer compound 1 had a Mn of $7.1 \times 10^4$ and a Mw of $3.7 \times 10^5$.

The polymer compound 1 is a copolymer constituted of a constitutional unit derived from the compound CM7, a constitutional unit derived from the compound CM8, a constitutional unit derived from the compound CM9 and a constitutional unit derived from the compound CM10 at a molar ratio of 50:40:5:5 according to the theoretical values calculated from the amounts of the charged raw materials.

<Comparative Example 1> Synthesis of Polymer Compound 2

(Step 1) An inert gas atmosphere was prepared in a reaction vessel, then, the compound CM11 (0.8134 g), the compound CM8 (0.5523 g), the compound CM9 (0.0803 g), the compound CM10 (0.0693 g), dichlorobis(tris-o-methoxyphenylphosphine)palladium (1.3 mg) and toluene (42 mL) were added, and the mixture was heated at 105° C.

(Step 2) Thereafter, into this was dropped a 20 wt % tetrabutylammonium hydroxide aqueous solution (9.2 g), and the mixture was stirred at 105° C. for 6 hours.

(Step 3) Thereafter, to this were added phenylboronic acid (18.3 mg) and dichlorobis(tris-o-methoxyphenylphosphine) palladium (1.3 mg), and the mixture was stirred at 105° C. for 16 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 0.75 g of a polymer compound 2. The polymer compound 1 had a Mn of $1.9 \times 10^4$ and a Mw of $2.5 \times 10^5$.

The polymer compound 2 is a copolymer constituted of a constitutional unit derived from the compound CM11, a constitutional unit derived from the compound CM8, a constitutional unit derived from the compound CM9 and a constitutional unit derived from the compound CM10 at a molar ratio of 50:40:5:5 according to the theoretical values calculated from the amounts of the charged raw materials.

<Synthesis Example 15> Synthesis of Polymer Compound 3

The polymer compound 3 was synthesized according to a synthesis method described in JP-A No. 2012-36388 using compounds shown in Table 3 below. The polymer compound 3 had a Mn of $8.2 \times 10^4$ and a Mw of $2.1 \times 10^5$. The polymer compound 3 is a copolymer constituted of constitutional units derived from respective compounds at a molar ratio shown in Table 3 below according to the theoretical values calculated from the charged raw materials.

TABLE 3

| polymer compound 3 | | | |
|---|---|---|---|
| compound | CM1 | CM2 | CM4 |
| molar ratio [mol %] | 50 | 40 | 10 |

<Synthesis Example 16> Synthesis of Polymer Compound 4

The polymer compound 4 was synthesized according to a synthesis method described in JP-A No. 2012-216815 using compounds shown in Table 4 below. The polymer compound 4 had a Mn of $1.0 \times 10^4$ and a Mw of $2.6 \times 10^5$. The polymer compound 4 is a copolymer constituted of constitutional units derived from respective compounds at a molar ratio shown in Table 4 below according to the theoretical values calculated from the charged raw materials.

TABLE 4

| polymer compound 4 | | | |
| --- | --- | --- | --- |
| compound | CM3 | CM6 | CM5 |
| molar ratio [mol %] | 50 | 45 | 5 |

<Example 2> Synthesis of Polymer Compound 5

(Step 1) An inert gas atmosphere was prepared in a reaction vessel, then, the compound CM7 (1.1807 g), the compound CM14 (0.9810 g), the compound CM9 (0.0803 g), the compound CM10 (0.0693 g) and toluene (34 mL) were added, and the mixture was heated at 90° C.

(Step 2) To this was added dichlorobis(tris-o-methoxyphenylphosphine)palladium (1.3 mg), thereafter, a 20 wt % tetrabutylammonium hydroxide aqueous solution (22.9 g) was dropped, and the mixture was stirred at 90° C. for 6 hours.

(Step 3) Thereafter, to this were added phenylboronic acid (73.2 mg) and dichlorobis(tris-o-methoxyphenylphosphine) palladium (1.3 mg), and the mixture was stirred at 90° C. for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was collected by filtration and dried, thereby obtaining 1.22 g of a polymer compound 5. The polymer compound 5 had a Mn of $5.3 \times 10^4$ and a Mw of $2.0 \times 10^5$.

The polymer compound 5 is a copolymer constituted of a constitutional unit derived from the compound CM7, a constitutional unit derived from the compound CM14, a constitutional unit derived from the compound CM9 and a constitutional unit derived from the compound CM10 at a molar ratio of 50:40:5:5 according to the theoretical values calculated from the amounts of the charged raw materials.

<Example 3> Synthesis of Polymer Compound 6

(Step 1) An inert gas atmosphere was prepared in a reaction vessel, then, the compound CM18 (1.0625 g), the compound CM14 (0.8175 g), the compound CM9 (0.0669 g), the compound CM10 (0.0578 g) and toluene (30 mL) were added, and the mixture was heated at 90° C.

(Step 2) To this was added dichlorobis(tris-o-methoxyphenylphosphine)palladium (1.1 mg), thereafter, a 20 wt % tetrabutylammonium hydroxide aqueous solution (20.2 g) was dropped, and the mixture was stirred at 90° C. for 7 hours.

(Step 3) Thereafter, to this were added phenylboronic acid (61.0 mg) and dichlorobis(tris-o-methoxyphenylphosphine) palladium (1.1 mg), and the mixture was stirred at 90° C. for 17 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.06 g of a polymer compound 6. The polymer compound 6 had a Mn of $5.2 \times 10^4$ and a Mw of $2.2 \times 10^5$.

The polymer compound 6 is a copolymer constituted of a constitutional unit derived from the compound CM18, a constitutional unit derived from the compound CM14, a constitutional unit derived from the compound CM9 and a constitutional unit derived from the compound CM10 at a molar ratio of 50:40:5:5 according to the theoretical values calculated from the amounts of the charged raw materials.

<Example 4> Synthesis of Polymer Compound 7

(Step 1) An inert gas atmosphere was prepared in a reaction vessel, then, the compound CM15 (0.8866 g), the compound CM20 (0.0780 g), the compound CM21 (0.0698 g), the compound CM19 (1.0041 g) and toluene (31 mL) were added, and the mixture was heated at 90° C.

(Step 2) To this was added dichlorobis(tris-o-methoxyphenylphosphine)palladium (1.1 mg), thereafter, a 20 wt % tetrabutylammonium hydroxide aqueous solution (20.4 g) was dropped, and the mixture was stirred at 90° C. for 7 hours.

(Step 3) Thereafter, to this were added phenylboronic acid (61.0 mg) and dichlorobis(tris-o-methoxyphenylphosphine) palladium (1.1 mg), and the mixture was stirred at 90° C. for 18 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.10 g of a polymer compound 7. The polymer compound 7 had a Mn of $4.8 \times 10^4$ and a Mw of $2.1 \times 10^5$.

The polymer compound 7 is a copolymer constituted of a constitutional unit derived from the compound CM15, a constitutional unit derived from the compound CM20, a constitutional unit derived from the compound CM21 and a constitutional unit derived from the compound CM19 at a molar ratio of 40:5:5:50 according to the theoretical values calculated from the amounts of the charged raw materials.

<Example 5> Synthesis of Polymer Compound 8

(Step 1) An inert gas atmosphere was prepared in a reaction vessel, then, the compound CM15 (1.0640 g), the compound CM20 (0.0936 g), the compound CM21 (0.0837 g), the compound CM22 (0.9419 g) and toluene (32 mL) were added, and the mixture was heated at 90° C.

(Step 2) To this was added dichlorobis(tris-o-methoxyphenylphosphine)palladium (1.3 mg), thereafter, a 20 wt % tetrabutylammonium hydroxide aqueous solution (21.4 g) was dropped, and the mixture was stirred at 90° C. for 6 hours.

(Step 3) Thereafter, to this were added phenylboronic acid (73.2 mg) and dichlorobis(tris-o-methoxyphenylphosphine)palladium (1.3 mg), and the mixture was stirred at 90° C. for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.13 g of a polymer compound 8. The polymer compound 8 had a Mn of $5.1 \times 10^4$ and a Mw of $2.0 \times 10^5$.

The polymer compound 8 is a copolymer constituted of a constitutional unit derived from the compound CM15, a constitutional unit derived from the compound CM20, a constitutional unit derived from the compound CM21 and a constitutional unit derived from the compound CM22 at a molar ratio of 40:5:5:50 according to the theoretical values calculated from the amounts of the charged raw materials.

<Example 6> Synthesis of Polymer Compound 9

(Step 1) An inert gas atmosphere was prepared in a reaction vessel, then, the compound CM23 (0.9939 g), the compound CM20 (0.0780 g), the compound CM21 (0.0698 g), the compound CM14 (1.022 g) and toluene (34 mL) were added, and the mixture was heated at 90° C.

(Step 2) To this was added dichlorobis(tris-o-methoxyphenylphosphine)palladium (1.1 mg), thereafter, a 20 wt % tetrabutylammonium hydroxide aqueous solution (22.4 g) was dropped, and the mixture was stirred at 90° C. for 7 hours.

(Step 3) Thereafter, to this were added phenylboronic acid (61.0 mg) and dichlorobis(tris-o-methoxyphenylphosphine)palladium (1.1 mg), and the mixture was stirred at 90° C. for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.01 g of a polymer compound 9. The polymer compound 9 had a Mn of $4.9 \times 10^4$ and a Mw of $2.3 \times 10^5$.

The polymer compound 9 is a copolymer constituted of a constitutional unit derived from the compound CM23, a constitutional unit derived from the compound CM20, a constitutional unit derived from the compound CM21 and a constitutional unit derived from the compound CM14 at a molar ratio of 40:5:5:50 according to the theoretical values calculated from the amounts of the charged raw materials.

<Example 7> Synthesis of Polymer Compound 10

(Step 1) An inert gas atmosphere was prepared in a reaction vessel, then, the compound CM1 (0.9841 g), the compound CM12 (0.1730 g), the compound CM24 (0.9850 g), the compound CM10 (0.0925 g) and toluene (29 mL) were added, and the mixture was heated at 90° C.

(Step 2) To this was added dichlorobis(tris-o-methoxyphenylphosphine)palladium (1.8 mg), thereafter, a 20 wt % tetrabutylammonium hydroxide aqueous solution (19.1 g) was dropped, and the mixture was stirred at 90° C. for 7 hours.

(Step 3) Thereafter, to this were added phenylboronic acid (97.5 mg) and dichlorobis(tris-o-methoxyphenylphosphine)palladium (1.8 mg), and the mixture was stirred at 90° C. for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 0.96 g of a polymer compound 10. The polymer compound 10 had a Mn of $4.6 \times 10^4$ and a Mw of $2.1 \times 10^5$.

The polymer compound 10 is a copolymer constituted of a constitutional unit derived from the compound CM1, a constitutional unit derived from the compound CM12, a constitutional unit derived from the compound CM24 and a constitutional unit derived from the compound CM10 at a molar ratio of 50:10:35:5 according to the theoretical values calculated from the amounts of the charged raw materials.

<Comparative Example 2> Synthesis of Polymer Compound 11

(Step 1) An inert gas atmosphere was prepared in a reaction vessel, then, the compound CM11 (0.8790 g), the compound CM21 (0.1117 g), the compound CM20 (0.1336 g), the compound CM25 (1.2069 g) and toluene (30 mL) were added, and the mixture was heated at 90° C.

(Step 2) Into this was dropped a 20 wt % tetraethylammonium hydroxide aqueous solution (13.8 g), thereafter, dichlorobis(tris-o-methoxyphenylphosphine)palladium (1.8 mg) was added, and the mixture was stirred at 90° C. for 7 hours.

(Step 3) Thereafter, to this were added phenylboronic acid (97.5 mg), a 20 wt % tetraethylammonium hydroxide aqueous solution (6.9 g) and dichlorobis(tris-o-methoxyphenylphosphine)palladium (1.8 mg), and the mixture was stirred at 90° C. for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.22 g of a polymer compound 11. The polymer compound 11 had a Mn of $3.3 \times 10^4$ and a Mw of $2.2 \times 10^5$.

The polymer compound 11 is a copolymer constituted of a constitutional unit derived from the compound CM11, a constitutional unit derived from the compound CM21, a constitutional unit derived from the compound CM20 and a constitutional unit derived from the compound CM25 at a molar ratio of 40:5:5:50 according to the theoretical values calculated from the amounts of the charged raw materials.

<Comparative Example 3> Synthesis of Polymer Compound 12

(Step 1) An inert gas atmosphere was prepared in a reaction vessel, then, the compound CM15 (1.0512 g), the compound CM21 (0.0838 g), the compound CM20 (0.1001 g), the compound CM26 (0.7730 g) and toluene (29 mL) were added, and the mixture was heated at 90° C.

(Step 2) Into this was dropped a 20 wt % tetraethylammonium hydroxide aqueous solution (10.4 g), thereafter, dichlorobis(tris-o-methoxyphenylphosphine)palladium (1.3 mg) was added, and the mixture was stirred at 90° C. for 8 hours.

(Step 3) Thereafter, to this were added phenylboronic acid (73.2 mg), a 20 wt % tetraethylammonium hydroxide aqueous solution (5.2 g) and dichlorobis(tris-o-methoxyphenylphosphine)palladium (1.3 mg), and the mixture was stirred at 90° C. for 16 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.14 g of a polymer compound 12. The polymer compound 12 had a Mn of $4.3 \times 10^4$ and a Mw of $1.3 \times 10^5$.

The polymer compound 12 is a copolymer constituted of a constitutional unit derived from the compound CM15, a constitutional unit derived from the compound CM21, a constitutional unit derived from the compound CM20 and a constitutional unit derived from the compound CM26 at a molar ratio of 40:5:5:50 according to the theoretical values calculated from the amounts of the charged raw materials.

<Comparative Example 4> Synthesis of Polymer Compound 13

A polymer compound 13 was synthesized according to a method described in JP-A No. 2014-111765 using compounds shown in Table 5 below. The polymer compound 13 had a Mn of $1.7 \times 10^5$ and a Mw of $3.3 \times 10^5$. The polymer compound 13 is a copolymer constituted of constitutional units derived from respective compounds at a molar ratio shown in Table 5 below according to the theoretical values calculated from the amounts of the charged raw materials.

TABLE 5

| | polymer compound 13 | | | |
|---|---|---|---|---|
| compound | CM1 | CM12 | CM27 | CM10 |
| molar ratio [mol %] | 50 | 10 | 35 | 5 |

<Comparative Example 5> Synthesis of Polymer Compound 14

(Step 1) An inert gas atmosphere was prepared in a reaction vessel, then, the compound CM15 (1.0717 g), the compound CM21 (0.0868 g), the compound CM20 (0.1001 g), the compound CM25 (0.9051 g) and toluene (31 mL) were added, and the mixture was heated at 90° C.

(Step 2) Into this was dropped a 20 wt % tetraethylammonium hydroxide aqueous solution (10.4 g), thereafter, dichlorobis(tris-o-methoxyphenylphosphine)palladium (1.3 mg) was added, and the mixture was stirred at 90° C. for 7 hours.

(Step 3) Thereafter, to this were added phenylboronic acid (73.2 mg), a 20 wt % tetraethylammonium hydroxide aqueous solution (5.2 g) and dichlorobis(tris-o-methoxyphenylphosphine)palladium (1.3 mg), and the mixture was stirred at 90° C. for 15 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.26 g of a polymer compound 14. The polymer compound 14 had a Mn of $5.8 \times 10^4$ and a Mw of $2.0 \times 10^5$.

The polymer compound 14 is a copolymer constituted of a constitutional unit derived from the compound CM15, a constitutional unit derived from the compound CM21, a constitutional unit derived from the compound CM20 and a constitutional unit derived from the compound CM25 at a molar ratio of 40:5:5:50 according to the theoretical values calculated from the amounts of the charged raw materials.

<Comparative Example 6> Synthesis of Polymer Compound 15

(Step 1) An inert gas atmosphere was prepared in a reaction vessel, then, the compound CM14 (0.8988 g), the compound CM10 (0.0698 g), the compound CM9 (0.0835 g), the compound CM16 (0.8532 g) and toluene (29 mL) were added, and the mixture was heated at 90° C.

(Step 2) Into this was dropped a 20 wt % tetraethylammonium hydroxide aqueous solution (8.7 g), thereafter, dichlorobis(tris-o-methoxyphenylphosphine)palladium (1.1 mg) was added, and the mixture was stirred at 90° C. for 6 hours.

(Step 3) Thereafter, to this were added phenylboronic acid (61.0 mg), a 20 wt % tetraethylammonium hydroxide aqueous solution (4.3 g) and dichlorobis(tris-o-methoxyphenylphosphine)palladium (1.3 mg), and the mixture was stirred at 90° C. for 16 hours.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.20 g of a polymer compound 15. The polymer compound 15 had a Mn of $5.8 \times 10^4$ and a Mw of $2.2 \times 10^5$.

The polymer compound 15 is a copolymer constituted of a constitutional unit derived from the compound CM15, a constitutional unit derived from the compound CM21, a constitutional unit derived from the compound CM20 and a constitutional unit derived from the compound CM16 at a molar ratio of 40:5:5:50 according to the theoretical values calculated from the amounts of the charged raw materials.

<Comparative Example 7> Synthesis of Polymer Compound 16

(Step 1) An inert gas atmosphere was prepared in a reaction vessel, then, the compound CM13 (1.477 g), the compound CM5 (1.1818 g), the compound CM10 (0.0920 g), the compound CM9 (0.1057 g) and toluene (44 mL) were added, and the mixture was heated at 90° C.

(Step 2) To this were added palladium acetate (0.4 mg) and tris-o-methoxyphenylphosphine (2.8 mg), and a 20 wt % tetraethylammonium hydroxide aqueous solution (7.7 g) was dropped, thereafter, the mixture was stirred at 105° C. for 3 hours.

(Step 3) Thereafter, to this were added phenylboronic acid (450.0 mg), palladium acetate (0.4 mg) and tris-o-methoxyphenylphosphine (2.8 mg), and the mixture was stirred at 105° C. for 16 hours. Thereafter, to this were added phenyl bromide (247.0 mg), palladium acetate (0.4 mg) and tris-o-methoxyphenylphosphine (2.8 mg), and the mixture was stirred for 4 hours at 105° C.

(Step 4) Thereafter, to this was added a sodium diethyldithiacarbamate aqueous solution, and the mixture was stirred at 80° C. for 2 hours. The resultant reaction liquid was cooled, then, washed with water twice, with a 3 wt % acetic acid aqueous solution twice and with water twice, and the resultant solution was dropped into methanol, thereby observing precipitate. The resultant precipitate was dissolved in toluene, and the solution was purified by passing through an alumina column and a silica gel column in this order. The resultant solution was dropped into methanol and the mixture was stirred, thereby observing precipitate. The resultant precipitate was isolated by filtration and dried, thereby obtaining 1.46 g of a polymer compound 16. The polymer compound 16 had a Mn of $8.9 \times 10^4$ and a Mw of $3.6 \times 10^5$.

The polymer compound 16 is a copolymer constituted of a constitutional unit derived from the compound CM13, a constitutional unit derived from the compound CM5, a constitutional unit derived from the compound CM10 and a constitutional unit derived from the compound CM9 at a molar ratio of 50:40:5:5 according to the theoretical values calculated from the amounts of the charged raw materials.

<Example D1> Fabrication and Evaluation of Light Emitting Device D1

(Formation of Anode and Hole Injection Layer)

A glass substrate was attached with an ITO film with a thickness of 45 nm by a sputtering method, thereby forming an anode. On the anode, a polythiophene.sulfonic acid type hole injection agent AQ-1200 (manufactured by Plextronics) was spin-coated to form a film with a thickness of 65 nm, and the film was heated on a hot plate at 170° C. for 15 minutes under an air atmosphere, thereby forming a hole injection layer.

(Formation of Hole Transporting Layer)

Into xylene was dissolved the polymer compound 1 at a concentration of 0.7 wt %. The resultant xylene solution was spin-coated on the hole injection layer to form a film with a thickness of 20 nm, and the film was heated on a hot plate at 180° C. for 60 minutes under a nitrogen gas atmosphere, thereby forming a hole transporting layer.

(Formation of Light Emitting Layer)

Into xylene was dissolved the polymer compound 3 and into xylene was dissolved the iridium complex 1 each at a concentration of 1.8 wt %. The each xylene solutions were mixed so that the solid content ratio of the polymer compound 3 to the iridium complex 1 was 70 wt %:30 wt %. The resultant xylene solution was spin-coated on the hole transporting layer to form a film with a thickness of 80 nm, and the film was heated on a hot plate at 150° C. for 10 minutes under a nitrogen gas atmosphere, thereby forming a light emitting layer.

(Formation of Cathode)

The substrate carrying the light emitting layer formed thereon was placed in a vapor deposition machine and the internal pressure was reduced to $1.0 \times 10^{-4}$ Pa or less, then, as a cathode, sodium fluoride was vapor-deposited with a thickness of about 7 nm on the light emitting layer, then, aluminum was vapor-deposited with a thickness of about 120 nm on the sodium fluoride layer. After vapor deposition, sealing was performed using a glass substrate, thereby fabricating a light emitting device D1.

(Evaluation of Light Emitting Device)

When voltage was applied to the light emitting device D1, EL emission having a peak at 520 nm was observed. The light emitting device D1 had an external quantum yield at 1000 cd/m$^2$ of 22.8%. The results are shown in Table 6.

<Example D2> Fabrication and Evaluation of Light Emitting Device D2

A light emitting device D2 was fabricated in the same manner as in Example D1, excepting that the polymer compound 5 was used instead of the polymer compound 1 in Example D1.

When voltage was applied to the resultant light emitting device D2, EL emission having a peak at 520 nm was observed. The light emitting device D2 had an external quantum yield at 1000 cd/m$^2$ of 22.5%. The results are shown in Table 6.

<Example D3> Fabrication and Evaluation of Light Emitting Device D3

A light emitting device D3 was fabricated in the same manner as in Example D1, excepting that the polymer compound 6 was used instead of the polymer compound 1 in Example D1.

When voltage was applied to the resultant light emitting device D3, EL emission having a peak at 520 nm was observed. The light emitting device D3 had an external quantum yield at 1000 cd/m² of 25.4%. The results are shown in Table 6.

<Example D4> Fabrication and Evaluation of Light Emitting Device D4

A light emitting device D4 was fabricated in the same manner as in Example D1, excepting that the polymer compound 7 was used instead of the polymer compound 1 in Example D1.

When voltage was applied to the resultant light emitting device D4, EL emission having a peak at 520 nm was observed. The light emitting device D4 had an external quantum yield at 1000 cd/m² of 24.8%. The results are shown in Table 6.

<Example D5> Fabrication and Evaluation of Light Emitting Device D5

A light emitting device D5 was fabricated in the same manner as in Example D1, excepting that the polymer compound 8 was used instead of the polymer compound 1 in Example D1.

When voltage was applied to the resultant light emitting device D5, EL emission having a peak at 520 nm was observed. The light emitting device D5 had an external quantum yield at 1000 cd/m² of 22.3%. The results are shown in Table 6.

<Example D6> Fabrication and Evaluation of Light Emitting Device D6

A light emitting device D6 was fabricated in the same manner as in Example D1, excepting that the polymer compound 9 was used instead of the polymer compound 1 in Example D1.

When voltage was applied to the resultant light emitting device D6, EL emission having a peak at 520 nm was observed. The light emitting device D6 had an external quantum yield at 1000 cd/m² of 23.3%. The results are shown in Table 6.

<Comparative Example CD1> Fabrication and Evaluation of Light Emitting Device CD1

A light emitting device CD1 was fabricated in the same manner as in Example D1, excepting that the polymer compound 2 was used instead of the polymer compound 1 in Example D1.

When voltage was applied to the light emitting device CD1, EL emission having a peak at 520 nm was observed. The light emitting device CD1 had an external quantum yield at 1000 cd/m² of 9.9%. The results are shown in Table 6.

<Comparative Example CD2> Fabrication and Evaluation of Light Emitting Device CD2

A light emitting device CD2 was fabricated in the same manner as in Example D1, excepting that the polymer compound 11 was used instead of the polymer compound 1 in Example D1.

When voltage was applied to the resultant light emitting device CD2, EL emission having a peak at 520 nm was observed. The light emitting device CD2 had an external quantum yield at 1000 cd/m² of 7.5%. The results are shown in Table 6.

<Comparative Example CD3> Fabrication and Evaluation of Light Emitting Device CD3

A light emitting device CD3 was fabricated in the same manner as in Example D1, excepting that the polymer compound 14 was used instead of the polymer compound 1 in Example D1.

When voltage was applied to the resultant light emitting device CD3, EL emission having a peak at 520 nm was observed. The light emitting device CD3 had an external quantum yield at 1000 cd/m² of 12.0%. The results are shown in Table 6.

<Comparative Example CD4> Fabrication and Evaluation of Light Emitting Device CD4

A light emitting device CD4 was fabricated in the same manner as in Example D1, excepting that the polymer compound 15 was used instead of the polymer compound 1 in Example D1.

When voltage was applied to the resultant light emitting device CD4, EL emission having a peak at 520 nm was observed. The light emitting device CD4 had an external quantum yield at 1000 cd/m² of 9.2%. The results are shown in Table 6.

<Comparative Example CD5> Fabrication and Evaluation of Light Emitting Device CD5

A light emitting device CD5 was fabricated in the same manner as in Example D1, excepting that the polymer compound 16 was used instead of the polymer compound 1 in Example D1.

When voltage was applied to the resultant light emitting device CD5, EL emission having a peak at 520 nm was observed. The light emitting device CD5 had an external quantum yield at 1000 cd/m² of 5.8%. The results are shown in Table 6.

TABLE 6

| | hole transporting layer | light emitting layer | external quantum yield (1000 cd/m²) |
|---|---|---|---|
| light emitting device D1 | polymer compound 1 | polymer compound 3/ iridium complex 1 = 70 wt %/30 wt % | 22.8% |
| light emitting device D2 | polymer compound 5 | polymer compound 3/ iridium complex 1 = 70 wt %/30 wt % | 22.5% |
| light emitting device D3 | polymer compound 6 | polymer compound 3/ iridium complex 1 = 70 wt %/30 wt % | 25.4% |
| light emitting device D4 | polymer compound 7 | polymer compound 3/ iridium complex 1 = 70 wt %/30 wt % | 24.8% |
| light emitting device D5 | polymer compound 8 | polymer compound 3/ iridium complex 1 = 70 wt %/30 wt % | 22.3% |

TABLE 6-continued

| | hole transporting layer | light emitting layer | external quantum yield (1000 cd/m²) |
|---|---|---|---|
| light emitting device D6 | polymer compound 9 | polymer compound 3/ iridium complex 1 = 70 wt %/30 wt % | 23.3% |
| light emitting device CD1 | polymer compound 2 | polymer compound 3/ iridium complex 1 = 70 wt %/30 wt % | 9.9% |
| light emitting device CD2 | polymer compound 11 | polymer compound 3/ iridium complex 1 = 70 wt %/30 wt % | 7.5% |
| light emitting device CD3 | polymer compound 14 | polymer compound 3/ iridium complex 1 = 70 wt %/30 wt % | 12.0% |
| light emitting device CD4 | polymer compound 15 | polymer compound 3/ iridium complex 1 = 70 wt %/30 wt % | 9.2% |
| light emitting device CD5 | polymer compound 16 | polymer compound 3/ iridium complex 1 = 70 wt %/30 wt % | 5.8% |

Comparison of Example D1 with Comparative Example CD1 and Comparative Example CD2, comparison of Example D2, Example D3, Example D4 and Example D5 with Comparative Example CD3 and Comparative Example CD4, and comparison of Example D6 with Comparative Example CD5 show that a light emitting device fabricated by using the polymer compound of the present invention is excellent in external quantum yield.

<Example D7> Fabrication and Evaluation of Light Emitting Device D7

(Formation of Anode and Hole Injection Layer)

A glass substrate was attached with an ITO film with a thickness of 45 nm by a sputtering method, thereby forming an anode. On the anode, a polythiophene.sulfonic acid type hole injection agent AQ-1200 (manufactured by Plextronics) was spin-coated to form a film with a thickness of 35 nm, and the film was heated on a hot plate at 170° C. for 15 minutes under an air atmosphere, thereby forming a hole injection layer.

(Formation of Hole Transporting Layer)

Into xylene was dissolved the polymer compound 1 at a concentration of 0.7 wt %. The resultant xylene solution was spin-coated on the hole injection layer to form a film with a thickness of 20 nm, and the film was heated on a hot plate at 180° C. for 60 minutes under a nitrogen gas atmosphere, thereby forming a hole transporting layer.

(Formation of Light Emitting Layer)

Into xylene was dissolved the polymer compound 4 at a concentration of 1.2 wt %. The resultant xylene solution was spin-coated on the hole transporting layer to form a film with a thickness of 60 nm, and the film was heated on a hot plate at 150° C. for 10 minutes under a nitrogen gas atmosphere, thereby forming a light emitting layer.

(Formation of Cathode)

The substrate carrying the light emitting layer formed thereon was placed in a vapor deposition machine and the internal pressure was reduced to $1.0 \times 10^{-4}$ Pa or less, then, as a cathode, sodium fluoride was vapor-deposited with a thickness of about 7 nm on the light emitting layer, then, aluminum was vapor-deposited with a thickness of about 120 nm. After vapor deposition, sealing was performed using a glass substrate, thereby fabricating a light emitting device D7.

(Evaluation of Light Emitting Device)

When voltage was applied to the light emitting device D7, EL emission having a peak at 455 nm was observed. The light emitting device D7 had an external quantum yield at 1000 cd/m² of 7.2%. The results are shown in Table 7.

<Example D8> Fabrication and Evaluation of Light Emitting Device D8

A light emitting device D8 was fabricated in the same manner as in Example D7, excepting that the polymer compound 5 was used instead of the polymer compound 1 in Example D7.

When voltage was applied to the resultant light emitting device D8, EL emission having a peak at 455 nm was observed. The light emitting device D8 had an external quantum yield at 1000 cd/m² of 9.7%. The results are shown in Table 7.

<Example D9> Fabrication and Evaluation of Light Emitting Device D9

A light emitting device D9 was fabricated in the same manner as in Example D7, excepting that the polymer compound 6 was used instead of the polymer compound 1 in Example D7.

When voltage was applied to the resultant light emitting device D9, EL emission having a peak at 455 nm was observed. The light emitting device D9 had an external quantum yield at 1000 cd/m² of 9.7%. The results are shown in Table 7.

<Example D10> Fabrication and Evaluation of Light Emitting Device D10

A light emitting device D10 was fabricated in the same manner as in Example D7, excepting that the polymer compound 7 was used instead of the polymer compound 1 in Example D7.

When voltage was applied to the resultant light emitting device D10, EL emission having a peak at 455 nm was observed. The light emitting device D10 had an external quantum yield at 1000 cd/m² of 8.9%. The results are shown in Table 7.

<Example D11> Fabrication and Evaluation of Light Emitting Device D11

A light emitting device D11 was fabricated in the same manner as in Example D7, excepting that the polymer compound 10 was used instead of the polymer compound 1 in Example D7.

When voltage was applied to the resultant light emitting device D11, EL emission having a peak at 450 nm was observed. The light emitting device D11 had an external quantum yield at 1000 cd/m² of 8.2%. The results are shown in Table 7.

\<Example D12\> Fabrication and Evaluation of Light Emitting Device D12

A light emitting device D12 was fabricated in the same manner as in Example D7, excepting that the polymer compound 8 was used instead of the polymer compound 1 in Example D7.

When voltage was applied to the resultant light emitting device D12, EL emission having a peak at 455 nm was observed. The light emitting device D12 had an external quantum yield at 1000 cd/m$^2$ of 8.9%. The results are shown in Table 7.

\<Example D13\> Fabrication and Evaluation of Light Emitting Device D13

A light emitting device D13 was fabricated in the same manner as in Example D7, excepting that the polymer compound 9 was used instead of the polymer compound 1 in Example D7.

When voltage was applied to the resultant light emitting device D13, EL emission having a peak at 455 nm was observed. The light emitting device D13 had an external quantum yield at 1000 cd/m$^2$ of 8.5%. The results are shown in Table 7.

\<Comparative Example CD6\> Fabrication and Evaluation of Light Emitting Device CD6

A light emitting device CD6 was fabricated in the same manner as in Example D7, excepting that the polymer compound 2 was used instead of the polymer compound 1 in Example D7.

When voltage was applied to the light emitting device CD6, EL emission having a peak at 455 nm was observed. The light emitting device CD6 had an external quantum yield at 1000 cd/m$^2$ of 6.3%. The results are shown in Table 7.

\<Comparative Example CD7\> Fabrication and Evaluation of Light Emitting Device CD7

A light emitting device CD7 was fabricated in the same manner as in Example D7, excepting that the polymer compound 11 was used instead of the polymer compound 1 in Example D7.

When voltage was applied to the resultant light emitting device CD7, EL emission having a peak at 455 nm was observed. The light emitting device CD7 had an external quantum yield at 1000 cd/m$^2$ of 6.4%. The results are shown in Table 7.

\<Comparative Example CD8\> Fabrication and Evaluation of Light Emitting Device CD8

A light emitting device CD8 was fabricated in the same manner as in Example D7, excepting that the polymer compound 12 was used instead of the polymer compound 1 in Example D7.

When voltage was applied to the resultant light emitting device CD8, EL emission having a peak at 455 nm was observed. The light emitting device CD8 had an external quantum yield at 1000 cd/m$^2$ of 7.2%. The results are shown in Table 7.

\<Comparative Example CD9\> Fabrication and Evaluation of Light Emitting Device CD9

A light emitting device CD9 was fabricated in the same manner as in Example D7, excepting that the polymer compound 13 was used instead of the polymer compound 1 in Example D7.

When voltage was applied to the resultant light emitting device CD9, EL emission having a peak at 450 nm was observed. The light emitting device CD9 had an external quantum yield at 1000 cd/m$^2$ of 4.2%. The results are shown in Table 7.

\<Comparative Example CD10\> Fabrication and Evaluation of Light Emitting Device CD10

A light emitting device CD10 was fabricated in the same manner as in Example D7, excepting that the polymer compound 14 was used instead of the polymer compound 1 in Example D7.

When voltage was applied to the resultant light emitting device CD10, EL emission having a peak at 455 nm was observed. The light emitting device CD10 had an external quantum yield at 1000 cd/m$^2$ of 6.7%. The results are shown in Table 7.

\<Comparative Example CD11\> Fabrication and Evaluation of Light Emitting Device CD11

A light emitting device CD11 was fabricated in the same manner as in Example D7, excepting that the polymer compound 15 was used instead of the polymer compound 1 in Example D7.

When voltage was applied to the resultant light emitting device CD11, EL emission having a peak at 460 nm was observed. The light emitting device CD11 had an external quantum yield at 1000 cd/m$^2$ of 5.8%. The results are shown in Table 7.

\<Comparative Example CD12\> Fabrication and Evaluation of Light Emitting Device CD12

A light emitting device CD12 was fabricated in the same manner as in Example D7, excepting that the polymer compound 16 was used instead of the polymer compound 1 in Example D7.

When voltage was applied to the resultant light emitting device CD12, EL emission having a peak at 455 nm was observed. The light emitting device CD12 had an external quantum yield at 1000 cd/m$^2$ of 5.7%. The results are shown in Table 7.

TABLE 7

| | hole transporting layer | light emitting layer | external quantum yield (1000 cd/m$^2$) |
|---|---|---|---|
| light emitting device D7 | polymer compound 1 | polymer compound 4 | 7.2% |
| light emitting device D8 | polymer compound 5 | polymer compound 4 | 9.7% |
| light emitting device D9 | polymer compound 6 | polymer compound 4 | 9.7% |

TABLE 7-continued

| hole transporting layer | light emitting layer | external quantum yield (1000 cd/m²) |
|---|---|---|
| light emitting device D10 | polymer compound 7 | polymer compound 4 | 8.9% |
| light emitting device D11 | polymer compound 10 | polymer compound 4 | 8.2% |
| light emitting device D12 | polymer compound 8 | polymer compound 4 | 8.9% |
| light emitting device D13 | polymer compound 9 | polymer compound 4 | 8.5% |
| light emitting device CD6 | polymer compound 2 | polymer compound 4 | 6.3% |
| light emitting device CD7 | polymer compound 11 | polymer compound 4 | 6.4% |
| light emitting device CD8 | polymer compound 12 | polymer compound 4 | 7.2% |
| light emitting device CD9 | polymer compound 13 | polymer compound 4 | 4.2% |
| light emitting device CD10 | polymer compound 14 | polymer compound 4 | 6.7% |
| light emitting device CD11 | polymer compound 15 | polymer compound 4 | 5.8% |
| light emitting device CD12 | polymer compound 16 | polymer compound 4 | 5.7% |

Comparison of Example D7 with Comparative Example CD6 and Comparative Example CD7, comparison of Example D8, Example D9, Example D10 and Example D12 with Comparative Example CD8, Comparative Example CD10 and Comparative Example CD11, comparison of Example D11 with Comparative Example CD9 and comparison of Example D13 with Comparative Example CD12 show that a light emitting device fabricated by using the polymer compound of the present invention is excellent in external quantum yield.

INDUSTRIAL APPLICABILITY

The present invention can provide a polymer compound which is useful for production of a light emitting device excellent in external quantum yield. Also, the present invention can provide a composition containing the polymer compound and a light emitting device obtained by using the polymer compound.

The invention claimed is:

1. A polymer compound comprising a constitutional unit represented by the formula (1) and a crosslinkable constitutional unit having at least one crosslinkable group selected from Group A of crosslinkable groups:

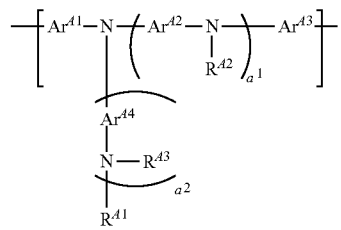

(1)

wherein
$a^1$ and $a^2$ each independently represent 0 or 1,
$Ar^{41}$ and $Ar^{43}$ each independently represent an arylene group or a divalent heterocyclic group, the foregoing groups each optionally having a substituent, and in each of $Ar^{41}$ and $Ar^{43}$ at least one atom adjacent to an atom forming a bond to the constitutional unit adjacent to the each of $Ar^{41}$ and $Ar^{43}$ has an alkyl group, a cycloalkyl group, an alkoxy group, a cycloalkoxy group, an aryl group or a monovalent heterocyclic group as a substituent, the foregoing substituents each optionally further having a substituent,
$Ar^{42}$ represents a phenylene group and this phenylene group optionally has a substituent,
$Ar^{44}$ represents an arylene group, a divalent heterocyclic group or a divalent group in which at least one type of arylene group and at least one type of divalent heterocyclic group are bonded directly to each other, the foregoing groups each optionally having a substituent,
$R^{41}$, $R^{42}$ and $R^{43}$ each independently represent a hydrogen atom, an alkyl group, a cycloalkyl group, an aryl group or a monovalent heterocyclic group, the foregoing groups each optionally having a substituent, and
when $a^2$ is 0, $R^{41}$ represents an aryl group in which two or more rings are condensed and the number of carbon atoms constituting the rings of the aryl group is 10 or more, or a monovalent heterocyclic group in which two or more rings are condensed and the total number of carbon atoms and hetero atoms constituting the rings of the monovalent heterocyclic group is 10 or more, the foregoing groups each optionally having a substituent;
Group A of crosslinkable groups:

(XL-1)

(XL-2)

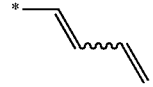

(XL-3)

(XL-4)

-continued (XL-5) 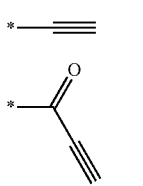

(XL-6) 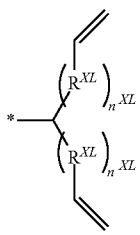

(XL-7) 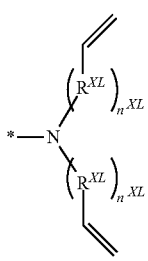

(XL-8) 

(XL-9) 

(XL-11) 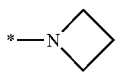

(XL-12) 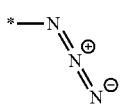

(XL-13) 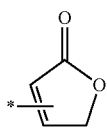

(XL-14) 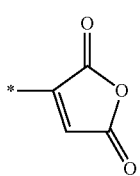

(XL-15) 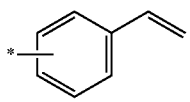

(ZL-16) 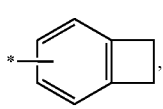

(XL-17)

wherein $R^{XL}$ represents a methylene group, an oxygen atom or a sulfur atom, and $n^{XL}$ represents an integer of 0 to 5, and when a plurality of $R^{XL}$ are present, they can be the same or different, and when a plurality of $n^{XL}$ are present, they can be the same or different, and * represents a binding position, and each of the foregoing crosslinkable groups optionally has a substituent.

2. The polymer compound according to claim 1, wherein $Ar^{41}$ and $Ar^{43}$ each represent a phenylene group.

3. The polymer compound according to claim 1, wherein $a^2$ is 0.

4. The polymer compound according to claim 1, wherein in each of $Ar^{41}$ and $Ar^{43}$ the at least one atom adjacent to an atom forming a bond to the constitutional unit adjacent to the each of $Ar^{41}$ and $Ar^{43}$ has an alkyl group or a cycloalkyl group as a substituent.

5. The polymer compound according to claim 1, wherein $R^{41}$ is a group selected from Group AA of aryl groups or a group selected from Group BB of monovalent heterocyclic groups:

Group AA of aryl groups:

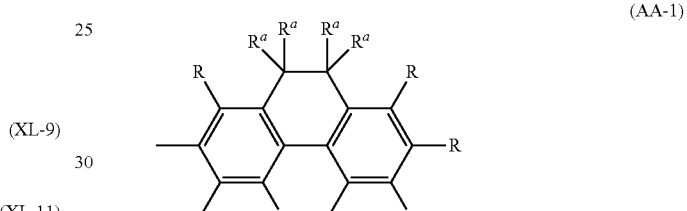

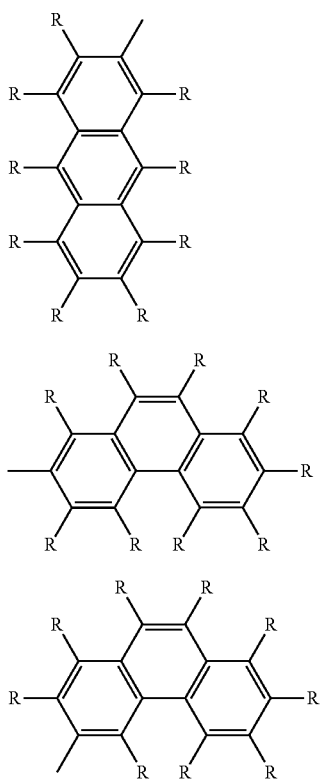
(AA-5)
(AA-6)
(AA-7)
Group BB of monovalent heterocyclic groups
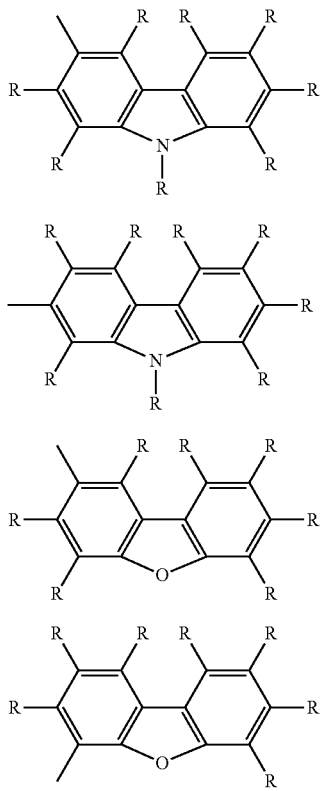
(BB-1)
(BB-2)
(BB-3)
(BB-4)
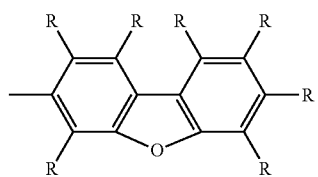
(BB-5)
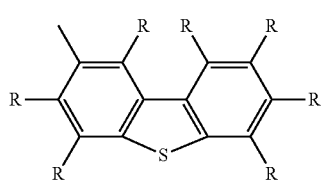
(BB-6)
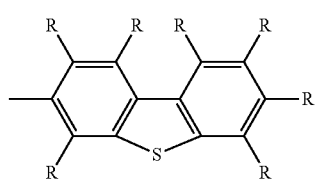
(BB-7)
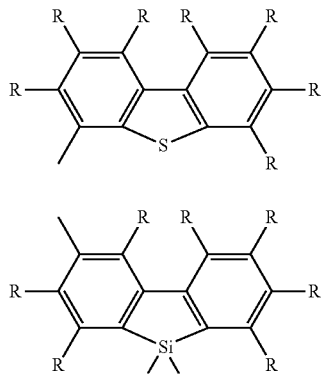
(BB-8)
(BB-9)
(BB-10)
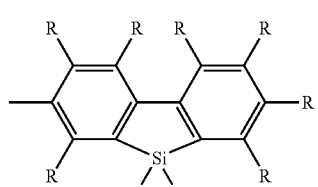
(BB-11)
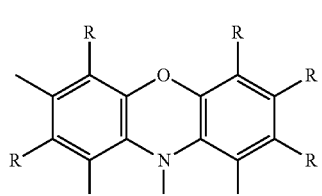
(BB-12)
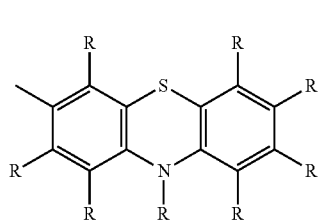

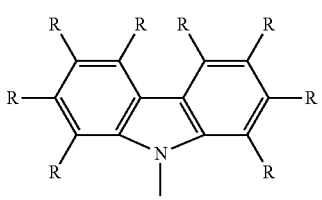

(BB-13)

wherein, R and R$^a$ each independently represent a hydrogen atom, an alkyl group, a cycloalkyl group, an aryl group or a monovalent heterocyclic group, and the plurality of R and R$^a$ each can be the same or different at each occurrence, and groups R$^a$ can be combined together to form a ring together with the atoms to which they are attached.

6. A polymer compound comprising a constitutional unit represented by the formula (4):

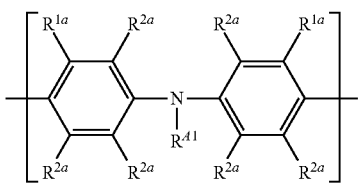

(4)

wherein
R$^{41}$ represents an aryl group in which two or more rings are condensed and the number of carbon atoms constituting the rings of the aryl group is 10 or more, or a monovalent heterocyclic group in which two or more rings are condensed and the total number of carbon atoms and hetero atoms constituting the rings of the monovalent heterocyclic group is 10 or more, the foregoing groups each optionally having a substituent,
R$^{1a}$ represents an alkyl group, a cycloalkyl group, an alkoxy group, a cycloalkoxy group, an aryl group or a monovalent heterocyclic group, the foregoing groups each optionally having a substituent, and the plurality of R$^{1a}$ can be the same or different, and
R$^{2a}$ represents a hydrogen atom, an alkyl group, a cycloalkyl group, an alkoxy group, a cycloalkoxy group, an aryl group, a monovalent heterocyclic group or a halogen atom, the foregoing groups each optionally having a substituent, and the plurality of R$^{2a}$ can be the same or different.

7. The polymer compound according to claim 1, further comprising at least one constitutional unit selected from the group consisting of a constitutional unit represented by the formula (1X) and a constitutional unit represented by the formula (1Z):

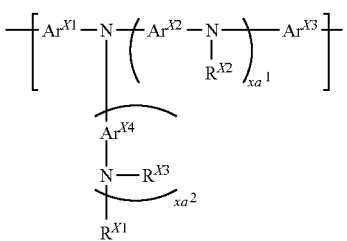

(1X)

wherein
xa$^1$ and xa$^2$ each independently represent an integer of 0 or more,
Ar$^{X1}$ and Ar$^{X3}$ each independently represent an arylene group or a divalent heterocyclic group, the foregoing groups each optionally having a substituent, and in each of Ar$^{X1}$ and Ar$^{X3}$ the atoms adjacent to the atom forming a bond to the constitutional unit adjacent to the each of Ar$^{41}$ and Ar$^{43}$ does not have an alkyl group, a cycloalkyl group, an alkoxy group, a cycloalkoxy group, an aryl group or a monovalent heterocyclic group as a substituent,
Ar$^{X2}$ and Ar$^{X4}$ each independently represent an arylene group, a divalent heterocyclic group or a divalent group in which at least one type of arylene group and at least one type of divalent heterocyclic group are bonded directly to each other, the foregoing groups each optionally having a substituent, and
R$^{X1}$, R$^{X2}$ and R$^{X3}$ each independently represent a hydrogen atom, an alkyl group, a cycloalkyl group, an aryl group or a monovalent heterocyclic group, the foregoing groups each optionally having a substituent;

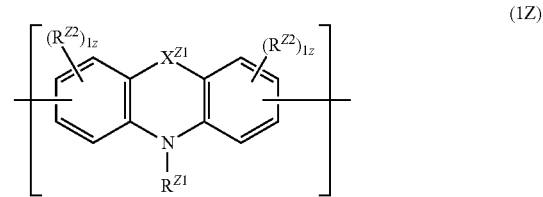

(1Z)

wherein
R$^{Z1}$ represents a hydrogen atom, an alkyl group, a cycloalkyl group, an aryl group or a monovalent heterocyclic group, the foregoing groups each optionally having a substituent,
1z represents an integer of 0 to 3, and the plurality of 1z can be the same or different,
R$^{Z2}$ represents an alkyl group, a cycloalkyl group, an aryl group or a monovalent heterocyclic group, the foregoing groups each optionally having a substituent, and when a plurality of R$^{Z2}$ are present, they can be the same or different, and
R$^{Z1}$ represents a single bond, an oxygen atom, a sulfur atom, a group represented by —CR$^{Z11}$R$^{Z12}$— or a group represented by —SiR$^{Z13}$R$^{Z14}$—, and R$^{Z11}$, R$^{Z12}$, R$^{Z13}$ and R$^{Z14}$ each independently represent a hydrogen atom, an alkyl group, a cycloalkyl group, an aryl group or a monovalent heterocyclic group, the foregoing groups each optionally having a substituent.

8. The polymer compound according to claim 7, wherein at least one substituent selected from the group consisting of R$^{41}$, R$^{42}$ and R$^{43}$ is a group obtained by removing from a fluorene ring optionally having a substituent one hydrogen atom linked directly to a carbon atom constituting the ring.

9. The polymer compound according to claim 7, comprising a constitutional sequence in which the constitutional unit represented by the formula (1) and at least one constitutional unit selected from the group consisting of the constitutional unit represented by the formula (1X) and the constitutional unit represented by the formula (1Z) are adjacent to each other.

10. The polymer compound according to claim 7, wherein the total content of the constitutional unit represented by the formula (1), the constitutional unit represented by the formula (1X) and the constitutional unit represented by the formula (1Z) is 50 to 100 mol %, with respect to the total content of constitutional units contained in the polymer compound.

11. The polymer compound according to claim 1, wherein the crosslinkable constitutional unit is a constitutional unit represented by the formula (5) or a constitutional unit represented by the formula (5'), and these constitutional units are different from the constitutional unit represented by the formula (1):

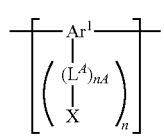
(5)

wherein
nA represents an integer of 0 to 5, n represents 1 or 2, and when a plurality of nA are present, they can be the same or different,
Ar¹ represents an aromatic hydrocarbon group or a heterocyclic group, the foregoing groups each optionally having a substituent,
$L^A$ represents an alkylene group, a cycloalkylene group, an arylene group, a divalent heterocyclic group, a group represented by —NR'—, an oxygen atom or a sulfur atom, the foregoing groups each optionally having a substituent, and R' represents a hydrogen atom, an alkyl group, a cycloalkyl group, an aryl group or a monovalent heterocyclic group, the foregoing groups each optionally having a substituent, and when a plurality of $L^A$ are present, they can be the same or different, and
X represents a crosslinkable group selected from Group A of crosslinkable groups, and when a plurality of X are present, they can be the same or different:

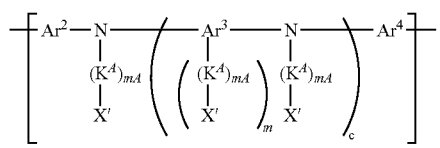
(5')

wherein
mA represents an integer of 0 to 5, m represents an integer of 1 to 4, c represents an integer of 0 or 1, and when a plurality of mA are present, they can be the same or different,
Ar² represents an aromatic hydrocarbon group, a heterocyclic group or a group in which at least one type of aromatic hydrocarbon ring and at least one type of heterocyclic ring are bonded directly to each other, the foregoing groups each optionally having a substituent,
Ar³ and Ar⁴ each independently represent an arylene group or a divalent heterocyclic group, the foregoing groups each optionally having a substituent,
each of Ar², Ar³ and Ar⁴ is bonded directly or via an oxygen atom or a sulfur atom to a group that is different from that group and that is attached to the nitrogen atom to which that group is attached, thereby forming a ring,
$K^A$ represents an alkylene group, a cycloalkylene group, an arylene group, a divalent heterocyclic group, a group represented by —NR'—, an oxygen atom or a sulfur atom, the foregoing groups each optionally having a substituent, and R' represents a hydrogen atom, an alkyl group, a cycloalkyl group, an aryl group or a monovalent heterocyclic group, the foregoing groups each optionally having a substituent, and when a plurality of KA are present, they can be the same or different, and
X' represents a crosslinkable group selected from Group A of crosslinkable groups, a hydrogen atom, an alkyl group, a cycloalkyl group, an aryl group or a monovalent heterocyclic group, the foregoing groups each optionally having a substituent, and the plurality of X' can be the same or different, and at least one X' is the crosslinkable group selected from Group A of crosslinkable groups.

12. The polymer compound according to claim 1, wherein the crosslinkable group is the crosslinkable group represented by the formula (XL-1) or (XL-17).

13. A composition comprising
the polymer compound according to claim 1 and
at least one material selected from the group consisting of a hole transporting material, a hole injection material, an electron transporting material, an electron injection material, a light emitting material, an antioxidant and a solvent.

14. A light emitting device produced by using the polymer compound according to claim 1.

* * * * *